US012177060B2

(12) United States Patent
McCormick et al.

(10) Patent No.: US 12,177,060 B2
(45) Date of Patent: *Dec. 24, 2024

(54) DIGITAL PRE-DISTORTION COMPENSATION IN A WIRELESS COMMUNICATIONS SYSTEM

(71) Applicant: Space Exploration Technologies Corp., Hawthorne, CA (US)

(72) Inventors: Martin S. McCormick, Studio City, CA (US); Feipeng Wang, Redmond, WA (US)

(73) Assignee: Space Exploration Technologies Corp., Hawthorne, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/205,958

(22) Filed: Jun. 5, 2023

(65) Prior Publication Data

US 2023/0308338 A1 Sep. 28, 2023

Related U.S. Application Data

(63) Continuation of application No. 17/185,427, filed on Feb. 25, 2021, now Pat. No. 11,671,123.
(Continued)

(51) Int. Cl.
H04L 27/36 (2006.01)
H03F 1/32 (2006.01)
H04B 1/04 (2006.01)

(52) U.S. Cl.
CPC ......... *H04L 27/367* (2013.01); *H03F 1/3247* (2013.01); *H04B 1/04* (2013.01);
(Continued)

(58) Field of Classification Search
CPC .............. H04B 1/04; H04B 2001/0425; H04B 2001/0433
(Continued)

(56) References Cited

U.S. PATENT DOCUMENTS 4,169,286 A 9/1979 Uzunoglu et al.
4,567,485 A 1/1986 Oshima et al.
(Continued)

OTHER PUBLICATIONS

Akima, Hiroshi. Sharing of the Band 12.2-12.7 GHz Between the Broadcasting-satellite and Fixed Services. vol. 80, No. 32. Department of Commerce, National Telecommunications and Information Administration, 1980.
(Continued)

*Primary Examiner* — Kevin M Burd
(74) *Attorney, Agent, or Firm* — Polsinelli PC

(57) ABSTRACT

A wireless communications system includes a pre-distortion actuator configured to receive a carrier-modulated signal and convert the carrier-modulated signal into an output signal, the pre-distortion actuator comprising a behavioral model that models a transmit chain of the system including at least one amplifier and at least one antenna and predict an input-output relationship of the transmit chain of the system between an input to the transmit chain to an output of the transmit chain. The system includes a phased antenna array configured to transmit the output signal. The phased antenna array includes a plurality of antenna elements, each antenna element electrically coupled to a respective power amplifier. The pre-distortion actuator is configured to generate the output signal by applying a correction to the carrier-modulated input signal that cancels out nonlinearities The behavioral model is updated based on feedback from a receiver from a previous output signal transmitted to the receiver.

21 Claims, 23 Drawing Sheets

Related U.S. Application Data

(60) Provisional application No. 62/983,651, filed on Feb. 29, 2020, provisional application No. 62/983,644, filed on Feb. 29, 2020, provisional application No. 62/983,649, filed on Feb. 29, 2020.

(52) U.S. Cl.
CPC .......... *H04L 27/368* (2013.01); *H03F 1/3258* (2013.01); *H03F 1/3294* (2013.01); *H03F 2201/3233* (2013.01); *H04B 2001/0425* (2013.01); *H04B 2001/0433* (2013.01)

(58) Field of Classification Search
USPC .................................................. 375/262, 267
See application file for complete search history.

(56) References Cited

U.S. PATENT DOCUMENTS

| | | | |
|---|---|---|---|
| 6,072,841 A | 6/2000 | Rahnema | |
| 6,128,487 A | 10/2000 | Wiedeman | |
| 6,154,499 A | 11/2000 | Bhaskar et al. | |
| 6,157,812 A | 12/2000 | Sarraf | |
| 6,212,566 B1 | 4/2001 | Vanhoof et al. | |
| 6,363,131 B1 | 3/2002 | Beidas et al. | |
| 6,373,858 B1 | 4/2002 | Soleimani et al. | |
| 6,377,561 B1 | 4/2002 | Black et al. | |
| 6,522,643 B1 | 2/2003 | Jacomb-Hood et al. | |
| 6,625,129 B1 | 9/2003 | Olds et al. | |
| 6,678,337 B1 | 1/2004 | Sugita | |
| 6,693,983 B1 | 2/2004 | Moher et al. | |
| 6,957,078 B1 | 10/2005 | Yousefi et al. | |
| 7,030,824 B1 | 4/2006 | Taft et al. | |
| 8,111,646 B1 | 2/2012 | Chang | |
| 8,275,069 B2 | 9/2012 | Murakami et al. | |
| 8,363,740 B2 | 1/2013 | Stadelmeier et al. | |
| 8,446,979 B1 | 5/2013 | Yee | |
| 8,665,696 B2 | 3/2014 | Van Nee | |
| 9,641,206 B2 | 5/2017 | Pratt et al. | |
| 10,333,764 B1 | 6/2019 | Arditti Ilitzky | |
| 10,581,469 B1 | 3/2020 | O'Shea et al. | |
| 11,671,123 B1* | 6/2023 | McCormick .......... | H04L 27/367 375/262 |
| 2002/0126764 A1 | 9/2002 | Murakami et al. | |
| 2002/0159403 A1 | 10/2002 | Reddy | |
| 2003/0081696 A1 | 5/2003 | Kim et al. | |
| 2003/0179831 A1 | 9/2003 | Gupta et al. | |
| 2003/0189916 A1 | 10/2003 | Cornett, Jr. et al. | |
| 2003/0193970 A1 | 10/2003 | Kim et al. | |
| 2003/0227978 A1 | 12/2003 | Magee et al. | |
| 2004/0047284 A1 | 3/2004 | Eidson | |
| 2004/0066802 A1 | 4/2004 | Ro et al. | |
| 2004/0082356 A1 | 4/2004 | Walton et al. | |
| 2004/0174812 A1 | 9/2004 | Murakami et al. | |
| 2004/0209584 A1 | 10/2004 | Bargroff et al. | |
| 2004/0213365 A1 | 10/2004 | Murakami et al. | |
| 2004/0252229 A1 | 12/2004 | Jiang et al. | |
| 2005/0152326 A1 | 7/2005 | Vijayan et al. | |
| 2005/0201268 A1 | 9/2005 | Aoki et al. | |
| 2006/0007885 A1 | 1/2006 | Pollack et al. | |
| 2007/0030918 A1 | 2/2007 | Kobayashi et al. | |
| 2007/0098103 A1 | 5/2007 | Murakami et al. | |
| 2007/0133727 A1 | 6/2007 | Kim et al. | |
| 2008/0095135 A1 | 4/2008 | Cleveland | |
| 2008/0225936 A1 | 9/2008 | Hong et al. | |
| 2009/0022085 A1 | 1/2009 | Dankberg et al. | |
| 2009/0046818 A1 | 2/2009 | Murakami et al. | |
| 2009/0052561 A1 | 2/2009 | Baxley et al. | |
| 2009/0190491 A1 | 7/2009 | Miller | |
| 2009/0196421 A1 | 8/2009 | Okuda | |
| 2009/0285137 A1 | 11/2009 | Fujita et al. | |
| 2009/0296680 A1 | 12/2009 | Suzuki et al. | |
| 2010/0039985 A1 | 2/2010 | Kim et al. | |
| 2010/0054116 A1 | 3/2010 | Ishill et al. | |
| 2010/0195563 A1 | 8/2010 | Jong et al. | |
| 2010/0232350 A1 | 9/2010 | Leong et al. | |
| 2011/0044255 A1 | 2/2011 | Ikeda | |
| 2011/0150143 A1 | 6/2011 | Han et al. | |
| 2012/0057872 A1 | 3/2012 | Freda et al. | |
| 2012/0147939 A1 | 6/2012 | Han et al. | |
| 2012/0224651 A1 | 9/2012 | Murakami et al. | |
| 2013/0033317 A1 | 2/2013 | Hawkes | |
| 2013/0136208 A1 | 5/2013 | Murakami et al. | |
| 2013/0166259 A1 | 6/2013 | Weber et al. | |
| 2013/0223544 A1 | 8/2013 | Becker | |
| 2013/0331026 A1 | 12/2013 | O'Neill et al. | |
| 2014/0140194 A1 | 5/2014 | Fechtel | |
| 2014/0146859 A1 | 5/2014 | Ram et al. | |
| 2014/0146918 A1 | 5/2014 | Ryan et al. | |
| 2014/0219293 A1 | 8/2014 | Williams et al. | |
| 2014/0226682 A1 | 8/2014 | Becker et al. | |
| 2014/0294057 A1 | 10/2014 | Joung et al. | |
| 2014/0348140 A1 | 11/2014 | Atkinson | |
| 2015/0049843 A1 | 2/2015 | Reuven et al. | |
| 2015/0162881 A1 | 6/2015 | Hammi | |
| 2015/0195670 A1 | 7/2015 | Agee | |
| 2015/0214987 A1 | 7/2015 | Yu et al. | |
| 2015/0270890 A1 | 9/2015 | Vasavada et al. | |
| 2016/0087736 A1 | 3/2016 | Murakami et al. | |
| 2016/0278033 A1 | 9/2016 | Wu et al. | |
| 2017/0149493 A1 | 5/2017 | Arapoglou et al. | |
| 2017/0150528 A1 | 5/2017 | Becker et al. | |
| 2017/0294957 A1 | 10/2017 | Ravishankar et al. | |
| 2018/0053997 A1 | 2/2018 | Noto et al. | |
| 2018/0115390 A1 | 4/2018 | Beidas et al. | |
| 2018/0159483 A1 | 6/2018 | Masood et al. | |
| 2018/0375707 A1 | 12/2018 | Bala et al. | |
| 2019/0013892 A1 | 1/2019 | Chen et al. | |
| 2019/0045675 A1 | 2/2019 | Li et al. | |
| 2019/0053229 A1 | 2/2019 | Kim et al. | |
| 2019/0097859 A1 | 3/2019 | Bala et al. | |
| 2019/0132247 A1 | 5/2019 | Zhang et al. | |
| 2019/0173640 A1 | 6/2019 | Luo et al. | |
| 2019/0222179 A1 | 7/2019 | Doi | |
| 2019/0245724 A1 | 8/2019 | Wang et al. | |
| 2019/0356515 A1 | 11/2019 | Murakami et al. | |
| 2019/0363676 A1 | 11/2019 | Megretski et al. | |
| 2020/0052948 A1 | 2/2020 | Sahin et al. | |
| 2020/0157958 A1 | 5/2020 | Takemoto et al. | |
| 2020/0252123 A1 | 8/2020 | Boutillon | |
| 2020/0373886 A1 | 11/2020 | Hou et al. | |
| 2020/0395662 A1 | 12/2020 | Tervo et al. | |
| 2021/0175858 A1 | 6/2021 | Su et al. | |
| 2021/0194573 A1 | 6/2021 | Jong et al. | |
| 2021/0194614 A1 | 6/2021 | Ricker | |
| 2021/0203386 A1 | 7/2021 | Gao et al. | |

OTHER PUBLICATIONS

Bin Cheng, et al., "A Predistortion Linearizer for Ka-band Power Amplifier in Integrated Fin-line Technique," Microwave Conference Proceedings (CJMW), 2011 Chinese-Japan Joint, 3 pages.

Abdelaziz, M.: Digital Predistortion for Hybrid MIMO Transmitters. https://arxiv.org/pdf/1804.02178.pdf. 10 Total Pages (Apr. 2018).

BA, S.N.: Efficient Digital Baseband Predistortion for Modern Wireless Handsets. PhD Thesis. 133 Total Pages (2009).

Choi et al.: Digital Predistortion Based on Combined Feedback in MIMO Transmitters. IEEE Communications Letters 16(10): 1572-1575 (2012).

Jiang et al.: Digital Predistortion for Power Amplifiers Using Separable Functions. IEEE Transactions on Signal Processing 58(8): 4121-4130 (2010).

Liu et al.: Single-PA-Feedback Digital Predistortion for Beamforming MIMO Transmitter. In Microwave and Millimeter Wave Technology (ICMMT). 2016 IEEE International Conference. 3 Total Pages (2016).

Morgan et al.: A Generalized Memory Polynomial Model for Digital Predistortion of RF Power Amplifiers. IEEE Transactions on Signal Processing 54(10): 3852-3860 (2006).

Morgan et al.: Reducing Measurement Noise Effects in Digital Predistortion of RF Power Amplifiers. In Communications, 2003. ICC'03. IEEE International Conference vol. 4, pp. 2436-2439 (May 2003).

(56) References Cited

OTHER PUBLICATIONS

Spall, J. C.: Multivariate Stochastic Approximation Using a Simultaneous Perturbation Gradient Approximation. IEEE Transactions on Automatic Control 37(3): 332-341 (1992).
Tervo et al.: Digital Predistortion of Amplitude Varying Phased Array Utilising Over-the-Air Combining. IEEE. 1165-1168 (2017).

* cited by examiner

DIGITAL PRE-DISTORTION COMPENSATION IN A WIRELESS COMMUNICATIONS SYSTEM

PRIORITY CLAIM

The present application is a continuation of U.S. patent application Ser. No. 17/185,427, filed on Feb. 25, 2021, which claims priority to U.S. Provisional Patent Application No. 62/983,649, filed on Feb. 29, 2020, and claims priority to U.S. Provisional Application No. 62/983,651, filed on Feb. 29, 2020, and claims priority to U.S. Provisional Application No. 62/983,644, filed on Feb. 29, 2020. The contents of each of the above patent applications is incorporated herein by reference in their entirety.

TECHNICAL FIELD

The present technology pertains to various approaches to configuring wireless communication systems or components in wireless communication systems to provide digital compensation of signal distortion associated with power amplifier nonlinearity prior to signal transmission.

BACKGROUND

Wireless communications systems, and in particular, wireless transmission systems include one or more antennas, in which each antenna is electrically coupled to one or more power amplifiers. Power amplifiers can exhibit nonlinear characteristics which result in undesirable spectral components being present in the transmitted signals. A power amplifier may exhibit nonlinearity, if, for example, it is driven into saturation. Saturation in a power amplifier occurs when the output power of the amplifier is at a maximum no matter the variation in the input. In other words, the input no longer has a linear relationship to the output in saturation.

If the power amplifier is configured to operate well below the saturation point and thus within the linear region, then the power amplifier suffers from low efficiency in power consumption. Most of the power consumed by a power amplifier operating below saturation is lost as heat or other waste rather than being used for signal generation and/or transmission. In general, a power amplifier operating below saturation consumes more total power to generate a signal than the same power amplifier operating within the saturation region.

Low-cost power amplifiers also tend to exhibit more nonlinearity than expensive power amplifiers because they have less expensive components that do not perform as well. With each wireless communications system including a large number of power amplifiers, the component cost of the power amplifiers can be sizable without the additional cost of expensive power amplifiers.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

Several different approaches to performing digital pre-distortion on signals to be transmitted are summarized next. The first is a general digital pre-distortion approach and the next is a stochastic digital pre-distortion approach. Other approaches are also further disclosed herein.

In one example, a system includes a modulator configured to generate a carrier-modulated input signal, a pre-distortion actuator configured to cause a processor to receive the carrier-modulated input signal and convert the carrier-modulated input signal into an output signal and a phased antenna array configured to receive the output signal and transmit the output signal. The phased antenna array can include a plurality of power amplifiers and a plurality of antenna elements, each antenna element of the plurality of antenna elements electrically coupled to a respective power amplifier of the plurality of power amplifiers. The pre-distortion actuator can be configured to generate the output signal by applying a correction to the carrier-modulated input signal that cancels out nonlinearities. The pre-distortion actuator can include a behavioral model or a generalized memory functions (GMF) model. The pre-distortion actuator can include a behavioral model or a generalized memory functions (GMF) model. The pre-distortion actuator can include a plurality of lookup table values that can include parameters of the behavioral model or the GMF model.

In one aspect, the system further can include an adaptation engine electrically coupled to the pre-distortion actuator and a receiver configured to receive the output signal and to generate a feedback based on the output signal. The adaptation engine is configured to update the pre-distortion actuator based on the feedback to yield an updated pre-distortion actuator. The feedback can include one or more samples of the output signal, or one or more received signal quality metric measurements calculated based on the output signal.

The feedback can include one or more samples of the output signal. The adaptation engine can be configured to use a combined direct learning and indirect learning technique and the feedback to improve a predicted pre-distortion actuator to yield the updated pre-distortion actuator. In another aspect, the feedback can include one or more received signal quality metric measurements calculated based on the output signal, and the adaptation engine can be configured to use a stochastic optimization technique and the feedback to improve the updated pre-distortion actuator.

The system can further include an adaptation engine electrically coupled to the pre-distortion actuator and a receiver configured to receive the output signal and to generate a feedback based on the output signal. The adaptation engine can be configured to dynamically adapt a plurality of lookup table parameter element values of the pre-distortion actuator based on the feedback.

The nonlinearities can include one or more of nonlinearities associated with the phased antenna array, nonlinearities associated with power amplifiers of the plurality of power amplifiers, nonlinearities associated with coupling between antenna elements of the plurality of antenna elements, or nonlinearities associated with variations in gain between the antenna elements of the plurality of antenna elements.

The system can further include a receiver located remote from the phased antenna array and configured to receive the output signal. The correction applied by the pre-distortion actuator to the carrier-modulated input signal can compensate for one or more of nonlinearities associated with the phased antenna array, nonlinearities associated with power amplifiers of the plurality of power amplifiers, nonlinearities associated with coupling between antenna elements of the plurality of antenna elements, nonlinearities associated with variations in gain between the antenna elements of the plurality of antenna elements, signal distortions associated with the receiver, or signal degradation associated with the receiver. The system (in this embodiment or any other embodiment disclosed herein) can include a satellite communications system, and the modulator, the pre-distortion actuator, and the phased antenna array can be included in one or more of a satellite, a gateway, a repeater, a user terminal, or a communication node of the satellite communications system.

In another aspect, a system can include a communication node. The communication node can include a pre-distortion actuator configured to receive a carrier-modulated input signal and convert the carrier-modulated input signal into an output signal. The system can also include a phased antenna array configured to receive the output signal and transmit the output signal over an air interface. The phased antenna array can include a plurality of power amplifiers and a plurality of antenna elements, each antenna element of the plurality of antenna elements electrically coupled to a respective power amplifier of the plurality of power amplifiers. The pre-distortion actuator can be configured to apply a digital pre-distortion (DPD) compensation to the carrier-modulated input signal to correct for nonlinearities.

In addition to the communication node above, the system can further include a second communication node. The second communication node can include a receiver configured to receive the output signal. The communication node further can include an adaptation engine electrically coupled to the pre-distortion actuator. A receiver can be configured to generate a feedback based on the output signal received over the air interface. The adaptation engine can be configured to dynamically adapt the pre-distortion actuator based on the feedback to maintain accurate DPD compensation over time.

In one aspect, the communication node further can include a first receiver configured to receive the feedback from a second communication node, and to receive signals associated with first normal communication links with one or more communication nodes of a plurality of communication nodes. The second communication node further can include a first transmitter configured to transmit the feedback to the first receiver and to transmit signals associated with second normal communication links with one or more communication nodes of the plurality of communication nodes.

The feedback can include one or more samples of the output signal. The adaptation engine can be configured to use a combined direct learning and indirect learning technique and the feedback to optimize a predicted pre-distortion actuator to yield an optimized pre-distortion actuator. The optimized pre-distortion actuator can include a dynamic adaptation of the pre-distortion actuator. The feedback can include one or more received signal quality metric measurements calculated based on the output signal, and the adaptation engine can be configured to use a stochastic optimization technique and the feedback to dynamically adapt the pre-distortion actuator.

The pre-distortion actuator can include a behavioral model or a generalized memory functions (GMF) model, and the adaptation engine can be configured to determine updates to a plurality of lookup table values that define parameters of the behavioral model or GMF model.

In another aspect, the system can include a third communication node of the plurality of communication nodes. The third communication node can include a third modulator, a third pre-distortion actuator, and a third phased antenna array configured to transmit a third output signal provided by the third pre-distortion actuator. The receiver included in the second communication node can be configured to receive simultaneously the output signal and the third output signal and to generate first and third feedback, respectively, to provide to the communication node and the third communication node, respectively.

The carrier-modulated input signal (in this embodiment or in other embodiments as well) can include complex-valued I/Q input samples and the output signal can include complex-valued I/Q output samples. The pre-distortion actuator can include circuitry including a first signal processing pathway, a second signal processing pathway, and a third signal processing pathway. In one aspect, first complex-valued I/Q samples including the complex-valued I/Q input samples multiplied with first lookup table values associated with the complex-valued I/Q input samples are generated in the first signal processing pathway. Second complex-valued I/Q samples including complex-valued I/Q previous input samples multiplied with second lookup table values associated with the complex-valued I/Q input samples are generated in the second signal processing pathway. Third complex-valued I/Q samples including the complex-valued I/Q input samples multiplied with third lookup table values associated with the complex-valued I/Q previous input samples are generated in the third signal processing pathway. The complex-valued I/Q previous input samples can include complex-valued I/Q input samples at a previous time point relative to the complex-valued I/Q input samples. A sum of the first, second, and third complex-valued I/Q samples can include the complex-valued I/Q output samples.

The carrier-modulated input signal can include complex-valued I/Q input samples and the output signal can include complex-valued I/Q output samples. The pre-distortion actuator can include circuitry configured to generate the complex-valued I/Q output samples including the complex-valued I/Q input samples multiplied with lookup table values associated with the complex-valued I/Q input samples.

In another aspect, a wireless communication system can include a pre-distortion actuator configured to receive a carrier-modulated signal and convert the carrier-modulated signal into an output signal, one or more antennas configured to receive the output signal from the pre-distortion actuator and transmit the output signal over an air interface and one or more power amplifiers electrically coupled between the pre-distortion actuator and the one or more antennas. The pre-distortion actuator can be configured to generate the output signal by applying a correction to the carrier-modulated signal that cancels out nonlinearities associated with the one or more antennas and the one or more power amplifiers. The pre-distortion actuator can be configured based on feedback. The wireless communication system can further include a receiver configured to receive the output signal via the air interface and to generate the feedback based on the output signal.

The one or more power amplifiers can include a single power amplifier, a plurality of power amplifiers, or at least one solid state power amplifier. In one aspect, the receiver samples the output signal, is bandlimited and detects less than an entire bandwidth over which the pre-distortion actuator applies the correction. The pre-distortion actuator, one or more antennas, and the one or more power amplifiers can be included in a first transmitter. The system can include a second transmitter including a second pre-distortion actuator and configured to transmit a second output signal corrected by the second pre-distortion actuator. The receiver can be configured to receive the second output signal simultaneous with the output signal, and generate a second feedback based on the second output signal. The second pre-distortion actuator can be configured based on the second feedback.

This disclosure also includes methods of performing digital pre-distortion. A method can include generating, via a modulator, a carrier-modulated input signal, converting, via a pre-distortion actuator, the carrier-modulated input signal into an output signal, receiving the output signal at a phased antenna array and transmitting, via the phased antenna array, the output signal via an air interface. The pre-distortion actuator can be configured to generate the output signal by applying a correction to the carrier-modulated input signal that cancels out nonlinearities. The method can further include receiving, from a device, feedback based on the output signal and updating, via an adaptation engine electrically coupled to the pre-distortion actuator, the pre-distortion actuator based on the feedback.

The feedback can include one or more samples of the output signal, or one or more received signal quality metric measurements calculated based on the output signal. The feedback can include one or more samples of the output signal. The method further can include applying, via the adaptation engine, a combined direct learning and indirect learning technique and the feedback to improve a predicted pre-distortion actuator. The feedback can include one or more received signal quality metric measurements calculated based on the output signal. The method further can include applying, via the adaptation engine, a stochastic optimization technique and the feedback to update the pre-distortion actuator. In another aspect, the method can further include receiving, from a device, feedback based on the output signal and dynamically adapting, via an adaptation engine electrically coupled to the pre-distortion actuator, a plurality lookup table parameter element values of the pre-distortion actuator based on the feedback.

The nonlinearities can include one or more of nonlinearities associated with the phased antenna array, nonlinearities associated with power amplifiers of a plurality of power amplifiers, nonlinearities associated with coupling between antenna elements of a plurality of antenna elements, or nonlinearities associated with variations in gain between the antenna elements of the plurality of antenna elements.

The correction applied by the pre-distortion actuator to the carrier-modulated input signal compensates for one or more of nonlinearities associated with the phased antenna array, nonlinearities associated with power amplifiers of a plurality of power amplifiers, nonlinearities associated with coupling between antenna elements of a plurality of antenna elements, nonlinearities associated with variations in gain between the antenna elements of the plurality of antenna elements, signal distortions associated with a receiver of the output signal transmitted over the air interface, or signal degradation associated with the receiver.

The method can be practiced by a system including a satellite communications system, and wherein the modulator, the pre-distortion actuator, and the phased antenna array are included in one or more of a satellite, a gateway, a repeater, a user terminal, or a communication node of the satellite communications system.

As mentioned above, another approach disclosed herein relates to a stochastic technique for performing digital pre-distortion. This represents another embodiment. A system in this regard can include a pre-distortion actuator configured to receive a carrier-modulated input signal and convert the carrier-modulated input signal into an output signal, one or more antennas configured to receive the output signal and transmit the output signal, one or more power amplifiers electrically coupled between the pre-distortion actuator and the one or more antennas The pre-distortion actuator can be configured to generate the output signal by applying a correction to the carrier-modulated input signal that cancels out nonlinearities associated with the one or more antennas and the one or more power amplifiers and an adaptation engine configured to dynamically adapt the pre-distortion actuator based on feedback from a receiver. The feedback can include a plurality of received signal quality metric measurements determined by the receiver based on the output signal. The adaptation engine can be configured to update parameters of a model implemented in the pre-distortion actuator using simultaneous perturbation stochastic approximation (SPSA).

The adaptation engine can be configured to apply a plurality of sets of perturbations to parameters of a model implemented in the pre-distortion actuator. The one or more antennas transmits a signal for each set of the plurality of sets of the randomized perturbations, the signal corrected by the pre-distortion actuator. The receiver determines at least one signal quality metric measurement based on the output signal received over-the-air for each set of the plurality of sets of the randomized perturbations.

The adaptation engine can be configured to determine differential receiver metric measurements based on the signal quality metric measurements corresponding to the plurality of sets of the randomized perturbations. The adaptation engine can be configured to determine a plurality of gradients. Each gradient of the plurality of gradients can include differences in the signal quality metric measurements corresponding to the plurality of sets of the randomized perturbations divided by differences in the parameters that have been perturbed associated with the plurality of sets of randomized perturbations.

The adaptation engine can be configured to identify optimized values of the parameters, from among the values of the parameters to which the plurality of sets of the randomized perturbations have been applied, based on the gradients. The pre-distortion actuator can be configured with the optimized values of the parameters to apply the correction. The pre-distortion actuator can include a behavioral model or a generalized memory functions (GMF) model.

A received signal quality metric measurement of the plurality of received signal quality metric measurements can include one or more of error vector magnitude (EVM), bit error rate (BER), pilot SNR, packet error rate (PER), receive-signal-strength indicators (RSSI), channel quality indicators (CQI), correlation coefficient against a known sequence, channel estimates, mutual information, or power measurement in a band of adjacent carriers. The carrier-modulated input signal can be configured as described above.

The carrier-modulated input signal can also include complex-valued I/Q input samples and the output signal can include complex-valued I/Q output samples. The pre-distortion actuator can include circuitry configured to generate the complex-valued I/Q output samples can include the complex-valued I/Q input samples multiplied with lookup table values associated with the complex-valued I/Q input samples.

The correction applied by the pre-distortion actuator to the carrier-modulated input signal can include a correction that compensates for one or more of nonlinearities associated with the one or more antennas, nonlinearities associated with the one or more power amplifiers, nonlinearities associated with coupling between the one or more antennas, nonlinearities associated with variations in gain between the one or more antennas, signal distortions associated with the receiver, or signal degradation associated with the receiver.

The system can include a satellite communications system. The pre-distortion actuator, the one or more antennas, the one or more power amplifiers, and the adaptation engine can be included in one or more of a satellite, a gateway, a repeater, a user terminal, or a communication node of the satellite communications system.

The receiver that samples the output signal over-the-air can be bandlimited and detects less than a bandwidth over which the pre-distortion actuator applies the correction.

The pre-distortion actuator, the one or more antennas, the one or more power amplifiers, and the adaptation engine can be included in a first transmitter. The system further can include a second transmitter including a second pre-distortion actuator and a second adaptation engine, and configured to transmit a second output signal corrected by the second pre-distortion actuator. The receiver can be configured to receive the second output signal over-the-air simultaneous with the output signal, and generate a second feedback based on the second output signal over-the-air. The second adaptation engine dynamically adapts the second pre-distortion actuator based on the second feedback.

In another aspect, a system, and a digital pre-distortion (DPD) compensator configured to apply a linearization correction to input samples to generate output samples, an antenna assembly including one or more antennas electrically coupled to one or more power amplifiers, the antenna assembly configured to transmit the output samples. The linearization correction can compensate for nonlinearity associated with the antenna assembly and an adaptation engine configured to use a plurality of received signal metric measurements associated with the output samples received by a receiver over-the-air, the plurality of received signal metric measurements generated by the receiver. The adaptation engine can be configured to generate a plurality of sets of perturbed parameters of the DPD compensator. The plurality of sets of perturbed parameters can include randomized perturbations of parameters of the DPD compensator, and each set of perturbed parameters of the plurality of sets of perturbed parameters associated with a respective perturbation of a plurality of perturbations. The DPD compensator can be successively configured in accordance with respective set of the plurality of sets of perturbed parameters. The receiver can determine a set of received signal metric measurements for each output sample received by the receiver over-the-air and associated with a respective set of the plurality of sets of perturbed parameters. The adaptation engine can determine updated parameters of the DPD compensator based on a simultaneous perturbation stochastic approximation (SPSA) and based on the plurality of sets of perturbed parameters and the sets of the received signal metric measurements associated with the plurality of sets of perturbed parameters.

The adaptation engine can determine the updated parameters of the DPD compensator based on gradients including differences of the sets of the received signal metric measurements divided by differences of the plurality of sets of perturbed parameters.

This embodiment can also include a method related to a stochastic technique. A method in this regard can include receiving, at a pre-distortion actuator, a carrier-modulated input signal, converting, via the pre-distortion actuator, the carrier-modulated input signal into an output signal, receiving, at one or more antennas and via one or more power amplifiers electrically coupled between the pre-distortion actuator and the one or more antennas, the output signal, transmitting, via the one or more antennas, the output signal over-the-air to a receiver and dynamically adapting, via an adaptation engine and based on a simultaneous perturbation stochastic approximation (SPSA), the pre-distortion actuator based on feedback from the receiver. The feedback can include a plurality of received signal quality metric measurements determined by the receiver based on the output signal. The pre-distortion actuator can be configured to generate the output signal by applying a correction to the carrier-modulated input signal that cancels out nonlinearities associated with the one or more antennas and the one or more power amplifiers.

BRIEF DESCRIPTION OF THE DRAWINGS

The foregoing aspects and many of the attendant advantages of the embodiments of the present disclosure will become more readily appreciated as the same become better understood by reference to the following detailed description, when taken in conjunction with the accompanying drawings, wherein.

DETAILED DESCRIPTION

Figure 1A:
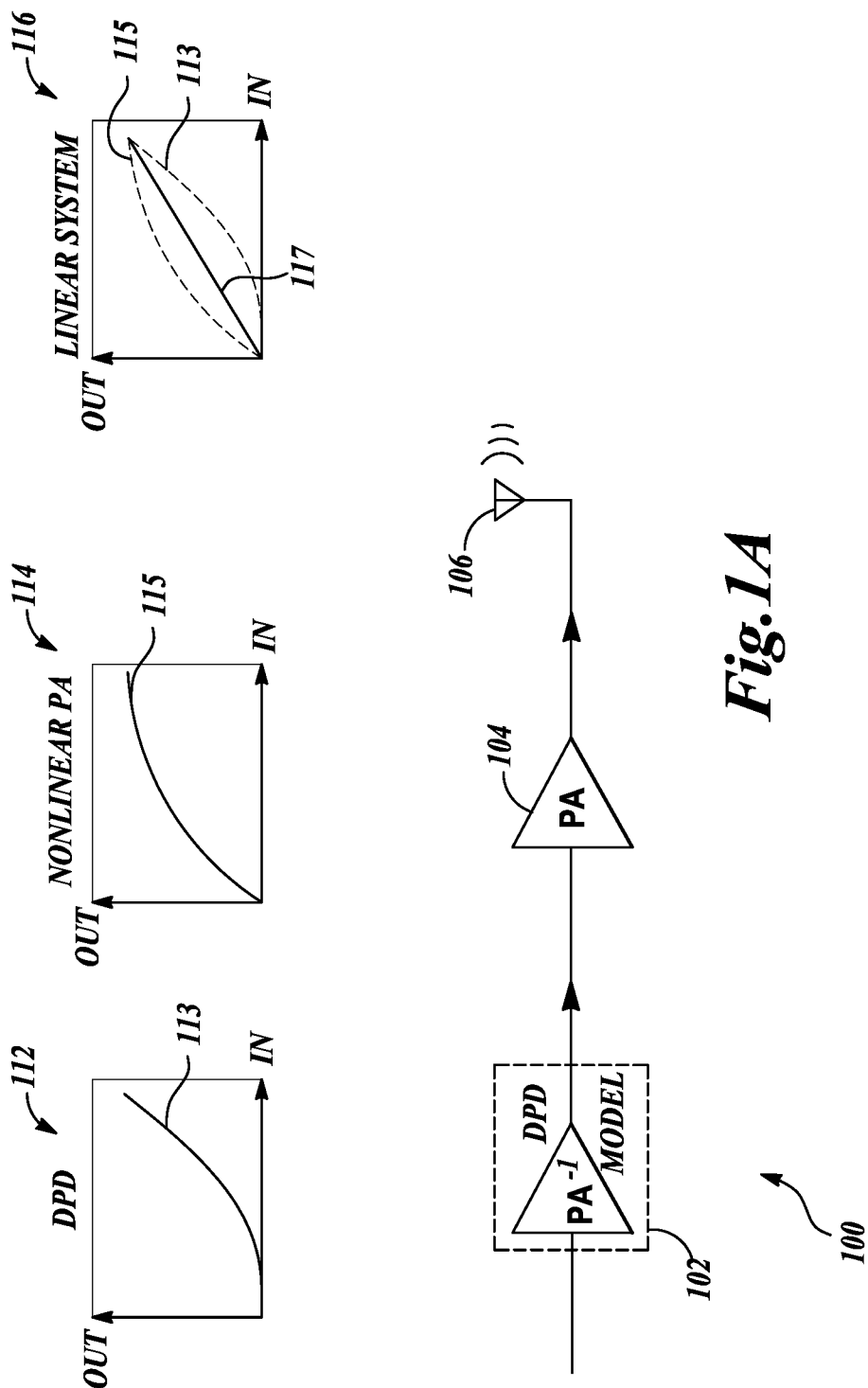
FIG. 1A illustrates a block diagram showing characteristics of various components included in a wireless communications system in accordance with various aspects of the present disclosure.

In order to address the issues raised above, this disclosure introduces several novel concepts. It would be advantageous for signal transmissions from wireless communications systems to have reduced signal distortion associated with power amplifier nonlinearity. Likewise, it would be advantageous to configure wireless communications systems using low-cost and/or low-power power amplifiers that satisfy wireless emission requirements and that achieve a high data rate and high signal fidelity. It would further be advantageous to configure wireless communications systems capable of rapid, accurate, and/or continuous compensation of signal distortion associated with power amplifier nonlinearity prior to signal transmission. It would be further advantageous to configure wireless communications systems to have reduced weight, reduced size, inexpensive components, lower manufacturing cost, and/or lower power requirements and meet out-of-band emissions requirements. Accordingly, embodiments of the present disclosure are directed to these and other improvements in wireless communications systems or portions thereof.

Embodiments of apparatuses and methods relate to digital pre-distortion (DPD) compensation of antenna and power amplifier-associated nonlinearity in wireless communication systems. In some embodiments, a wireless communications system includes a pre-distortion actuator configured to receive a baseband signal and convert the baseband signal into an output signal; one or more antennas configured to receive the output signal, convert to a carrier-modulated signal and transmit the output signal; and one or more power amplifiers electrically coupled between the pre-distortion actuator and the one or more antennas. A receiver can be configured to receive the output signal over-the-air and generate feedback based on the output signal received over-the-air. The pre-distortion actuator is configured to generate the output signal by applying a correction to the baseband signal that cancels out nonlinearities associated with the one or more antennas and/or the one or more power amplifiers. The pre-distortion actuator is configured based on the feedback. This disclosure presents a number of different solutions. One solution relates to digital pre-distortion compensation as a general concept. Another solution focuses on using stochastic optimization for adapting pre-distortion compensation. Yet another solution relates to using a combined direct and indirect learning technique for adapting digital pre-distortion compensation. These and other aspects of the present disclosure will be more fully described below.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. Additionally, it should be appreciated that items included in a list in the form of "at least one A, B, and C" can mean (A); (B); (C); (A and B); (B and C); (A and C); or (A, B, and C). Similarly, items listed in the form of "at least one of A, B, or C" can mean (A); (B); (C); (A and B); (B and C); (A and C); or (A, B, and C).

Language such as "top surface", "bottom surface", "vertical", "horizontal", and "lateral" in the present disclosure is meant to provide orientation for the reader with reference to the drawings and is not intended to be the required orientation of the components or to impart orientation limitations into the claims.

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, it may not be included or may be combined with other features.

Many embodiments of the technology described herein may take the form of computer- or processor-executable instructions, including routines executed by a programmable computer, processor, controller, chip, and/or the like. Those skilled in the relevant art will appreciate that the technology can be practiced on computer/controller systems other than those shown and described above. The technology can be embodied in a special-purpose computer, controller, or processor that is specifically programmed, configured or constructed to perform one or more of the computer-executable instructions described above. Accordingly, the terms "computer," "controller," "processor," or the like as generally used herein refer to any data processor and can include Internet appliances and hand-held devices (including palmtop computers, wearable computers, cellular or mobile phones, multi-processor systems, processor-based or programmable consumer electronics, network computers, mini computers, and the like). Information handled by these computers can be presented at any suitable display medium, including an organic light emitting diode (OLED) display or liquid crystal display (LCD).

FIG. 1A illustrates a block diagram showing characteristics of various components included in a wireless communications system 100 in accordance with various aspects of the present disclosure. The wireless communications system 100, and in particular, a wireless transmission system included in the wireless communications system 100, can include a digital pre-distortion (DPD) module 102, a power amplifier (PA) 104, and an antenna 106. PA 104 is electrically coupled between the DPD module 102 and antenna 106. Graphs 112, 114, and 116 show operating characteristics of respective DPD module 102, PA 104, and antenna 106.

In some embodiments, DPD module 102 can include a digital cancellation or compensation scheme configured to "linearize" the nonlinearity of PA 104 by cancelling out the PA's nonlinear characteristics. Accordingly, the resulting signal transmitted by antenna 106 can include a signal without the distortion associated with nonlinearity of PA 104. Linearizing or compensating for the nonlinearity of PA 104 improves transmitter efficiency and overall system performance by allowing PA 104 to operate properly even while in high-power compression. DPD module 102 is configured to apply an inverse nonlinear transfer function of a PA model in the digital domain so that when combined with the actual nonlinearity of PA 104, the transmission chain or pathway generates an overall linear transfer function, or a transfer function that is more linear that it was previously due to the distortion.

As shown in FIG. 1A, line 115 of graph 114 shows the nonlinear characteristic of PA 104. DPD module 102 is configured to apply the inverse of the nonlinearity exhibited by PA 104, namely, an inverse nonlinear transfer function as denoted by data 113 in graph 112. Graph 116 shows a final or overall transfer function (data 117) that is linear. Data 117 can include a combination of data 115 and 113.

For example, in the absence of DPD compensation (e.g., without using DPD module 102), if PA 104 is driven into saturation, nonlinearities occur as shown by data 115 in graph 114 thereby leading to undesirable spectral components in the transmitted signal. Emissions in adjacent channels, caused by intermodulation of the modulated waveform, may violate emission requirements set forth by governments or agencies. Likewise, in-band distortion, measured as error vector magnitude (EVM), degrades bit-error-rate and data throughput capacity. To reduce the PA distortion contributing to these distortions, the PA 104 can be backed off to operate within the linear region of its operating curve. However, depending on transmission formats, the peak-to-average power ratio may be as high as 7-10 decibels (dB), which means the average power associated with the PA is far from the PA saturation point. The result is low power efficiency (e.g., less than 10% efficiency) with the majority of the PA consumed power lost to heat or other waste.

By pre-compensating for PA non-linear distortion, DPD compensation allows PA 104 to be operated further into its saturation region while maintaining linearity requirements, thereby ensuring that the power consumed by the PA is allocated as much as possible for desirable signal generation rather than wasted. In this way, DPD compensation can improve PA power efficiency by approximately three times or more.

Figure 1B:
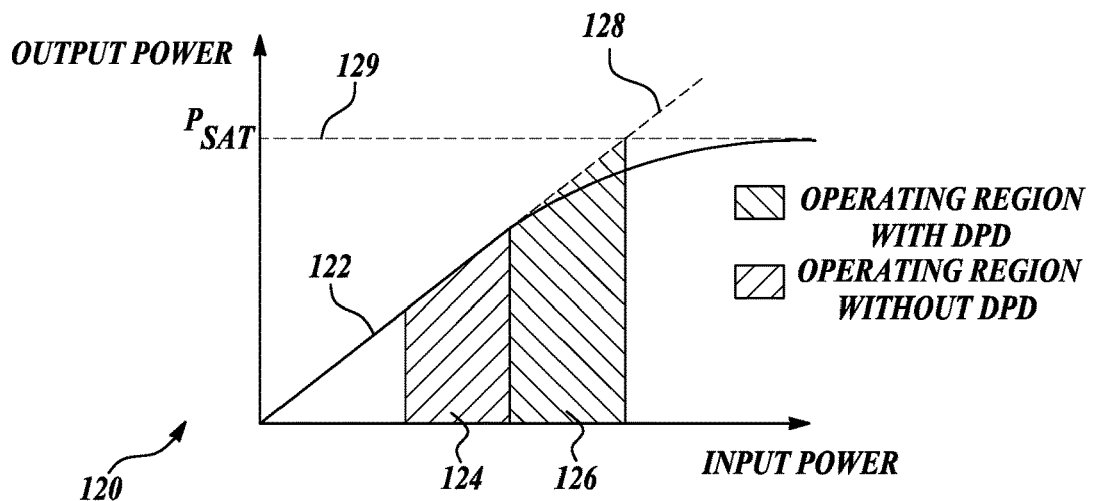
FIG. 1B illustrates a graph showing output power associated with a power amplifier (PA) as a function of input or consumed power in accordance with various aspects of the present disclosure.

FIG. 1B illustrates a graph 120 showing output power associated with a PA as a function of input or consumed power in accordance with various aspects of the present disclosure. Data 122 shows a linear relationship between output and input powers at low to medium input power levels and nonlinearity in output power for input powers exceeding approximately medium power levels or as the output power approaches saturation 129.

A first operating region 124 denotes the PA's linear operating region, and DPD compensation is not required. A second operating region 126 denotes an operating region of the PA characterized by nonlinear behavior. In the absence of DPD compensation when the PA is operating within the second operating region 126, the resulting output signal of the PA exhibits nonlinearity as a function of the input as shown in line 122. With the application of DPD compensation during PA operation within the second operating region 126, the resulting output signal of the PA will appear to behave linearly as shown by line 128. Notice that even operating near the saturation point (see saturation line 129), the PA will appear to exhibit linearity along the line 122/128 via use of DPD compensation.

Figure 1C:
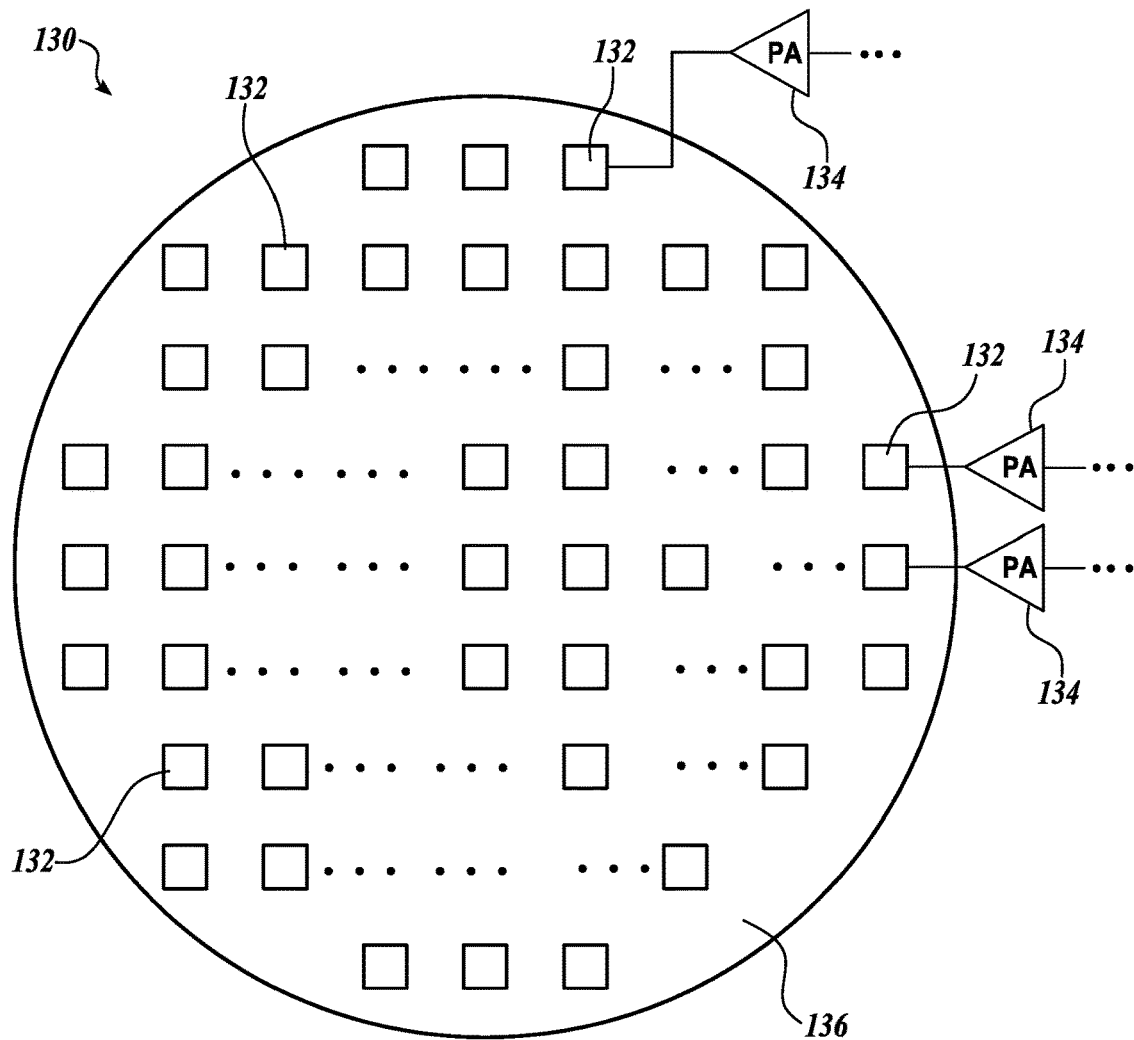
FIG. 1C illustrates a top view of an antenna lattice in accordance with various aspects of the present disclosure.

FIG. 1C illustrates a top view of an antenna lattice 130 in accordance with various aspects of the present disclosure. Antenna lattice 130 can include a plurality of antenna elements 132 arranged in a particular pattern to define a phased array antenna. The plurality of antenna elements 132 may be positioned on a printed circuit board (PCB) 136. Each antenna element of the plurality of antenna elements 132 can be electrically coupled with a respective PA of a plurality of PAs 134. In one aspect, a front-end module can include a PA and a low-noise amplifier, and a single front-end module can support two antenna elements 132. Antenna lattice 130 is included in a phased array panel. The phased array panel can include a PCB stack, in which the plurality of PAs 134 is arranged in a PCB disposed below the PCB 136. The phased array panel also includes circuitry, electrical components, conductive traces, ground planes, vias, beamforming components, digital-to-analog converters (DACs), filters, low pass filters (LPFs), mixers, and/or the like. Each antenna element of the plurality of antenna elements 132 can include an antenna such as antenna 106 shown in FIG. 1A. Each PA of the plurality of PAs 134 in FIG. 1C can include a PA such as PA 104 as shown in FIG. 1A.

Alternatively, the antenna 106 can include a parabolic antenna, a single antenna, and/or other antenna structures.

Figure 1D:
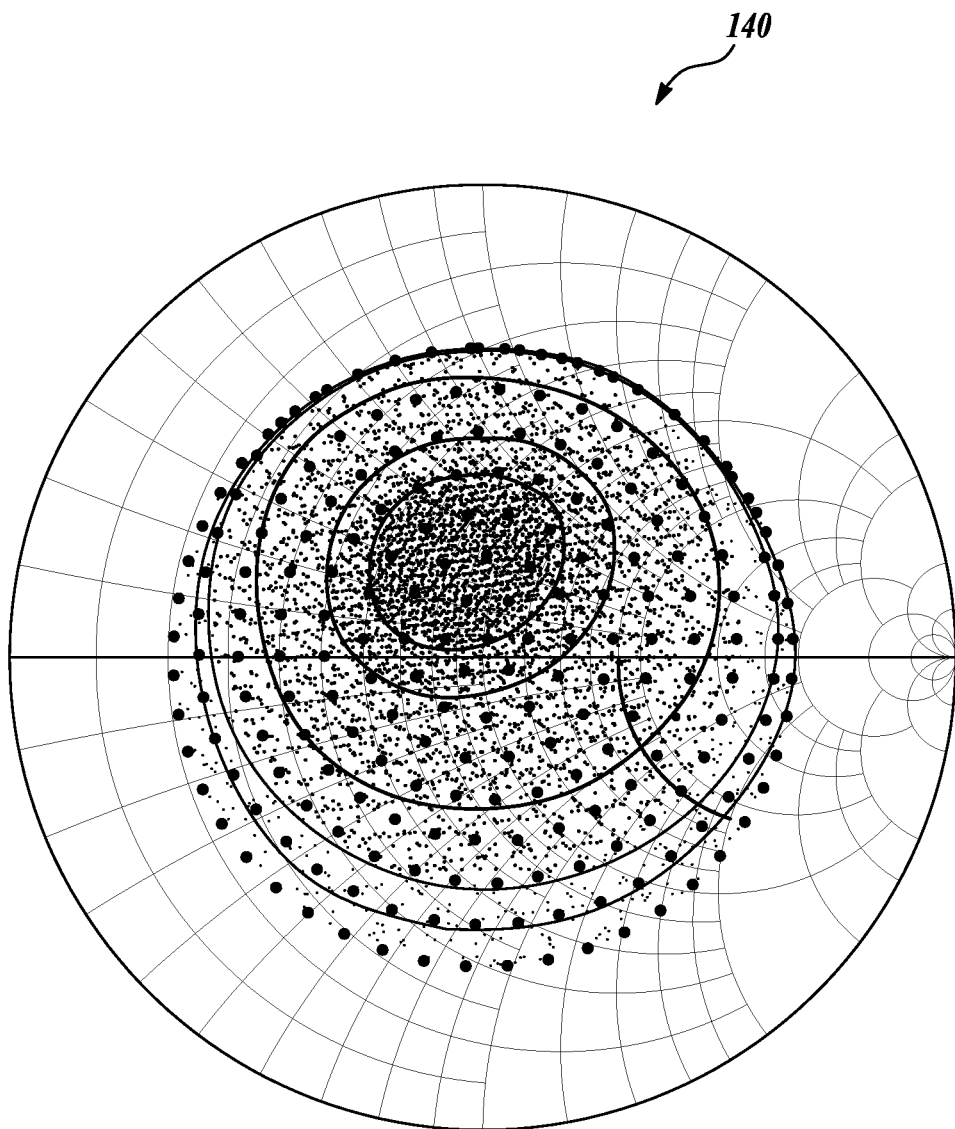
FIG. 1D illustrates measurements showing nonlinear sensitivity of a single antenna element included in a panel in terms of adjacent channel leakage ratio (ACLR) and load impedance in accordance with various aspects of the present disclosure.

In some embodiments, DPD compensation is sensitive to environmental conditions such as, but not limited to, temperature, output power, load condition, and/or the like. When a large number of antenna elements are configured to form an antenna, such as the antenna lattice 130, the different location of each antenna element and associated PA within the panel may cause each of the respective PAs to operate at different temperature, output power, and/or load condition relative to each other. Thus, instead of all the antenna elements having the same load impedance, there are different load impedance values among the antenna elements distributed on the panel. FIG. 1D illustrates measurements 140 on a Smith Chart (as would be known to one of skill in the art) showing nonlinear sensitivity of a single antenna element included in a panel in terms of adjacent channel leakage ratio (ACLR) and load impedance in accordance with various aspects of the present disclosure.

Figure 2C:
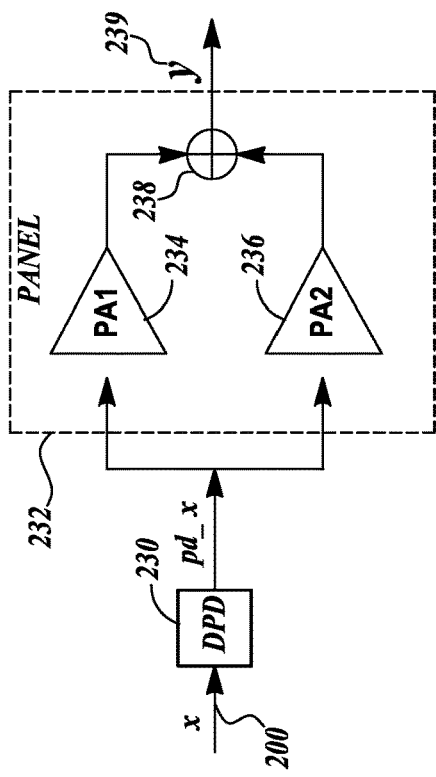
FIG. 2C illustrates a block diagram showing a plurality of PAs of a phased array antenna panel/system treated as a single nonlinear system in accordance with various aspects of the present disclosure.

If there are a plurality of PAs in a transmitter system, such as the plurality of PAs 134 associated with the plurality of antenna elements 132 included in antenna lattice 130, then DPD compensation is performed for each PA of the plurality of PAs. In some embodiments, DPD compensation can be performed separately for each PA of the plurality of PAs 134. FIG. 2A illustrates a block diagram showing at least two PAs 204 and 208 for which separate DPD compensation is applied by respective DPD modules 202 and 206 in accordance with various aspects of the present disclosure.

A signal 200 (denoted as x) is to be amplified by each of PAs 204, 208. Signal 200 can be input to DPD module 202. DPD module 202 performs particular DPD compensation on the signal 200 to pre-compensate or cancel out the nonlinearity associated with PA 204. The output signal of DPD module 202 is shown as pd_x 1, which is input to the PA 204. Likewise, DPD module 206 performs particular DPD compensation on the signal 200 to pre-compensate or cancel out the nonlinearity associated with PA 208 and to produce signal pd_x 2 which is input to PA 208. The signals outputted from PAs 204, 208 (denoted as y1 and y2), which exhibit linearity due to DPD modules 202, 206, are combined by a summation component 210 into a signal 222 (denoted as y), to be provided to an antenna for transmission.

Figure 2D:
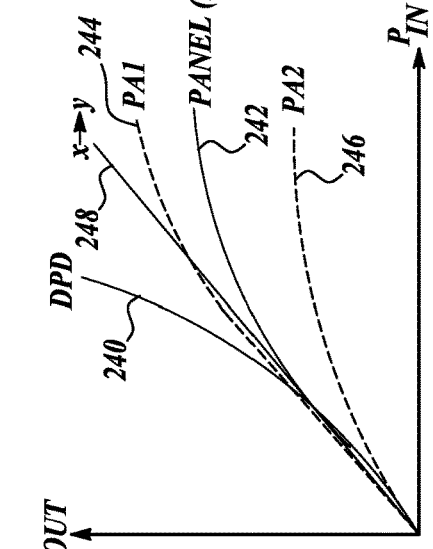
FIG. 2D illustrates a graph showing linear or nonlinear characteristic of components and signals shown in FIG. 2C in accordance with various aspects of the present disclosure.
Figure 2A:
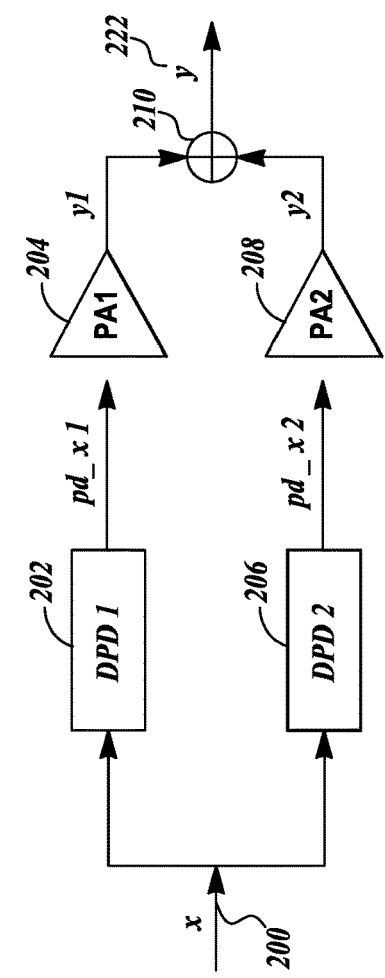
FIG. 2A illustrates a block diagram showing at least two PAs for which separate DPD compensation is applied by respective DPD modules in accordance with various aspects of the present disclosure.
Figure 2B:
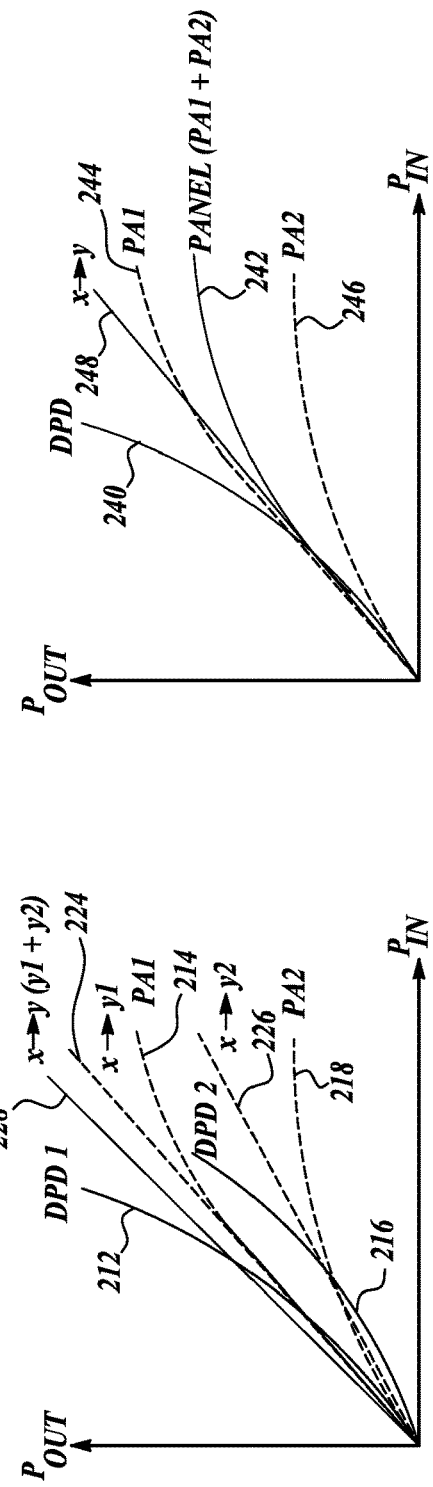
FIG. 2B illustrates a graph showing linear or nonlinear characteristic of components and signals shown in FIG. 2A in accordance with various aspects of the present disclosure.

FIG. 2B illustrates a graph showing linear or nonlinear characteristic of components and signals shown in FIG. 2A in accordance with various aspects of the present disclosure. Data 214 and 218 show the nonlinear behavior of respective PA 204 and 208 at higher values of the input power. Data 212 and 216 represent the output signal of respective DPD modules 202, 206 configured to process signal 200 (e.g., introduce specific nonlinearity to signal 200) so as to cancel out the nonlinearity of respective PAs 204, 208. Line 224 can represent the signal (y1) at the output of PA 204, now exhibiting linear behavior. Line 224 can represent the combination of data 212 and 214. Similarly, line 226 can represent the signal (y2) at the output of PA 208, and which can include the combination of data 216 and 218. Lastly, line 228 represents signal 222 having linear characteristics despite PAs 204 and 208 exhibiting nonlinearity as shown in lines 214 and 218. The line 228 represents the output signal 222 (signal 7) shown in FIG. 2A which is a combination or a summation 210 of line 224 (signal y1) and line 226 (signal y2).

Performing DPD compensation individually for each PA when there are a large number of PAs such as in a phased array antenna system (e.g., hundreds, thousands, or more PAs) can be prohibitively complex, resource intensive, increase weight, increase size, increase manufacturing complexity, increase component costs, and/or the like. The correspondingly large number of DPD modules required to perform individual DPD compensation can occupy sizable integrated circuit (IC) chip area and consumes additional power. A plurality of feedback receiver systems, one for each PA and DPD module set, is needed to provide data for learning a PA's actual operating characteristics. The compensation or calibration time is extended in order to learn each PA's actual operating characteristics.

Instead of the single PA-based DPD compensation, all the PAs in a wireless transmission system can be treated as single nonlinear system to which a single composite DPD compensation or cancellation is applied to achieve linearity of the phased array antenna. The single nonlinear system construct not only includes various PA nonlinearities but also coupling between antenna elements of the phased array antenna, antenna element gain variations, and/or the like. FIG. 2C illustrates a block diagram showing a plurality of PAs 234, 236 of a phased array antenna panel/system treated as a single nonlinear system 232 in accordance with various aspects of the present disclosure. PAs 234, 236 are similar to respective PAs 204, 208. A single DPD module 230 is configured to apply a single composite inverse function of the nonlinearity present in the single nonlinear system 232. Signal 239 (signal y of FIG. 2C) outputted after the summation component 238 is the same or similar to output signal 222 (signal y) of FIG. 2A. Thus, one aspect of this disclosure is using a single DPD 230 that generates a single cancellation signal that can be applied to a one or more individuals PAs 234, 236, where typically a thousand or more PAs are contemplated. Although the individual distortion cancellation (234, 236) might not cancel the distortion in all spatial directions as could occur using a dedicated DPD 202, 206 for each PA 204, 208 (FIG. 2A), the distortion cancellation can be optimized for a particular direction that matters (e.g., the mainlobe) to achieve comparable performance in that direction. The overall power consumption and other benefits of using the single DPD compensation can make this a preferred solution.

FIG. 2D illustrates a graph showing linear or nonlinear characteristic of components and signals shown in FIG. 2C in accordance with various aspects of the present disclosure. Data 244 and 246 show the nonlinearity of respective PAs 234, 236. Data 242 represents the composite nonlinearity of the single nonlinear system 232. The composite inverse function of the DPD module 230 is shown in data 240. Line 248 shows the linearity of output signal 239 (signal y).

In some embodiments, DPD compensation can include: (1) extraction of a PA nonlinearity model from input and output measurements of the PA, in which the PA can include a single PA or a plurality of PAs treated collectively together as a single composite system; (2) calculation of an inverse function; and (3) application of the inverse function to the signal to be transmitted prior to signal input to the PA. These functions may be performed repeated in the background (e.g., in a close loop) without interfering with normal transmission processes. Such close-loop adaptation allows the correction to track variations in PA nonlinearity caused by device aging, junction temperature variations, bias, other time-varying effects, environmental conditions, inherent PA performance parameters, and/or the like. The close-loop adaptation can occur continuously, periodically, on-demand, as resources allow, based on a trigger condition, and/or the like. DPD compensation may also be referred to as DPD cancellation, DPD adaptation, DPD calibration, over-the-air DPD, and/or the like. In one aspect, the DPD compensation can occur only in the region 126 approaching the saturation point 129 of the PA (see FIG. 1B).

Figure 3:
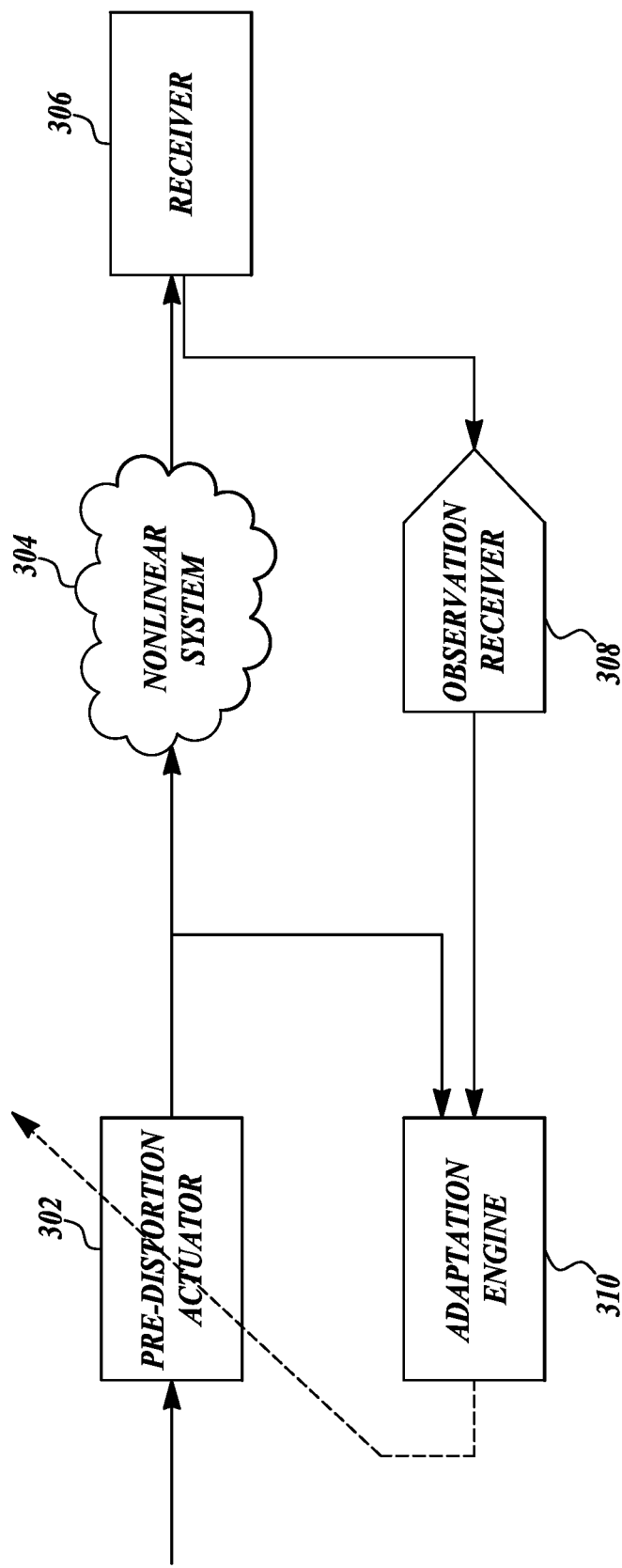
FIG. 3 illustrates a block diagram showing components for performing DPD compensation in accordance with various aspects of the present disclosure.

FIG. 3 illustrates a block diagram showing components for performing DPD compensation in accordance with various aspects of the present disclosure. The output of a pre-distortion actuator 302 can include the input to each of a nonlinear system 304 and an adaptation engine 310. The output of the nonlinear system 304 can include the signal transmitted to a receiver system 306. An observation receiver 308 can include at least a part of the receiver system 306 and is configured to provide data regarding the received signal/waveform to the adaptation engine 310. The adaptation engine 308, in turn, uses the received inputs to update, as needed, the pre-distortion to be applied by the pre-distortion actuator 302. The adaptation engine can apply various models to generate its output. A stochastic optimization model, or a combined direct and indirect leaning technique, or other techniques can be used to evaluate the data and generate adjustments to the pre-distortion actuator 302.

In some embodiments, the pre-distortion actuator 302 is configured to apply the inverse function digitally to the signal/waveform using lookup table (LUT) circuitry, multipliers, delays, and the like. The observation receiver 306 is configured to capture the latest output from the nonlinear system 304 (e.g., wideband PA output) and take measurements of such data. The adaptation engine 310 (also referred to as a DPD adaptation engine) is configured to update the pre-distortion actuator 302 function based on the latest data. It is noted that an embodiment or example system can include any one or more of these components. In one example, a "system" can include the pre-distortion actuator 302, the non-linear system 304 and the adaptation engine 310. These can all be components of a system that generates and transmits a signal to the receiver 306. In another example, both a transmission system (the pre-distortion actuator 302, the non-linear system 304 and the adaptation engine 310) and the receiver 306 can be considered as part of the same system. In another example, just the operations of the receiver 306 can be considered a system embodiment.

Figure 4:
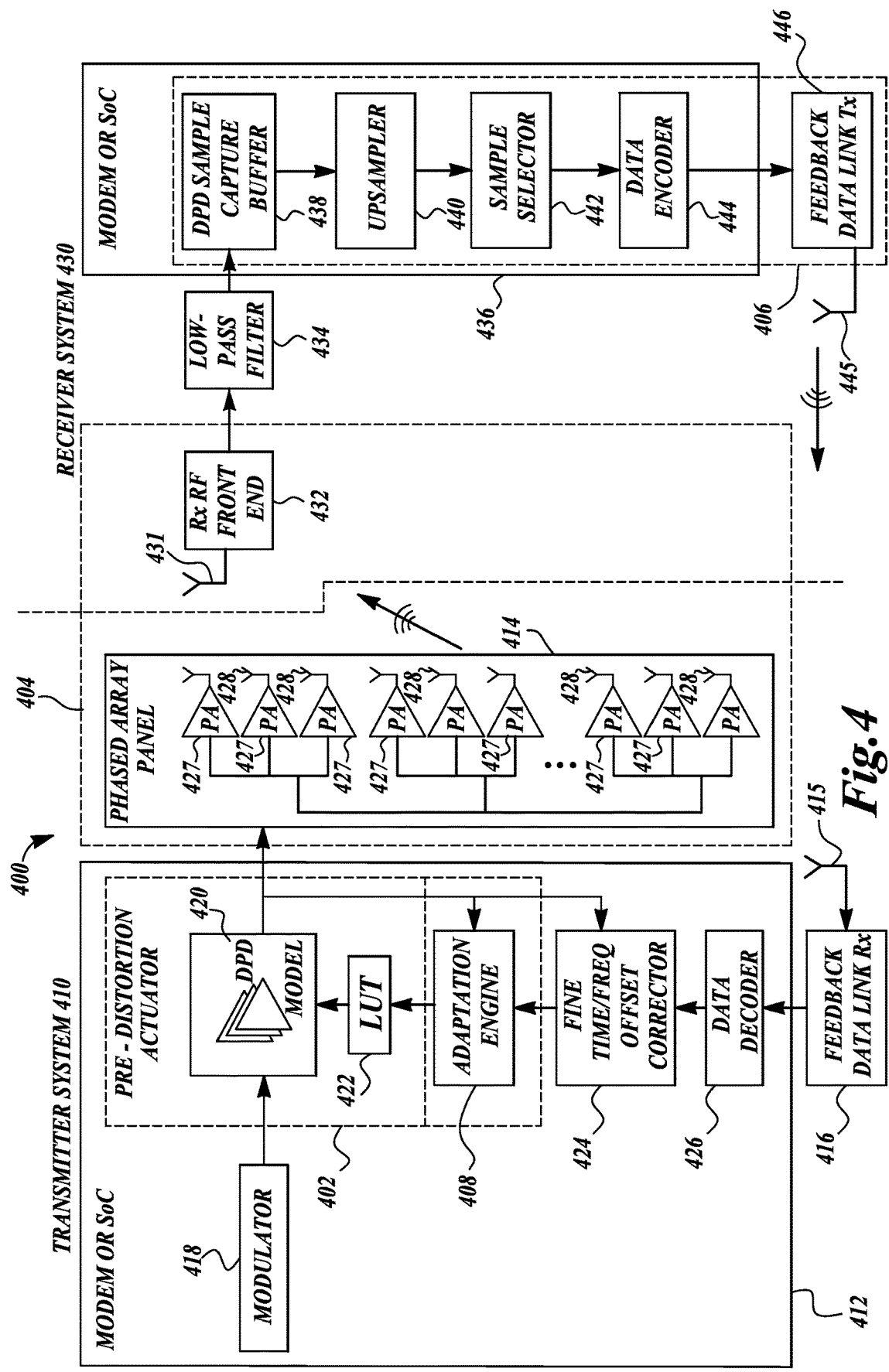
FIG. 4 illustrates a block diagram showing at least a portion of a wireless communications system implementing digital pre-distortion (DPD) compensation in accordance with various aspects of the present disclosure.

FIG. 4 illustrates a block diagram showing at least a portion of a wireless communications system 400 implementing DPD compensation in accordance with various aspects of the present disclosure. The wireless communications system 400 includes a transmitter system 410 and a receiver system 430. The transmitter system 410 can include a modem or system on chip (SoC) 412, a phased array panel 414, and a feedback data link receiver 416. The modem or SoC 412 is electrically coupled between the phased array panel 414 and feedback data link receiver 416 and associated antenna 415. The transmitter system 410 is also referred to as a transmitter or a transmitter side.

The system 400 can include a wireless communications system, a satellite-based communications system, a non-geostationary orbit (NGO) communications system, a low earth orbiting (LEO) communications system, a non-earth based communications system, a gateway, a user terminal, any earth-based communication system and/or the like.

Modem or SoC 412 can include one or more IC chip, circuitry, and/or electronic components. Modem or SoC 412 includes, without limitation, a modulator 418, a pre-distortion actuator 402, an adaptation engine 408, a fine time/frequency offset corrector 424, and a data decoder 426. The pre-distortion actuator 402, also referred to as a DPD actuator, is electrically coupled between the modulator 418 and phased array panel 414. The output of modulator 418 can include the input to the pre-distortion actuator 402. The output of pre-distortion actuator 402 can include the input to each of the phased array panel 414, adaptation engine 408, and fine time/frequency offset corrector 424. The output of the phased array panel 414 can include the transmitted signal/waveform to be received over the air interface by the receiver system 430. The system disclosed herein also can be applied where there is a wired connection between the transmitter 310 and receiver 430.

The input to the feedback data link receiver 416 can include the received feedback data from the receiver system 430, as will be described in detail below. The output of the feedback data link receiver 416 can include the input to data decoder 426. The output of data decoder 426 can include the input to the fine time/frequency offset corrector 424. The output of fine time/frequency offset corrector 424 can include the input to adaptation engine 408. The output of adaptation engine 408 can include the input to lookup table (LUT) 422. Components such as the data decoder 426, the LUT 422, and/or the fine time/frequency offset corrector 424 are optional components and can be used for particular signal processing functions but not required to practice the disclosed concepts.

The modulator 418 is configured to generate and provide the signal (e.g., input signal 200) to be amplified by PAs 427 included in the phased array panel 414. Signal outputted by modulator 418 can include an analog carrier-modulated RF signal. For this reason, modulator 418 may also be referred to as a RF modulator, carrier modulator, and/or the like. Pre-distortion actuator 402 includes a DPD module 420 and one or more LUTs 422. LUT 422 is electrically coupled between the DPD module 420 and adaptation engine 408. The pre-distortion actuator 402 forms a feedback loop with the adaptation engine 408. Pre-distortion actuator 402 is also referred to as a DPD actuator. DPD module 420 is also referred to as a DPD model, a combined $PA^{-1}$ module, a combined $PA^{-1}$ model, and/or the like. The DPD module 420 can include a single component that generates the compensation signal for one or more PAs 427 or may include a respective DPD component for each PA 427. In another aspect, a single DPD module generates compensation for amplitude nonlinearities while a phase adjustment is adapted for each PA.

In some embodiments, pre-distortion actuator 402 is similar to pre-distortion actuator 302; adaptation engine 408 is similar to adaptation engine 308; and DPD module 420 is similar to DPD module 230 of FIG. 3.

Phased array panel 414 includes a plurality of antenna elements 428 particularly arranged relative to each other and a plurality of PAs 427. The plurality of PAs 427 are disposed between the pre-distortion actuator 402 and the plurality of antenna elements 428, and are electrically coupled with the plurality of antenna elements 428. One or more PAs can be provided in the transmit pathway for each antenna element of the plurality of antenna elements 428. For example, a single PA can be provided in the transmit path for a given antenna element of the plurality of antenna elements 428. As another example, a pre-power amplifier (PPA) and a PA can be provided in the transmit path for a given antenna element of the plurality of antenna elements 428. Phased array panel 414 also includes beamforming components, digital-to-analog converters (DACs), low pass filters (LPFs), mixers, and/or the like. Phased array panel 414 may be similar to the panel including the antenna lattice 130. The plurality of antenna elements 428 can transmit respective signals over an air interface to the receiver system 430.

The signal or waveform emitted by the phased array panel 414 is linear from at least the perspective of the receiver system 430 positioned in the primary beam direction of the phased array transmission due to application of DPD compensation by a single pre-distortion actuator 402 prior to signal transmission. The receiver system 430 is configured and positioned to receive, by a receiver antenna 431, the main lobe of the transmitted signal. The received signal is outputted by the receiver antenna 431 to a receiver front end component 432. The receiver front end component 432 can include filters, down converters, analog-to-digital converters (ADCs), signal combiners, and/or the like configured to reconstitute the received signals and down convert from the carrier frequency in order to recover the underlying data transmitted by transmitter system 410. The output of the receiver front end component 432 can include the input to a low-pass filter (LPF) 434 or one or more other filters to further filter the received signal.

In some embodiments, the phased array panel 414, the signal propagation space between the transmitter and receiver systems 410, 430, and the initial components of the receiver system 430 (e.g., receiver antenna 431 and front end component 432) can include a nonlinear system 404. Nonlinear system 404 is similar to the nonlinear system 304 of FIG. 3. Pre-distortion actuator 402 is configured to compensate for distortions associated with the nonlinear system 404. Distortions associated with nonlinear system 404 include, but are not limited to, various nonlinearities of the PAs 427 included in the phased array panel 414, coupling between antenna elements of the plurality of antenna elements 428, and/or variations in gain among the antenna elements of the plurality of antenna elements 428. Other distortions can include, without limitation, interference, noise, Doppler effect, distortions introduced by receiver system 430, phase noise, I/Q imbalance, and/or the like.

While linearizing the whole panel 414 from the perspective of the receiver system 430 may not necessarily improve linearity outside of the main lobe of the beam, main-lobe linearity is likely the limiting factor for meeting emission specifications. Out-of-band emissions are significantly lower in the side-lobes of the beam. DPD compensation disclosed herein is configured to facilitate main-lobe linearity, which dictates link quality, and overall panel transmission efficiency. The system can also be configured to compensate for side lobes exclusively as well as configured to compensate in a combination of the main lobe and one or more side lobes of a signal.

In some embodiments, if the beam steering phases of the signals/beams are controlled via a conventional minimum variance distortionless response (MVDR) technique (also referred to as Capon beamformer), the single or one time configured pre-distortion function need not be updated as the beam is steered due to cancellation of the phase control and the geometric phase combining. The non-linear elements combine the same in any given main-lobe direction. In actuality, phased array panels are rarely ideal, and as a beam is steered, undesirable coupling between antenna elements causes the effective load impedance of each antenna element to vary. As the load impedance of antenna elements vary, so varies the nonlinearity of associated PAs. Hence, the single pre-distortion function applied by a DPD actuator is no longer effective to compensate for the overall nonlinearity of the panel over time. DPD compensation disclosed herein is configured to update the pre-distortion actuator 402 over time as the beam is steered or other changes occur via use of a repeated, over-the-air adaptation technique.

The output of LPF 434 can include the input to a modem or SoC 436. Modem or SoC 436 can include one or more IC chip, circuitry, and/or electronic components. Modem or SoC 436 includes, without limitation, a DPD sample capture buffer 438, an upsampler 440, a sample selector 442, and a data encoder 444. The output of LPF 434 can include the input to DPD sample capture buffer 438. The output of DPD sample capture buffer 438 can include the input to the upsampler 440. The output of up sampler 440 can include the input to sample selector 442. The output of sample selector 442 can include the input to data encoder 444. The output of data encoder 444 can include the input to a feedback data link transmitter 446. The feedback link transmitter 446 transmits via an antenna 445 the feedback to the feedback data link receiver 416, which receives the feedback via its antenna 415. The receiver system 430 is also referred to as a receiver or receiver side.

The DPD sample capture buffer 438, the upsampler 440, the sample selector 442, the data encoder 444, and the feedback data link transmitter 446 can be characterized as an observation receiver 406. Observation receiver 406 is similar to observation receiver 306 of FIG. 3. Observation receiver 406 can be configured to generate a feedback signal including statistics about the received signal suitable for use in determining updates to the pre-distortion actuator 402. Feedback data link transmitter 446 is electrically coupled with an antenna 445 in order to transmit the feedback signal for transmission to the receiving antenna 415 of the transmitter system 410. The various signal processing components described above are each optional in terms of a specific embodiment. In other words, defining an example embodiment of the receiver system 430 or the observational receiver 406 can include any one or more of the described components in that they are not all required as a group to perform a set of desired functions.

The antenna 415 and feedback data link receiver 416, both included in the transmitter system 410, are configured to receive the feedback signal. The received feedback signal is provided to a data decoder 426 for processing then to a fine time/frequency offset corrector 424. The output of fine time/frequency offset corrector 424 can include the input to the adaptation engine 408.

To eliminate the need for local feedback receivers and to capture the far-field response of the phased array panel 414, the existing receiver system 430 at the other end of a communications link (e.g., the receiver system that is used for normal communications) is used to capture the feedback data about the PA 427 output. Feedback data link receiver 416 and associated antenna 415 need not be dedicated components to receive feedback signals. Feedback data link receiver 416 and associated antenna 415 may include part of a receiver subsystem included in a device used for normal bi-directional communication links. Similarly, feedback data link transmitter 446 and associated antenna 445 need not be dedicated components to transmit feedback signals and may instead include components included in a device used for normal transmission capabilities. In this sense, both the transmitter and receiver systems 410 and 430 may be referred to as transceiver systems or transceivers.

In an embodiment, phased array panel 414 (also referred to as a phased antenna array) can be replaced with a parabolic antenna electrically coupled to one or more PAs 427. System 400 operating in the Ka-band may use a parabolic antenna instead of phased antenna array 414. In another embodiment, the antenna configuration may be associated with an individual PA. In either case, the DPD compensation schemes described herein are applicable for applying DPD compensation to correct for nonlinearities and/or other undesirable signal characteristics associated with a parabolic antenna, an antenna configuration using an individual PA, for systems operating in the Ka-band, for systems operating in the Ku-band, and/or the like.

Figure 5:
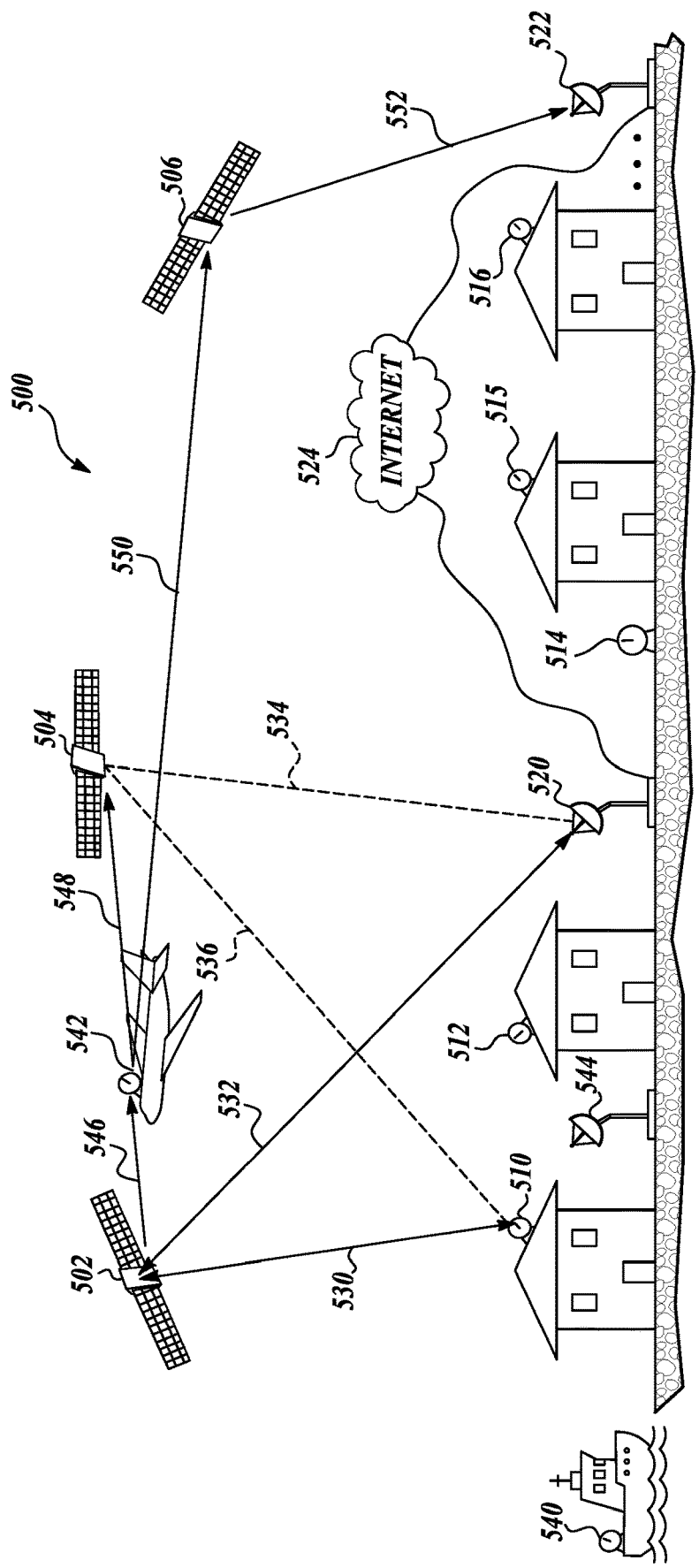
FIG. 5 illustrates a diagram showing a satellite-based communications system in accordance with various aspects of the present disclosure.

FIG. 5 illustrates a diagram showing a satellite-based communications system 500 in accordance with various aspects of the present disclosure. The satellite-based communications system 500 includes a plurality of satellites orbiting Earth in, for example, without limitation, a non-geostationary orbit (NGO) constellation or a low earth orbit (LEO) constellation. At least three of the plurality of satellites (e.g., satellites 502, 504, and 506) are shown in FIG. 5 for illustrative purposes. The satellite-based communications system 500 further includes ground or Earth based equipment configured to communicate with the plurality of satellites, such equipment including a plurality of user equipment and a plurality of gateways. User equipment 510, 512, 514, 515 and 516 of the plurality of user equipment are shown in FIG. 5. Gateways 520, 522 of the plurality of gateways are also shown in FIG. 5. Each of the satellites, user equipment, and gateways within the system 500 is also referred to as a node, system node, communication node, and/or the like.

Each user equipment of the plurality of user equipment is associated with a particular user. User equipment is configured to serve as a conduit between the particular user's device(s) and a satellite of the plurality of satellites (502, 504, and 506) which is in communication range of the user equipment, such that the particular user's device(s) can have access to a network 524 such as the Internet. Each user equipment is particularly positioned in proximity to the associated user's device(s). For example, user equipment 510, 512, 515 and 516 are located on the respective users' building roof and user equipment 514 is located on a yard of the user's building. A variety of other locations are also contemplated for the user equipment. User equipment may also be referred to as user terminals, end use terminals, end terminals, user ground equipment, and/or the like.

At any given time, a particular satellite can be in communication with a given user equipment (e.g., 510) to facilitate a link to the network 524. For instance, a user device in proximity to user equipment 510 (e.g., and connected together via a WiFi connection) can access the network 524 (e.g., request a web page) as follows. User equipment 510 can establish a communication link 530 to the satellite 502 and transmit the data request. Satellite 502, in response, establishes a communication link 532 with an accessible gateway 520 to relay the data request. The gateway 520 has wired (or wireless) connections to the network 524. The data associated with rendering the requested web page is returned in the reverse path, from the gateway 520, via the communication link 532 to the satellite 502 and via the communication link 530 to the user equipment 510, and to the originating user device (not shown). If satellite 502 moves out of position relative to user equipment 510 before the requested data can be provided to user equipment 510 (or otherwise becomes unavailable), then gateway 520 establishes a communication pathway 534, 536 with a different satellite, such as satellite 504, to provide the requested data. The gateways 520, 522 may also be referred to as Earth-based network nodes, Earth-based communication nodes, and/or the like.

In some embodiments, the network 500 can include repeaters that can enable communication where it might otherwise not be possible. A repeater 540, 542, 544 can be configured to relay communications to and/or from a satellite that is a different satellite from the one that directly communicates with a user equipment 510 or gateway 520. A repeater 540, 542, 544 can be configured to be part of the communication pathway between the user equipment 510 and the gateway 520. A repeater 540, 542, 544 may be accessed in cases where a satellite 502 does not have access to a gateway (e.g., gateway 522), and thus has to send its communication 546 via the repeater 560 to another satellite 506 that has access to the gateway 522. In this example as shown in FIG. 5, satellite 506 can use a communicate channel 552 to communicate with the gateway 522. Communication 548 can represent a repeated signal 546 from satellite 502 through the repeater 542 (on a plane) to satellite 504. Repeaters can be located terrestrially 544, on water 540 (e.g., on ships or buoys), in airspace below satellite altitudes (e.g., on an airplane 542 or balloon), and/or other air or Earth-based locations.

In some embodiments, transmitter and/or receiver systems 410, 430 are included in each user equipment, satellite, and gateway of system 500. Accordingly, accurate DPD compensation can occur for each communication link within system 500.

Figure 6:
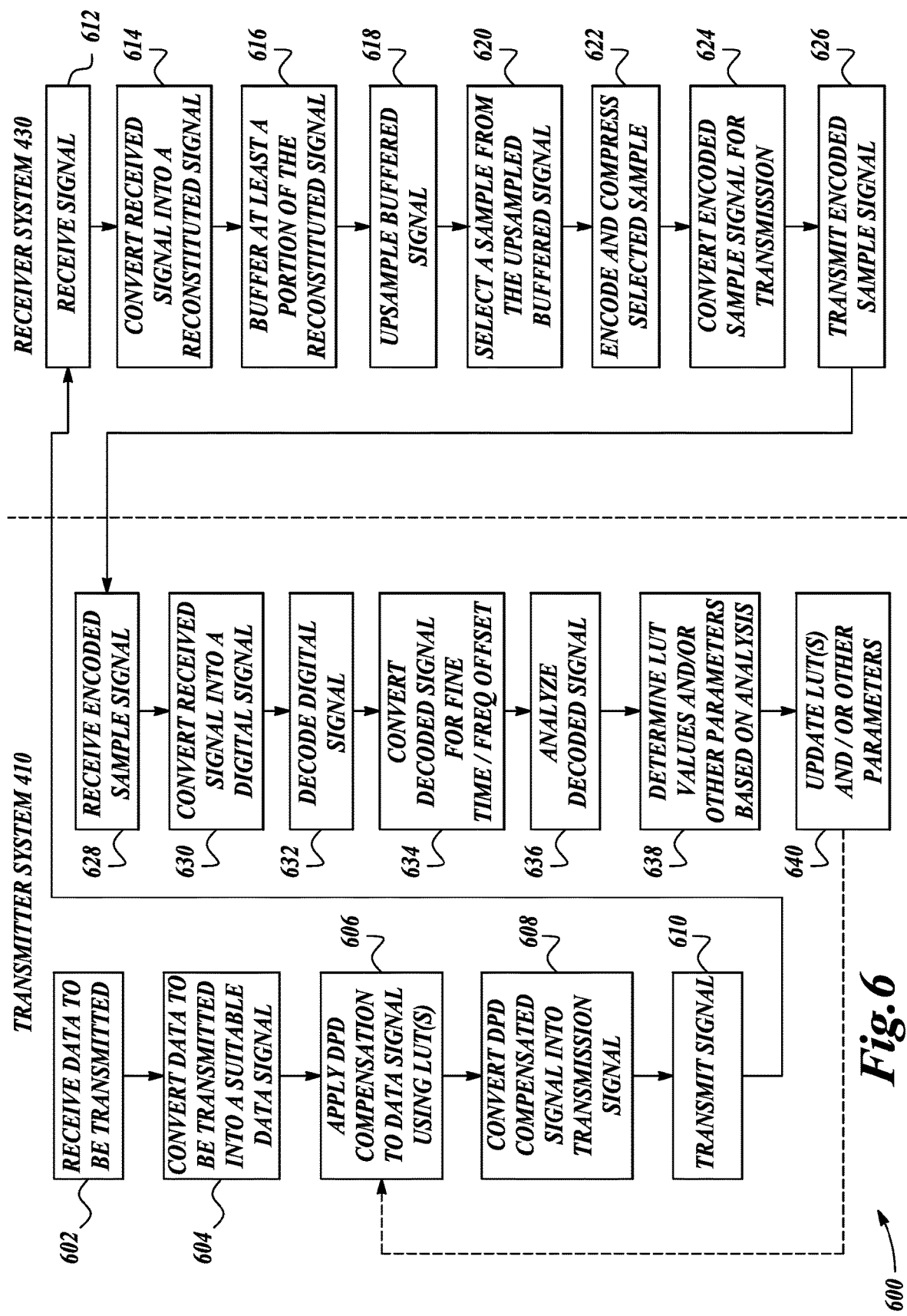
FIG. 6 illustrates a flow diagram showing a process for performing DPD compensation in accordance with various aspects of the present disclosure.

FIG. 6 illustrates a flow diagram showing a process 600 for performing DPD compensation in accordance with various aspects of the present disclosure. Any one or more of the processes shown in FIG. 6 can be implemented in any order. Process 600 will be described in connection with FIG. 4. At a block 602, transmitter system 410 included in a first device is configured to receive data to be transmitted to a second device. Data to be transmitted can include a data request, fulfillment of a previous data request, a synchronization signal, an acknowledgement signal, a handshake protocol signal, and/or the like. Next, at a block 604, a modulator included in the transmitter system 410, such as modulator 418, is configured to convert the data to be transmitted into a data signal suitable to be converted into a transmission signal.

Prior to processing by the plurality of PAs 427, pre-distortion actuator 402 is configured to apply DPD compensation to the data signal, at a block 606. Pre-distortion actuator 402 can, in one example, use the data maintained in LUT(s) 422 to perform DPD compensation, as will be described in detail below. The resulting digital signal with applied DPD compensation is processed by transmitter system 410 to generate a suitable transmission signal, at a block 608. Processing performed included, without limitation, beamforming, phase shifting, up conversion, amplification, filtering, conversion into an analog signal, placing data on a carrier frequency, and/or the like. At a block 610, the transmission signal is emitted by the plurality of antenna elements 428 of panel 414.

At a block 612, the receiver system 430 is oriented so as to receive the signal transmitted at block 610. Next, at a block 614, front end component 432 (and associated components) can be configured to reconstitute the transmitted data using the received signal (e.g., remove carrier frequency, filter, amplify, convert to a digital signal, down sample, etc.).

In some embodiments, at a block 616, DPD sample capture buffer 438 is configured to obtain and store at least a portion of the reconstituted signal generated at block 614. A sample of the reconstituted signal can be captured for a short time period, such sample referred to as a DPD sample, and stored in a buffer. A sample may be captured periodically, automatically, manually, on demand, based on a trigger condition, and/or any other repeated basis sufficient for performance of the pre-distortion actuator 402 to be within a pre-set range.

The buffered signal is upsampled at a block 618. Block 618 may also include one or more other pre-processing functions performed on the buffer signal. Next, at a block 620, sample selector 442 is configured to select a subset or sample from the upsampled buffered signal. The selected subset or sample can include the feedback data about the PAs 427 output signal characteristics. Such selected sample is encoded and compressed by data encoder 444, at a block 622, and converted for transmission (e.g., placed on a carrier frequency) by feedback data link transmitter 446, at a block 624. At a block 626, the encoded sample signal is transmitted to the transmitter system 410. The encoded sample signal is to be used by the adaptation engine 408 to update the LUT(s) 422, as necessary.

The encoded sample signal is received by the feedback data link receiver 416 of the transmitter system 410, at a block 628. At a block 630, the received signal is converted into a digital signal and reconstituted so that the feedback data is recovered. The digital signal undergoes decoding and decompression by the data decoder 426, at a block 632, and correction of fine time/frequency offset by the fine time/frequency offset corrector 424, at a block 634.

Next at a block 636, the adaptation engine 408 is configured to analyze the decoded signal which can include the feedback data from the receiver system 430, as will be described in detail below. Based on the analysis, adaptation engine 408 is configured to determine one or more LUT values and/or other parameters associated with the pre-distortion actuator 402, at a block 638. The determined LUT values and/or parameter values from block 638 are used to update/populate LUT(s) 422 coefficients and parameters of pre-distortion actuator 402, at a block 640. Pre-distortion actuator 402 is configured based on the latest LUT(s) 422 parameters and coefficients of the DPD module 420.

Pre-distortion actuator 402 applies DPD compensation, based on the latest LUT values in LUT 422, to data signals to be provided to the plurality of PAs 427, at block 606. Process 600 is repeated in accordance with data to be transmitted. Where a different approach other than a lookup table is used, the appropriate coefficients or parameters are updated according to the compensation model as represented in block 640.

In one aspect, the pre-distortion compensation process is simplified by treating the entire phased array panel 414 as a single nonlinear system and applying a single composite inverse function. This is in contrast to determining and applying a compensation separately for each respective individual PA 427. The full distortion of the panel 414—including the nonlinearities of various PAs 427, antenna elements 428 couplings, and antenna elements 428 gain variations—can be compensated using the single pre-distortion actuator 402. In some embodiments, the single composite inverse function applied by the single pre-distortion actuator 402 is configured to also compensate for distortions in the rest of nonlinear system 404, such as noise in receiver RF front end 432.

After pre-distortion application, transmissions are linear from the perspective of a receiver situated in the primary beam direction of the phased array transmission (e.g., the beam main lobe). Since the main lobe linearity dictates communication link quality and overall panel transmission efficiency, the DPD compensation scheme disclosed herein achieves the desired linearity in the received beam. Updates to the pre-distortion actuator 402 (e.g., periodically, continuous, on-demand basis, etc.) also compensate for nonlinearity associated with beam steering.

DPD compensation is dynamic and adaptive to changes in nonlinear system 404 over time. The feedback, determination of updated LUT values (or updated parameters using a different process than the lookup table), and other related functions to perform DPD compensation occurs on an on-going basis without impacting normal use resources.

In order to eliminate the need for local feedback receivers and to capture the far-field response of panel 414, the existing receiver(s) included in the other end of the communications link (e.g., the existing receivers in receiver system 430) are used to capture the PAs 427 outputs. Such receiver(s) collect short periods of PAs 427 output signal statistics and periodically sends them back to the transmitter system 410 via a wireless data channel or a wired channel. Pre-distortion actuator 402 can then update the whole-panel DPD actuator function.

In some embodiments, DPD module 420 of pre-distortion actuator 402 can include a behavioral model configured to predict the input-output relationship of a nonlinear system without directly modeling physical device operation. Behavioral models are useful for modeling RF systems in that they lump the entire transmit chain (e.g., mixers, amplifier, antennas) into a simpler baseband-equivalent model composed of mathematical functions (e.g., polynomials). This model captures the RF system's behavior in a discrete-time basis over a narrow operating signal bandwidth of interest, independent of the carrier frequency—which greatly reduces the sample rate and complexity for processing the model. In practice, the behavioral model (also referred to as a baseband model, baseband-equivalent model, and/or the like) is operated at a sample rate of about five times (5×) the occupied bandwidth to encompass adjacent bands affected by distortion and to minimize non-physical aliasing. A sampling rate of approximately 5× is still orders-of-magnitude less than the RF carrier frequency rate. Because behavioral models are independent of the PA physics, DPD module 420 can be configured to model a whole phased array (e.g., phased array panel 414).

A factor in a model's complexity can be the extent of its memory effects. When a PA operates over a bandwidth that is greater than 1% of its carrier frequency, the PA (e.g., PA 427) tends to exhibit short-term memory effects due to a non-uniform frequency response over the operating frequency band. The non-uniform frequency response can be attributed to one or more sources such as, but not limited to, the biasing network, decoupling capacitors, transistor drain, supply inductance, and/or the like. In effect, a given output of a PA depends not only on the current input, but also on recent past input values (e.g., a finite impulse response (FIR) filter model). These memory effects can usually be well-approximated with only a few memory taps in a baseband model as long as the PA frequency response is locally smooth over the operating bandwidth.

For phased arrays operating at higher RF frequencies (e.g., Ku, Ka, and/or V band) relative to their bandwidth, the PAs within such phased arrays have relatively flat frequency response within their operating band compared with sub-6 GigaHertz (GHz) PAs. In addition, Class A/AB PAs used at these higher frequencies have less memory effects than more complex PAs, such as Doherty PAs. High RF-frequency phased arrays can be modeled using significantly fewer memory terms in the baseband-equivalent model than in other types of communications systems, such as cellular systems. When aggregating many PAs in a phased array, some memory effects can be present due to the different delays in routing to each antenna element. Nevertheless, phased arrays can be configured to be well delay-matched for beamforming—generally within 1 baseband sample. Thus, a small number of baseband delay taps included in the model is sufficient to model possible PA memory effects.

In some embodiments, DPD module 420 can include a baseband-equivalent behavioral phased-array model that is a generalized memory functions (GMF) model. This model takes the following form, where $x_n$ are complex-valued I/Q input samples, $y_n$ are complex-valued I/Q output samples, and functions $\{f_A, f_B, f_C\}$ are R→C.

$$y_n = x_n \cdot f_A(|x_n|) + x_{n-1} \cdot f_B(|x_n|) + x_n \cdot f_C(|x_{n-1}|) \quad \text{Eq. (1)}$$

In this model, the model parameters include functions $\{f_A, f_B, f_C\}$, which can be defined by the lookup table values in LUT 422. Lookup table values in LUT 422 can be learned via stochastic-gradient descent (also known as least means squares (LMS) algorithm), least-squares, or other techniques as described in detail below. The GMF model can include a derivative of generalized memory polynomials (GMP), in which polynomial-only functions are replaced with functions defined via lookup table(s).

There are three LUT-based functions defined in LUT 422, one for each of functions $\{f_A, f_B, f_C\}$. Each of the three LUT functions are non-uniformly companded to reduce the number of parameters to learn and to significantly reduce DPD actuator implementation area on the printed circuit board (PCB) and/or integrated circuit (IC) chip. In signal processing, companding is a method of mitigating the detrimental effects of a limited representation (the quantization associated with a limited number of lookup-table elements). The name is a combination of the words "compressing" and "expanding," which are the functions of a compander at the encoding and decoding end respectively. The companding function is configured to be near-optimal in the minimum-mean-square-error sense for Rayleigh-distributed orthogonal frequency division multiplexing (OFDM) waveform amplitudes. The GMF model form is such that companding approximation-error is multiplied by the input signal, so that the resulting output error is always relative to the carrier—effectively bounding the impact on adjacent channel leakage ratio (ACLR) degradation. The model input and output sample rates and DPD actuator block are configured to be at least 3-5× oversampled with respect to the occupied signal bandwidth, but LUT parameter learning (model adaptation) can be performed at a reduced sample rate, with a receiver bandwidth operating at or below the occupied signal bandwidth.

Figure 7A:
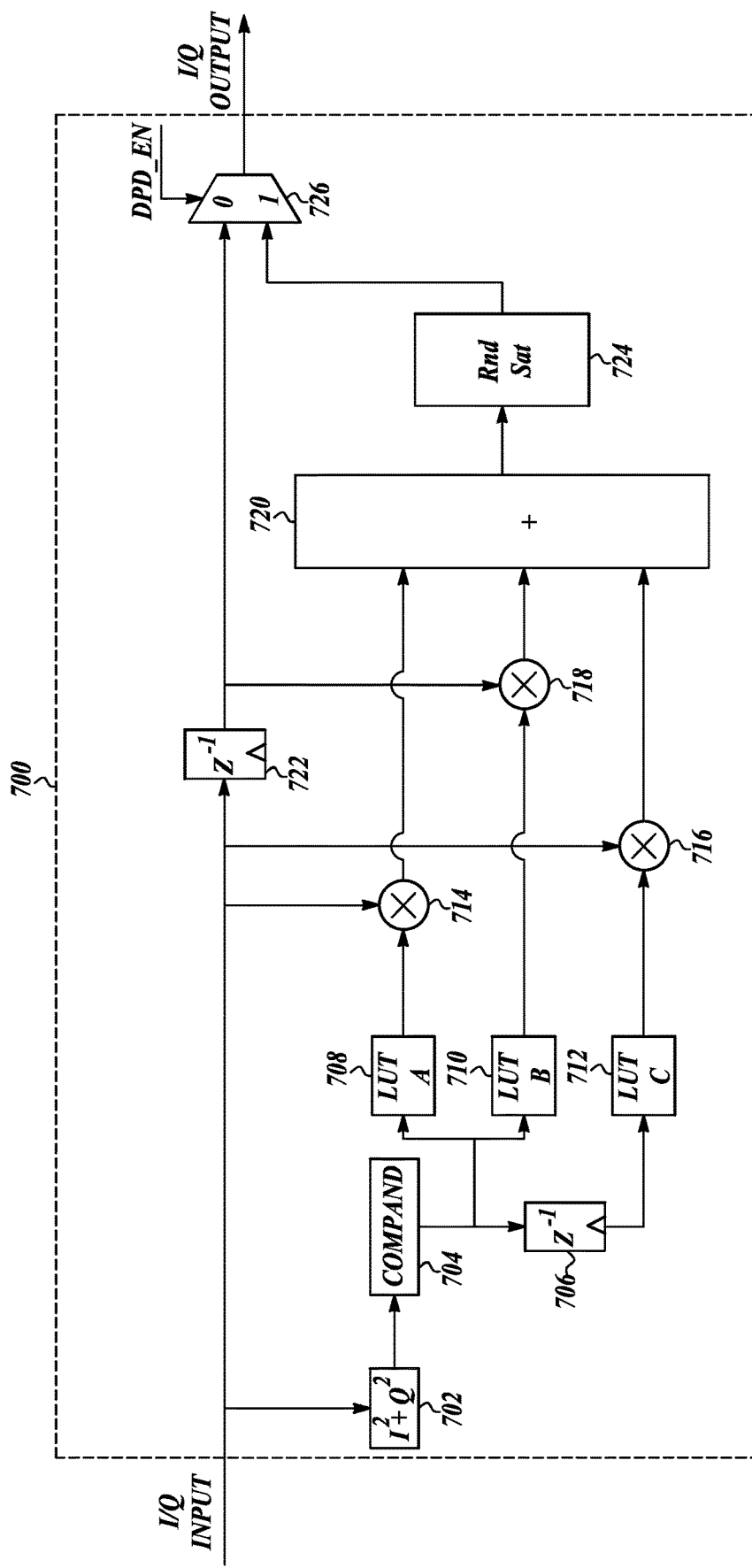
FIG. 7A illustrates a block diagram showing a pre-distortion actuator configured to apply DPD compensation in accordance with various aspects of the present disclosure.

FIG. 7A illustrates a block diagram showing a pre-distortion actuator 700 configured to apply DPD compensation in accordance with various aspects of the present disclosure. Pre-distortion actuator 700 is implemented using a GMF model as discussed above. Pre-distortion actuator 700 can include an example of pre-distortion actuator 402.

Pre-distortion actuator 700 receives complex-valued I/Q input samples, in which I and Q are real and imaginary components, respectively, of the complex-value baseband signal (provided by, for example, modulator 418). The I/Q input samples traverse two paths, one toward preprocessor 702 and the other toward a delay tap 722. Preprocessor 702 is configured to prepare the I/Q input samples for companding in compander 704. In some embodiments, preprocessor 702 is configured to sum the square of each of the I and Q components and provide the result to compander 704.

After companding, compander 704 outputs the companded sample to each of a delay tap 706, a LUT A 708, and a LUT B 710. Delay tap 706 is configured to "delay" providing an input sample to a LUT C 712 by a certain time amount, in effect causing a previous input sample (e.g., $x_{n-1}$) to be provided to LUT C 712 relative to the current input samples (e.g., $x_n$) provided to LUT A 708 and LUT B 710. Delay tap 722 is similar to delay tap 706. Delay taps 706 and 722 include elements of the model included to at least partially take into account the PA memory effects discussed above.

Figure 8:
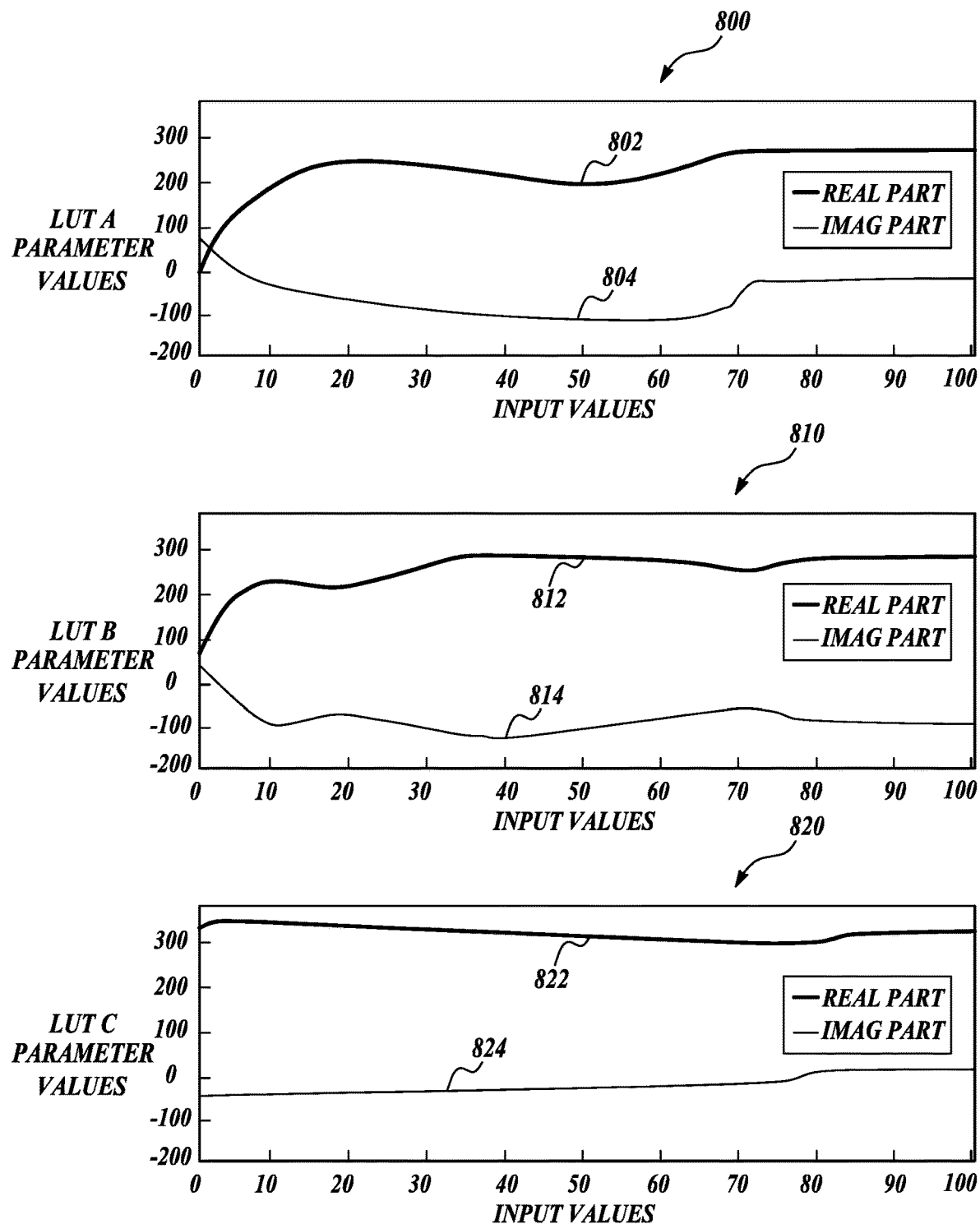
FIG. 8 illustrates example lookup table (LUT) function values for a Ku-band phased array in accordance with various aspects of the present disclosure.

LUTs 708, 710, 712 can be similar to LUT 422. LUTs 708, 710, 712 can contain values that define respective functions $\{f_A, f_B, f_C\}$ of Equation (1). FIG. 8 illustrates example LUT function values for a Ku-band phased array in accordance with various aspects of the present disclosure. The LUT function values are shown in graphical form in FIG. 8; the values can be maintained in any of a variety of formats such as in tabular format, related data format, and/or the like. LUT A function values versus input values are shown in graph 800. Plot 802 shows function values corresponding to the I component of the input values (the real part of the complex-valued I/Q inputs), and plot 804 shows function values corresponding to the Q component of the input values (the imaginary part of the complex-valued I/Q inputs). LUT B function values versus input values are shown in graph 810. Plot 812 shows function values corresponding to the I component of the input values (the real part of the complex-valued I/Q inputs), and plot 814 shows function values corresponding to the Q component of the input values (the imaginary part of the complex-valued I/Q inputs). LUT C function values versus input values are shown in graph 820. Plot 822 shows function values corresponding to the I component of the input values (the real part of the complex-valued I/Q inputs), and plot 824 shows function values corresponding to the Q component of the input values (the imaginary part of the complex-valued I/Q inputs).

With reference back to FIG. 7A, in each of LUTs 708, 710, 712, particular LUT function or parameters values for each of the real and imaginary components is identified based on the received sample. The identified LUT A function real and imaginary component values are based on the current input sample, and include the output of LUT A 708. Such output is multiplied with the current input sample by a multiplier or mixer 714. LUT A 708 is used to apply the LUT A function values that map to the current input sample—the current input-based LUT A function values—to the current input sample. The output of multiplier 714 can include an input to adder or summation element 720.

The identified LUT B function real and imaginary component values are based on the current input sample, and include the output of LUT B 710. Such output is multiplied with the previous input sample by a multiplier 718. A previous input sample is outputted by delay tap 722. LUT B 710 is used to apply the LUT B function values that map to the current input sample—the current input-based LUT B function values—to the previous input sample. The output of multiplier 718 also can include an input to adder 720.

The identified LUT C function real and imaginary component values are based on the previous input sample, and include the output of LUT C 712. Such output is multiplied with the current input sample by a multiplier 716. LUT C 712 is used to apply the LUT C function values that map to the previous input sample—the previous input-based LUT C function values—to the current input sample. The output of multiplier 716 also can include an input to adder 720.

All combinations of the input sample and LUT function values associated with the current and previous time points are taken into account in the inputs to multipliers 714, 716, and 718, and by extension, the current output sample (e.g., $y_n$). The outputs of multipliers 714, 715, and 718 include the inputs to an adder or summation element 720. The summed signal outputted by adder 720 is processed by a rounding and saturation element 724, which performs rounding and saturation separately on the I and Q components to generate the current output sample (the complex-valued I/Q output).

A multiplexer 726 is configured to receive as inputs the previous input sample via delay tap 722 and the current output sample from rounding and saturation element 724. DPD compensation can be selectively enabled or disabled (via signal DPD_EN) in transmitter system 410 based on a state signal provided to multiplexer 726. If multiplexer 726 includes a 2:1 multiplexer, a "0" state signal can correspond to DPD compensation being disabled or turned off. In this state, the current output sample can include the previous input sample. A "1" state signal can correspond to DPD compensation being enabled or turned on. In the enabled state, the current output sample can include the output of rounding and saturation element 724. Alternatively, multiplexer 726 can be configured in reverse as long as the input lines are appropriately arranged. The I/Q output of multiplexer 726 is the output of pre-distortion actuator 700.

Figure 7B:
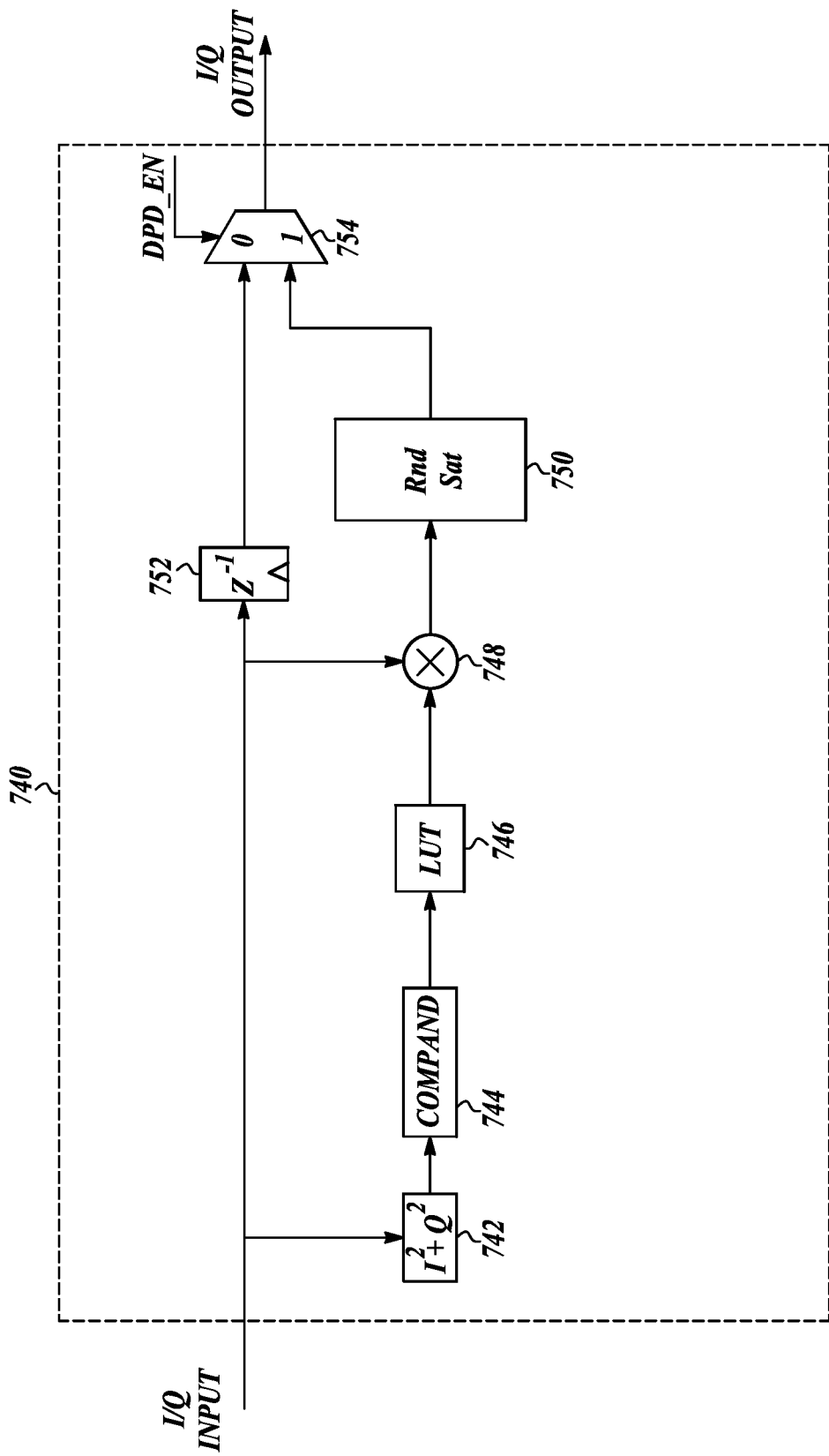
FIG. 7B illustrates a block diagram showing a pre-distortion actuator configured to apply DPD compensation in accordance with various aspects of the present disclosure.

FIG. 7B illustrates a block diagram showing a pre-distortion actuator 740 configured to apply DPD compensation in accordance with various aspects of the present disclosure. Pre-distortion actuator 740 is implemented using a GMF model as discussed above. Pre-distortion actuator 740 can include an example of pre-distortion actuator 402.

Pre-distortion actuator 740 is configured to use a single LUT 746 instead of a plurality of LUTs as implemented in the pre-distortion actuator 700 shown in FIG. 7A. Pre-distortion actuator 740 may be considered to be a simpler version of pre-distortion actuator 700. The DPD compensation path of pre-distortion actuator 740 is similar to the DPD compensation path including LUT A 708 in FIG. 7A. The DPD compensation path of pre-distortion actuator 740 includes a preprocessor 742, a compander 744, a LUT 746, a multiplier or mixer 748, and a rounding and saturation element 750. Pre-distortion actuator 740 also includes a delay tap 752 and a multiplexer 754.

Preprocessor 742, compander 744, LUT 746, multiplier 748, rounding and saturation element 750, delay tap 752, and multiplexer 754 are similar to respective preprocessor 702, compander 704, LUT A 708, multiplier 714, rounding and saturation element 724, delay tap 722, and multiplexer 726.

The current input sample is received by each of preprocessor 742 and delay tap 752. The output of preprocessor 742 can include the input to compander 744. The companded sample is provided to LUT 746. The companded sample values are used to identify or look up the particular LUT function values for each of the real and imaginary components from those stored in LUT 746. The identified LUT function values are multiplied or mixed with the current input sample in multiplier 748. The output of multiplier 748 can include a rough version of the current output sample including DPD compensation to yield a rough version output.

The rough version output undergoes rounding and saturation performed by rounding and saturation element 750 and is then provided as an input to multiplexer 754. The other input to multiplexer 754 is the previous input sample provided by delay tap 752. If multiplexer 754 is disabled (DPD compensation is disabled, turned off, or in the "0" state), then the output of multiplexer 754 is the previous input sample. If multiplexer 754 is enabled (DPD compensation is enabled, turned on, or in the "1" state), then the output of multiplexer 754 is the output of rounding and saturation element 750. Alternatively, multiplexer 754 can be configured in reverse as long as the input lines are appropriately arranged. The output of multiplexer 754 is the output of pre-distortion actuator 740.

Pre-distortion actuators 402, 700, and 740 include circuitry and/or electrical components electrically coupled to each other by electrical conductive traces to define a GMF-based model as described herein. In some embodiments, LUTs 422, 708, 710, 712, and/or 746 may be located external to respective pre-distortion actuators 402, 700, and 740, such as in a memory of the modem or SoC 412. In an embodiment, pre-distortion actuators 402, 700, and/or 740 may be implemented as one or more machine-readable instructions that are executable by a processor included in the modem or SoC 412 so as to perform the functions described herein.

In some embodiments, different types of pre-distortion actuators can be implemented among various equipment included in a wireless communications system. For instance, in the satellite-based communications system 500 of FIG. 5, pre-distortion actuator 700 can be implemented in the transmitters of the plurality of satellites and the plurality of user equipment and pre-distortion actuator 740 can be implemented in the transmitters of the plurality of gateways.

It is contemplated that pre-distortion actuators 700 and 740 can include alternative models to the GMF model. For example, alternative baseband-equivalent behavioral PA models include, without limitation, neural network, nonlinear autoregressive exogenous model (NARX), piecewise linear, Volterra models, memory polynomials, vector-switched memory polynomials, generalized memory polynomials, Parallel-Hammerstein, Wiener-Hammerstein, and/or the like.

Pre-distortion actuator 402 is adaptive over time to reflect dynamic changes in the PA nonlinearity, noise, and/or other undesirable signal characteristics via the adaptation engine 408. The techniques employed associated with the adaptation engine 408 robustly overcomes certain technical challenges such as, but not limited to, aligning transmitted and received signals in the adaptation engine, reduced receiver signal-to-noise ratio (SNR), limited measurement sample rate and bandwidth in the receiver, interference from signals in adjacent channels also detected by the receiver, the effects of wireless channel, Doppler and local oscillator (LO) offset, and potential limited feedback data rate. Adaptation engine 408 is able to take into account such technical challenges and dynamically adapt the pre-distortion actuator 402 to provide accurate compensation without negatively impacting normal operations (e.g., without using normal operation resources).

Adaptation engine 408 is configured to update the coefficients, parameters, and/or LUT(s) of the pre-distortion actuator 402 in order to effectively pre-distort nonlinearity attributed to nonlinear system 404, even in the presence of varying time, temperature, and/or other operating conditions. These updates or adaptations use measurements obtained over-the-air from a remote receiver (e.g., the receiver(s) included in receiver system 430).

Figure 9:
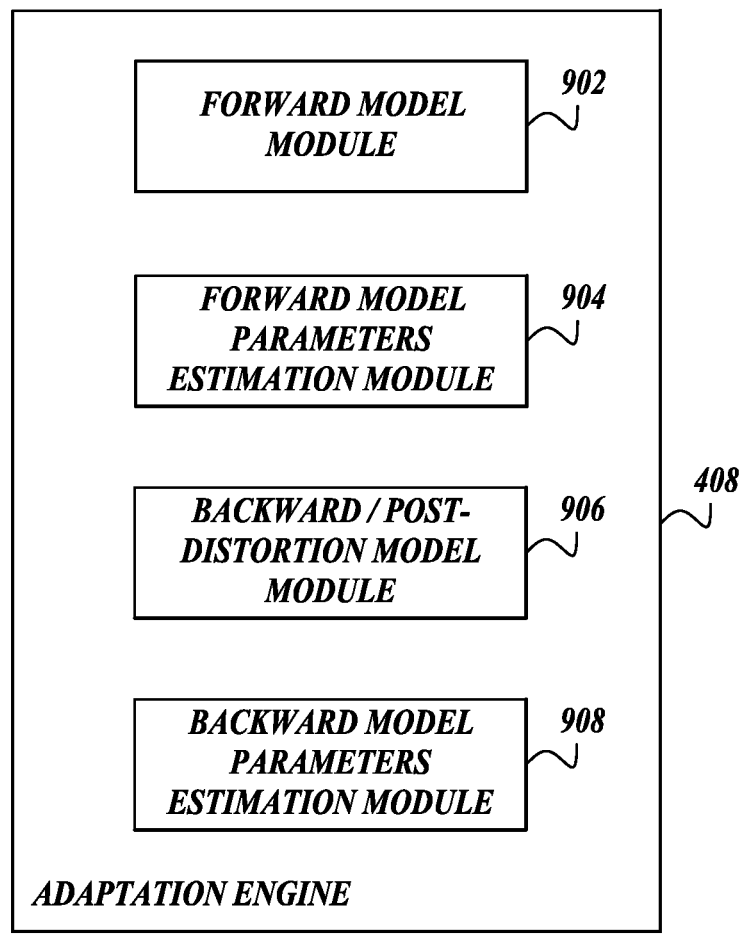
FIGS. 9-10 illustrate example block diagrams showing the adaptation engine configured to implement a learning technique in accordance with various aspects of the present disclosure.
Figure 10:
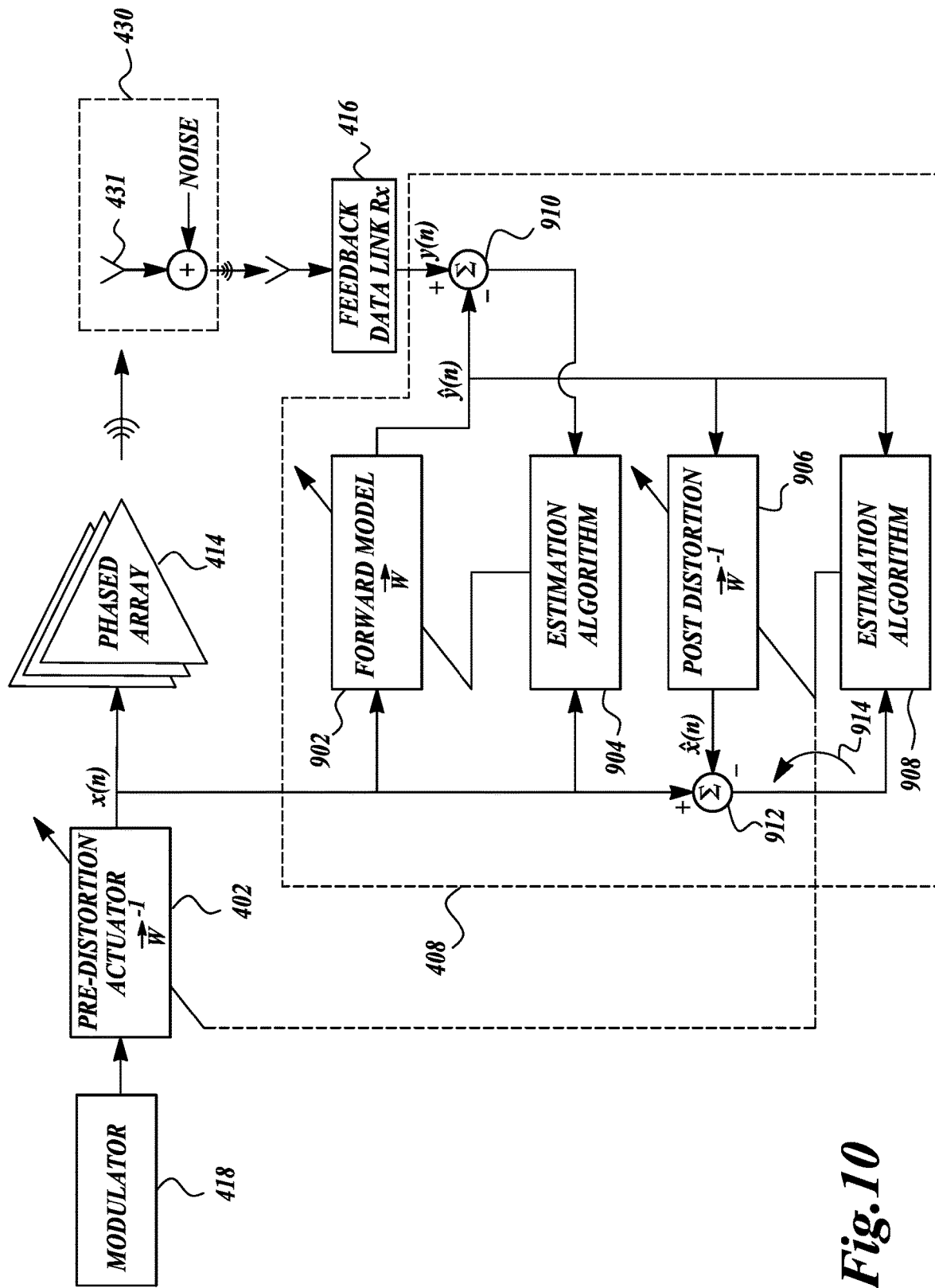

FIGS. 9-10 illustrate example block diagrams showing the adaptation engine 408 configured to implement a learning technique in accordance with various aspects of the present disclosure. FIG. 9 shows a forward model module 902, a forward model parameters estimation module 904, a backward/post-distortion model module 906 and a backward model parameters estimation module 908 as part of the adaptation engine 408. Modules 902-908 may also be referred to as logic, instructions, algorithms, computer-readable instructions, and/or the like. FIG. 10 illustrates these modules in the adaptation engine 408 in the context of other components of the system with associated inputs, outputs, and relationships conceptually illustrated. The learning technique illustrated in FIGS. 9-10 can include a combined direct and indirect learning technique.

Two classes of algorithms or techniques can be used to train or update a DPD model of DPD module 420—direct learning and indirect learning. Direct learning can include finding the parameters of a "forward" model 904 of the physical nonlinear system (e.g., phased array 414) to minimize the error in its prediction from the actual measured output sample values. The model of the PA is then analytically or numerically inverted, with the inverted PA model used as the pre-distorter. Indirect learning involves building a model of a post-distorter or "backward model" 906 of the nonlinear system that tries to predict the input sample values given the measured output samples. This post-distorter model is then used verbatim to pre-distort input samples passed into the PAs, because pre-distorters and post-distorters are equivalent for time-invariant systems. The system can use a combination of the direct and indirect learning techniques.

While indirect learning may be used to perform DPD compensation due to its simpler approach using the modeled nonlinear system verbatim for the pre-distorter parameters, the indirect learning-based model may not be accurate if significant additive noise is present in the nonlinear system output measurements. When the output receiver is on the other end of a satellite communications link, measurement noise can be very strong. The measurement noise can be comparable to the transmitted signal level and can be many times stronger (e.g., 30 decibel (dB)) than the nonlinear artifacts intended to be measured and corrected.

A combined direct and indirect learning technique that is optimized for satellite channels, as will be described in detail below, takes advantage of the noise-reduction properties of direct learning enhanced with prior model regularization, while still preserving the simplicity of indirect learning for solving the final pre-distorter parameters. This combined technique is applicable for systems having over-the-air measurements in which there is no local feedback receiver measuring the output of the nonlinear system (e.g., the absence of a receiver that is in wired communication with the adaptation engine 408 and which receives the DPD compensated transmission).

If the nonlinear system can include a phased array, it is not possible to take a direct measurement locally of the output because the transmit beam is only formed in the far-field. The receiver on the other end of the communication link (the remote receiver) is employed for adaptation feedback. Measurements made using a remote receiver can have certain undesirable characteristics: measurements may be made in the presence of strong measurement noise, both in-band and out-of-band; and the receive bandwidth may be narrower than the bandwidth over which correction may be needed. A receiver, such as included in a satellite, may not observe the adjacent channels because it is filtered by front-end circuitry, or the adjacent channels contain independent transmissions which would interfere with measurement. While the adjacent channels cannot be directly measured, pre-distortion actuator 402 is configured to correct for adjacent channel leakage to meet emissions requirements in those bands.

In some embodiments, the adaptation engine 408 can include hardware, firmware, circuitry, software, and/or combinations thereof to facilitate various aspects of the combined learning technique described herein.

Forward model module 902 is configured to be a behavioral model (e.g., a GMF-based model) of the physical nonlinear system (e.g., nonlinear system 404, phased array panel 414, phased array panel 414 and undesirable signal components introduced by receiver system 430, and/or the like) that uses actual input samples as the input to output respective predicted output samples that are noise-free. The forward model parameters estimation module 904 is configured to determine the parameters of the forward model. The parameters can include the values of the LUT(s) included in the forward model.

Backward or post-distorter model module 906 is configured to be a behavioral model (e.g., a GMF-based model) of the physical nonlinear system that uses the noise-free predicted output samples from the forward model as inputs to configure a final version of the backward model. Iterations, learning, or training of the backward model can include updating, adjusting, or "tweaking" the backward model so as to minimize the difference (or error) between the predicted input samples outputted by the backward model and the actual input samples (the inputs to the forward model). The resulting trained backward model can include the model implemented in the pre-distortion actuator 402. The backward model parameters module 908 is configured to determine the parameters of the backward model. The parameters can include the values of the LUT(s) included in the backward model.

In some embodiments, one or more of modules 902-908 (or a portion thereof) can include one or more instructions embodied within a tangible or non-transitory machine (e.g., computer) readable storage medium, which when executed by a machine causes the machine to perform the operations described herein. Modules 902-908 (or a portion thereof) may be stored local or remote from adaptation engine 408. One or more processors included in adaptation engine 408 can be configured to execute modules 902-908 (or a portion thereof). In alternative embodiments, one or more of modules 902-908 (or a portion thereof) may be implemented as firmware or hardware such as, but not limited to, an application specific integrated circuit (ASIC), programmable array logic (PAL), field programmable gate array (FPGA), and/or the like included in the adaptation engine 408. In other embodiments, one or more of modules 902-908 (or a portion thereof) may be implemented as software while other of the modules 902-908 (or a portion thereof) may be implemented as firmware and/or hardware.

Figure 11:
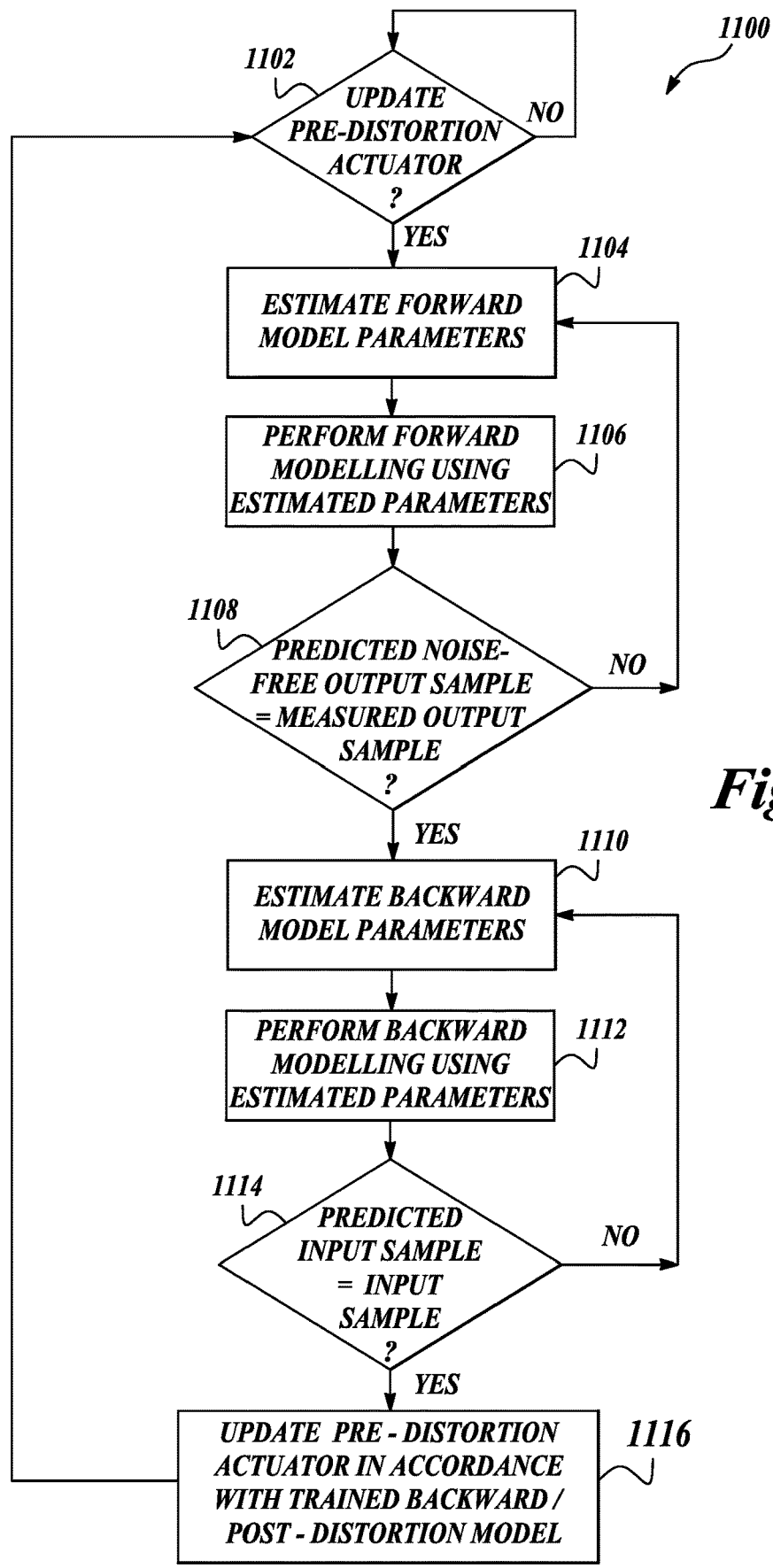
FIG. 11 illustrates a flow diagram showing a process to generate the pre-distortion actuator using the combined direct and indirect learning technique in accordance with various aspects of the present disclosure.

FIG. 11 illustrates a flow diagram showing a process 1100 to generate the pre-distortion actuator 402 using the combined direct and indirect learning technique in accordance with various aspects of the present disclosure. At a block 1102, adaptation engine 408 is configured to determine whether pre-distortion actuator 402 is to be updated. An update can be triggered based on expiration of a pre-set time period, system set for continuous updates, response to a manual command, signal quality being below a threshold, during beam steering, satellite handoff, system start, system reset, temperature shift, and/or the like. If no update is to be performed at this time (no branch of block 1102), then adaptation engine 408 is configured to check until an update is triggered. If an update is to be performed (yes branch of block 1102), then process 1100 proceeds to block 1104.

At a block 1104, the forward model parameters estimation module 904 is configured to estimate the forward model parameters to generate the current forward model. In some embodiments, the forward model configured by the forward model module 902 can include a GMF-based model similar to that described above in connection with FIGS. 7A-7B, and the forward model parameters include the values of the LUTs used in the forward model. Forward model parameters estimation module 904 is also referred to as an estimation module, estimation algorithm module, and/or the like.

The inputs to module 904 can include both an actual input sample x(n) and the actual measured output sample y(n), which is the actual input sample x(n) that has been received by and returned from receiver system 430, as denoted in FIG. 9. Note that notations $x_n$ and x(n) are used interchangeably to refer to the actual input sample provided to phased array 414. Likewise, notations $y_n$ and y(n) are used interchangeably to refer to the actual measured output sample from the receiver system 430 corresponding to the transmitted actual input sample.

The actual input samples are noiseless (e.g., unbiased). The actual measured output samples can include undesirable signal components attributable to nonlinearity of PAs included in the phased array 414; Doppler effect, noise, interference, etc. during RF signal propagation over the air; noise and/or signal degradation introduced by the receiver system 430; and/or the like. In some embodiments, where the output receiver is on the other end of a satellite communications link, measurement noise can be significant. The measurement noise can be comparable to the transmitted signal level and can be many times stronger (e.g., 30 decibel (dB)) than the nonlinear artifacts intended to be measured and corrected.

Module 904 is configured to handle noise in the measured output samples by averaging sufficient numbers of measured output samples (over time) using a least-squares technique. Noise variance over time, uncorrelated noise, noise associated with interference both in-band and out-of-band, and/or the like are taken into account by module 904.

Next, at a block 1106, the forward model module 902 is configured to configure and perform forward modelling using the estimated parameters determined at block 1104. Actual input sample x(n) can include the input to the forward model and a predicted output sample ŷ(n) can include the output of the forward model. Because the input is noiseless, the predicted output sample is also noiseless or noise-free (unlike actual measured output samples y(n)).

In some embodiments, block 1104 can be performed simultaneously with block 1106, performed more frequently than block 1106, and/or performed less frequently than block 1106.

At a block 1108, the forward model module 902 facilitated by summation element 910 is configured to compare the predicted (noise-free) output sample ŷ(n) generated in block 1106 to the actual measured output sample y(n) received from receiver system 430. If the difference or error between these values is equal to zero or within some pre-set range of zero (e.g., within 5% of zero) (yes branch of block 1108), then the forward model is considered to be sufficiently trained and to be a learned forward model. Process 1100 proceeds to block 1110. Otherwise additional training of the forward model is required (no branch of block 1108), and process 1100 returns to block 1104 to generate an updated forward model using updated estimate parameters.

With the generation of a trained forward model, the direct learning is complete and adaptation engine 408 can proceed to the indirect learning portion of the combined technique. At a block 1110, backward model parameters estimation module 908 is configured to estimate the backward model parameters to generate the current backward model (also referred to as the post-distortion model). In some embodiments, the backward model configured by the backward model module 906 can include a GMF-based model similar to that described above in connection with FIGS. 7A-7B, and the backward model parameters can include the values of the LUTs used in the backward model. Backward model parameters estimation module 908 is also referred to as an estimation module, estimation algorithm module, and/or the like. The inputs to module 908 can include both the actual input sample x(n) and the predicted output sample ŷ(n) from the forward model module 902 after the forward model of forward model module 902 is deemed to be trained.

Next, at a block 1112, the backward model module 906 is configured to perform backward modelling using the estimated parameters determined at block 1110. The predicted output sample ŷ(n) can include the input to the backward model and a predicted input sample x̂(n) can include the output of the backward model, as illustrated in FIGS. 9-10.

In some embodiments, block 1110 can be performed simultaneously with block 1112, performed more frequently than block 1112, and/or performed less frequently than block 1112.

At a block 1114, backward model module 906 facilitated by summation element 912 is configured to compare the predicted input sample x̂(n) to input sample x(n). If the difference or error between these values is equal to zero or within some pre-set range of zero (e.g., within 5% of zero) (yes branch of block 1114), then the backward model is considered to be sufficiently trained and to be a learned model. Process 1100 proceeds to block 1116. Otherwise additional training of the backward model is required (no branch of block 1114), and process 1100 returns to block 1110 to generate an updated backward model using updated estimate parameters. The goal is to iterate or converge 914 to a zero (or near zero) difference or error.

At a block 1116, adaptation engine 408 is configured to generate the GMF-based model included in the pre-distortion actuator 402 based on the trained backward model. The trained backward model is the GMF-based model used in the pre-distortion actuator 402 to perform DPD compensation. In other words, the trained backward model can include pre-distortion actuator 700 or 740 (with particular LUT values for real and imaginary components for each of the LUTs included in the model determined based on the combined learning technique). Process 1100 returns to block 1102 to await the next update or adaptation of the pre-distortion actuator 402.

In some embodiments, each update or adaptation to pre-distortion actuator 402 captures the full distortion of the phased array 414 including various PA 427 nonlinearities, antenna element 428 coupling, antenna element 428 gain variation, and/or the like—as these parameters may vary with device age, phased array 414 temperature, beam steering angle, and/or the like. In some embodiments, blocks 1104-1108 is repeated more frequently (e.g., every 10 seconds) during beam steering then during non-beam steering operational time periods.

Figure 12A:
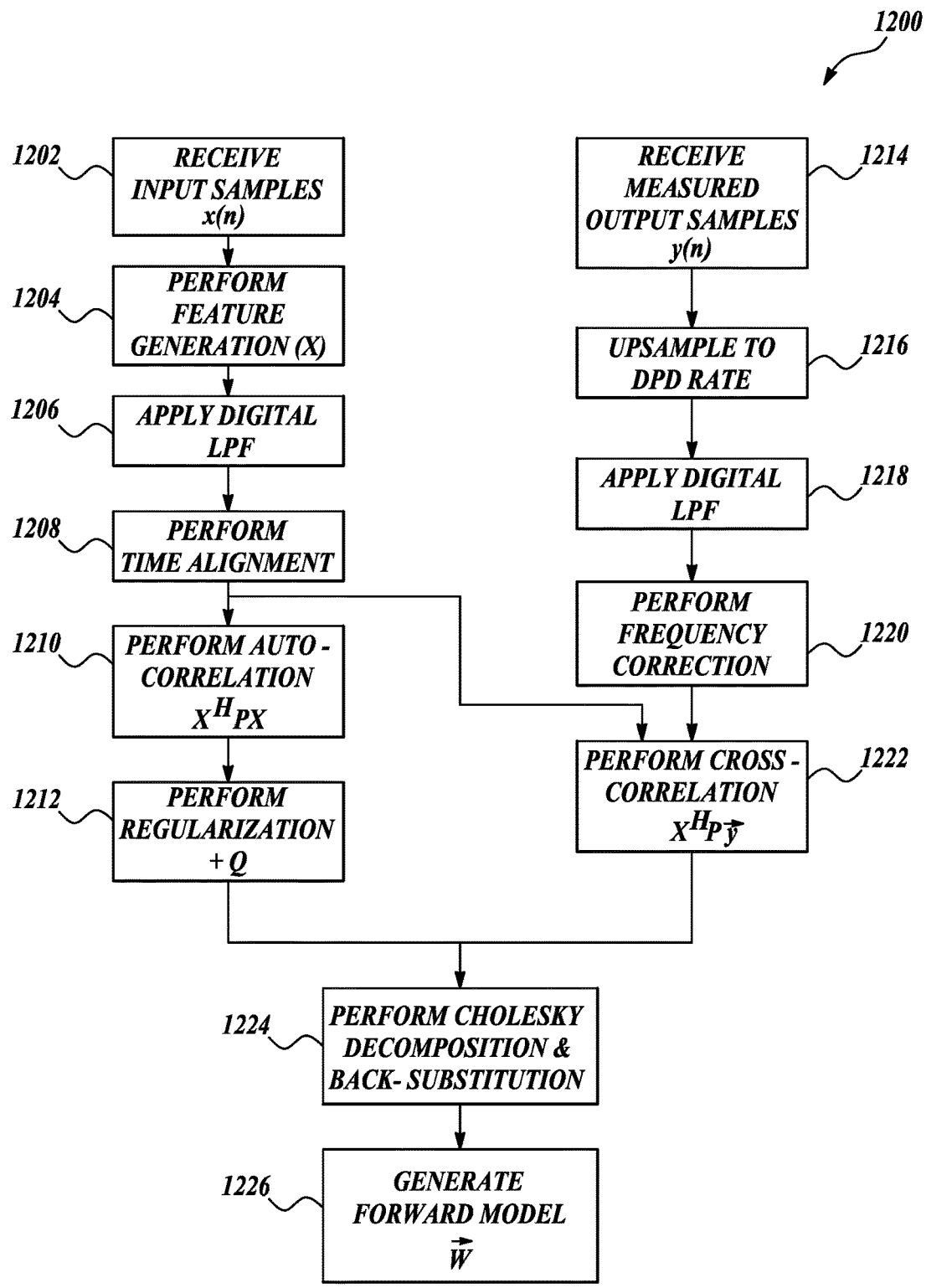
FIG. 12A illustrates a flow diagram showing a process to estimate forward model parameters in the combined direct and indirect learning technique in accordance with various aspects of the present disclosure.

FIG. 12A illustrates a flow diagram showing a process 1200 to estimate forward model parameters in the combined direct and indirect learning technique in accordance with various aspects of the present disclosure. Process 1200 provides additional details of block 1104 of FIG. 11.

Use of the input samples x(n) and measured output samples y(n) occurs simultaneously or in parallel to each other as shown in FIG. 12A. At a block 1202, a plurality of noiseless input samples x(n) is received from the output of pre-distortion actuator 402. The plurality of noiseless input samples x(n) can include N samples and be expressed as an input vector $\vec{x} \in \mathbb{C}^{N \times 1}$. At a block 1214, a plurality of potentially noisy output samples y(n) (the measured output samples) is received from the feedback data link receiver 416 via the receiver system 430. The plurality of potentially noisy output samples y(n) can include N samples and be expressed as an output vector $\vec{y} \in \mathbb{C}^{N \times 1}$.

At a block 1204, estimation module 904 is configured to generate a matrix X including a concatenation of the "feature" matrices generated in accordance with the GMF function from the input vector $\vec{x}$. The parameters of the GMF model (the forward model of module 902) are the entries of the three lookup tables (each with K entries), defined by a parameter vector $\vec{w} = [\vec{f}_A; \vec{f}_B; \vec{f}_C] \in \mathbb{C}^{3K \times 1}$.

The GMF model can then be written in matrix form as:

$$\hat{y} = X\vec{w} + \vec{n} \quad \text{Eq. (2)}$$

where the matrix $X \in \mathbb{C}^{N \times 3K}$ is a concatenation of three N×K sub-matrices $X = [X^{(A)}, X^{(B)}, X^{(C)}]$, and $\vec{n}$ is a vector of additive white Gaussian measurement noise. Each N×K sub-matrix is a sparse "feature" matrix generated according to the GMF function from the input samples $\vec{x}$ as follows:

$$X_{i,j}^{(A)} = \begin{cases} x_i, & |x_i| \in R_j \\ 0, & \text{else} \end{cases}, \quad \text{Eq. (3)}$$

$$X_{i,j}^{(B)} = \begin{cases} x_{i-1}, & |x_i| \in R_j \\ 0, & \text{else} \end{cases}, \quad X_{i,j}^{(C)} = \begin{cases} x_i, & |x_{i-1}| \in R_j \\ 0, & \text{else} \end{cases}$$

where $R_j$ is the jth interval of the companding function.

At a block 1206, estimation module 904 is configured to apply a digital low pass filter (LPF) to each column of the X feature matrix. And at a block 1208, estimation module 904 is configured to perform time alignment to identify and accurately pair input and output samples (e.g., pair the nth input and measured output samples with each other, pair the (n+1)th input and measured output samples with each other, etc.). At a block 1216, estimation module 904 is configured to upsample the received measured output samples to the DPD sampling rate. The estimation module 904 then applies digital low pass filtering to the $\vec{y}$ measurements, at a block 1218, and performs frequency correction on the filtered samples, at a block 1220.

At blocks 1208 and 1220, estimation module 904 performs time and frequency offset correction or compensation in order to properly identify and align successive input and measured output samples to each other. The pairing involves compensating for relatively long propagation delays, Doppler frequency offset between the transmitter and receiver systems 410, 430, and/or the like.

If the communications system includes burst-mode modems, the transmitter can capture input samples at the beginning of the burst, and the receiver can capture output samples upon detection of the burst (e.g., based on a particular preamble sequence included in a radio frame of the burst). Such burst detection capability provides a coarse time alignment at the burst level. A (coarse) frequency correction factor for the samples received at the receiver may also be available if the burst-mode modem receiver contains provisions for frequency offset estimation.

DPD adaptation benefits from having high time and frequency alignment—on the order of $\frac{1}{16}^{th}$ of a sample and less than 3 degree accumulated phase error over the capture time period. This accuracy may exceed the ability of the receiver modem. Therefore, to achieve the finer time alignment and frequency correction, a coarse-to-fine optimization algorithm or technique can be implemented in blocks 1208 and 1220 which adjusts both fractional-sample delay and fine-frequency corrections, in order to maximize the inner-product between input and measured output samples in accordance with the following equation:

$$\max_{\omega, \tau} \left\langle x(\vec{t} - \tau), y(\vec{t}) \cdot e^{-j\omega \vec{t}} \right\rangle \quad \text{Eq. (4)}$$

where $x(\vec{t} - \tau)$ is a fractional-sample interpolated delay of time $\tau$ applied to $\vec{x}$, and $\vec{t}$ is the vector of timestamps for measurement samples in the vector $\vec{y}$. By iteratively optimizing over $\omega$ and $\tau$, a fine time-frequency alignment can be achieved.

Since the model adaptation technique above does not specify which input and measured output samples need be used for model training, selective subsets of time-paired input-measured output samples can be used rather than all time-paired input-measured output samples. A sample selection technique can be employed to optimize the subset of measurement samples to be sent back to the transmitter system 410 (to reduce data usage), for example. At receiver system 430, a sample selection technique can employ binning the received data by amplitude. For each bin, a median-amplitude exemplar sample is selected, and its value and time-index are sent on the data link to feedback data link receiver 416. In some embodiments, a few hundred bins (and accordingly, a few hundred measurement samples) are sufficient to train the DPD model to perform accurate DPD compensation.

The time alignment results are provided to each of blocks 1210 and 1222. The frequency correction results are provided to block 1222. At blocks 1210 and 1222, estimation module 904 is configured to calculate the standard minimum-mean-square-error estimate for the parameter vector $\vec{w}$ (of the DPD model or forward model) from a collection of input-output samples as follows, $$\vec{w} = \underset{\vec{w}}{\operatorname{argmin}} \|X\vec{w} - \vec{y}\|^2 \quad \text{Eq. (5)}$$

$$= (X^H X)^{-1} X^H \vec{y}$$

Rather than explicitly calculate the matrix-inversion in the above equation, a Cholesky decomposition followed by back-substitution can be used. Alternatively, stochastic-gradient descent (LMS algorithm) can be applied for real-time model update as opposed to a batched update.

In some embodiments, due to possibly very noisy output measurements, modelling robustness for forward modelling can be improved by solving a generalized Tikhonov regularization problem, at a block 1212:

$$\vec{w} = \underset{\vec{w}}{\operatorname{argmin}} \|X\vec{w} - \vec{y}\|_P^2 + \|\vec{w}\|_Q^2 \quad \text{Eq. (6)}$$

$$= (X^H P X + Q)^{-1} X^H P \vec{y}$$

which includes a penalty on $\vec{w}$ that can be used to enforce smoothness upon the lookup table solution functions. This can greatly improve estimation performance in the case of low-SNR receiver measurements $\vec{y}$. The following tri-diagonal Q matrix (referred to as a "second-difference matrix") which penalizes change between adjacent entries in the lookup table solutions is as follows:

$$Q = \lambda \begin{bmatrix} 1 & -1 & 0 & 0 \\ -1 & 2 & -1 & 0 \\ 0 & -1 & 2 & \ddots \\ 0 & 0 & \ddots & \ddots \end{bmatrix} \quad \text{Eq. (7)}$$

where $\lambda$ is a scale factor chosen to set the smoothness enforcement level. $\lambda$ is generally increased for high measurement noise or when the PA is known to compress gently.

The P-norm, in Equation 6, is configured to solve the modeling problem with bandlimited $\vec{y}$ measurements, by applying zero weight outside the valid (in-band) receiver measurement frequencies. In some embodiments, the P-norm can be implemented by digitally low-pass filtering (LPF) the $\vec{y}$ measurements, at block 1218, as well as each column of the X feature matrix, at block 1206. A forward model of a Ku-band phased array trained on narrow-band $\vec{y}$ measurement data by this technique results in a model solution that extrapolates well to adjacent bands not directly measured. A forward model trained in this way (in accordance with process 1200 set forth herein) yields full-bandwidth output sample predictions which can then be used to train the backward/post-distortion model.

Upon completion of blocks 1210, 1222, and 1212, estimation module 904 is configured to perform a Cholesky decomposition followed by back-substitution, at a block 1224, to solve for a parameter vector $\vec{w}$ of the forward model. Such parameter vector $\vec{w}$ defines the forward model in the forward model module 902, at a block 1226. The forward model is used to perform forward modelling at block 1106 of FIG. 11.

Figure 12B:
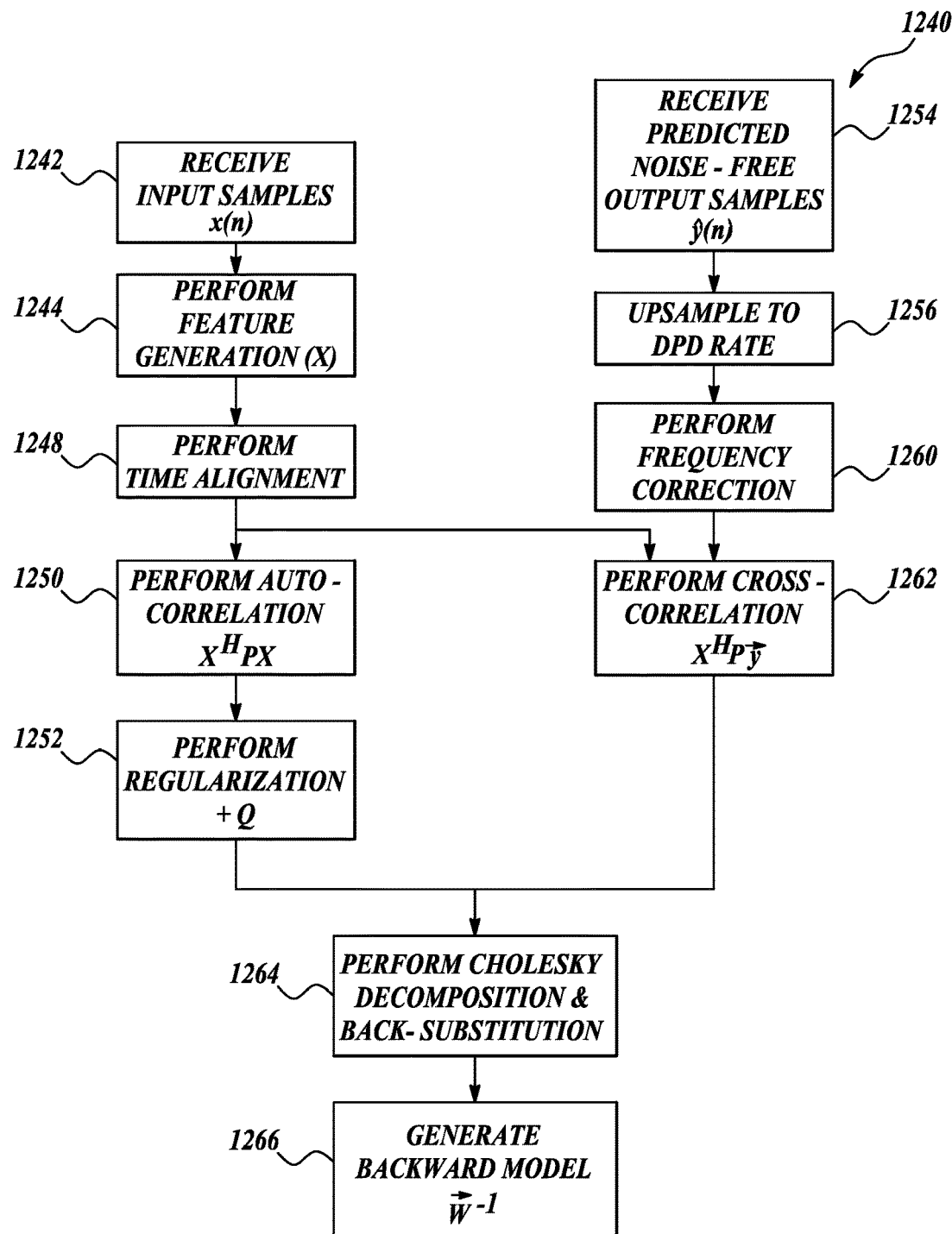
FIG. 12B illustrates a flow diagram showing a process to estimate backward model parameters in the combined direct and indirect learning technique in accordance with various aspects of the present disclosure.

FIG. 12B illustrates a flow diagram showing a process 1240 to estimate backward model parameters in the combined direct and indirect learning technique in accordance with various aspects of the present disclosure. Process 1240 provides additional details of block 1112 of FIG. 11.

In some embodiments, blocks 1242, 1244, 1248, 1250, 1252, 1256, 1260, 1262, and 1264 of process 1240 are similar to respective blocks 1202, 1204, 1208, 1210, 1212, 1216, 1220, 1222, and 1224 of process 1200. In process 1240, the samples used by estimation module 908 can include the input samples x(n) received at block 1242 and predicted output samples ŷ(n) received at a block 1254 from the forward model module 902. The predicted output samples ŷ(n) received at block 1254 differ from the measured output samples y(n) received at block 1214 and is used as the output samples in process 1200. Thus, the present disclosure herein pertaining to blocks 1202, 1204, 1208, 1210, 1212, 1216, 1220, 1222, and 1224 is applicable to respective blocks 1242, 1244, 1248, 1250, 1252, 1256, 1260, 1262, and 1264 of process 1240, except the input vector $\vec{x} \in \mathbb{C}^{N \times 1}$ used in process 1240 is a plurality of noiseless input samples x(n) including N samples and the output vector $\vec{y} \in \mathbb{C}^{N \times 1}$ used in process 1240 is a plurality of predicted (noise free) output samples ŷ(n) including N samples.

As an alternative to the Cholesky decomposition and back-substitution performed in block 1264, estimation module 908 can be configured to solve for the parameter vector $\vec{w}$ (of the DPD model or forward model) using a minimum-mean-square-error technique. Next, at a block 1266, adaptation engine 408 configures the backward model with the optimized parameter vector $\vec{w}$, thereby defining a trained or learned backward model. Such trained or learned backward model is the updated or adapted model configured in pre-distortion actuator 402, at block 1116 of FIG. 11.

The combined direct and indirect learning technique discussed in connection with FIGS. 9-12B learns pre-distortion actuator 402 lookup-table coefficients by minimizing a minimum-mean-square-error (MMSE) metric during modelling of the physical system behavior. MMSE metric has a closed-form gradient and permits efficient least-squares solution. The combined learning technique is a close-form optimization technique. Nevertheless, this technique uses careful collection and alignment of input-output samples, which can add complexity and overhead to the adaptation process.

Sometimes other metrics are readily available in a satellite communications system (or other wireless communications systems) that may be simpler to access and still pertinent to the goals of pre-distortion. Examples of available receiver metric measurements include, without limitation, error vector magnitude (EVM), bit error rate (BER), pilot SNR, packet error rate (PER), receive-signal-strength indicators (RSSI), channel quality indicators (CQI), correlation coefficient against a known sequence, channel estimates, mutual information, power measurement in a band (e.g., adjacent carriers), and/or other signal quality-related metrics. These receive quality metrics may be automatically generated by a modem receiver at a high rate, and are often already fed back to the transmitter (e.g., for adaptive modulation and coding). These receive quality metrics by themselves, however, are insufficient to permit a closed-form optimization such as the combined learning technique.

Figure 13:
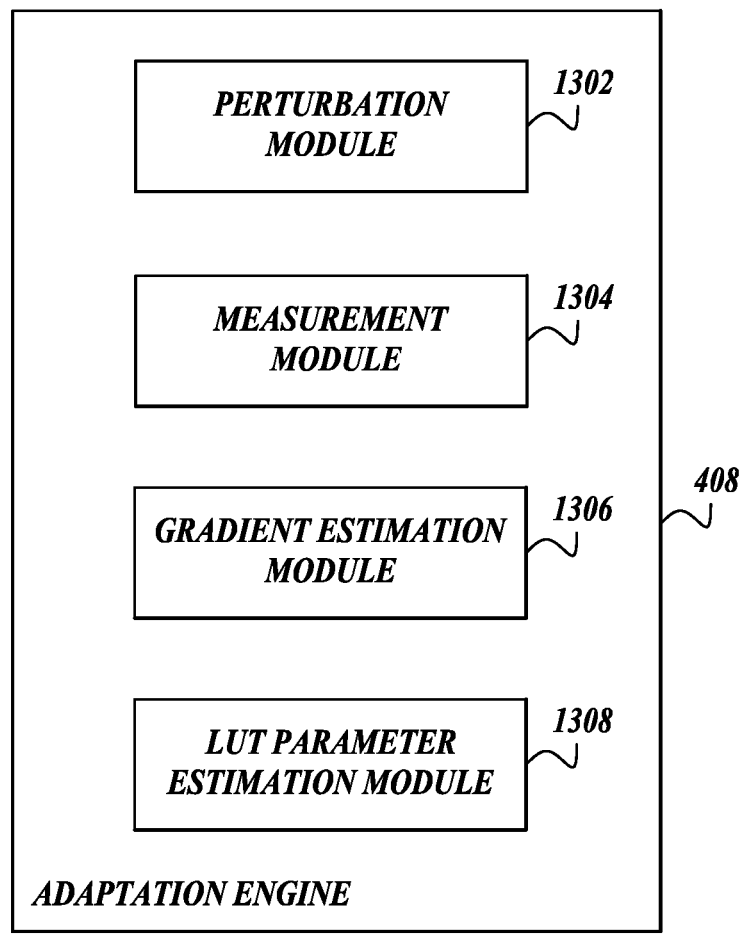
FIG. 13 illustrates a block diagram showing example modules configured to implement a direct learning technique using a plurality of receiver quality metric measurements in accordance with various aspects of the present disclosure.
Figure 14:
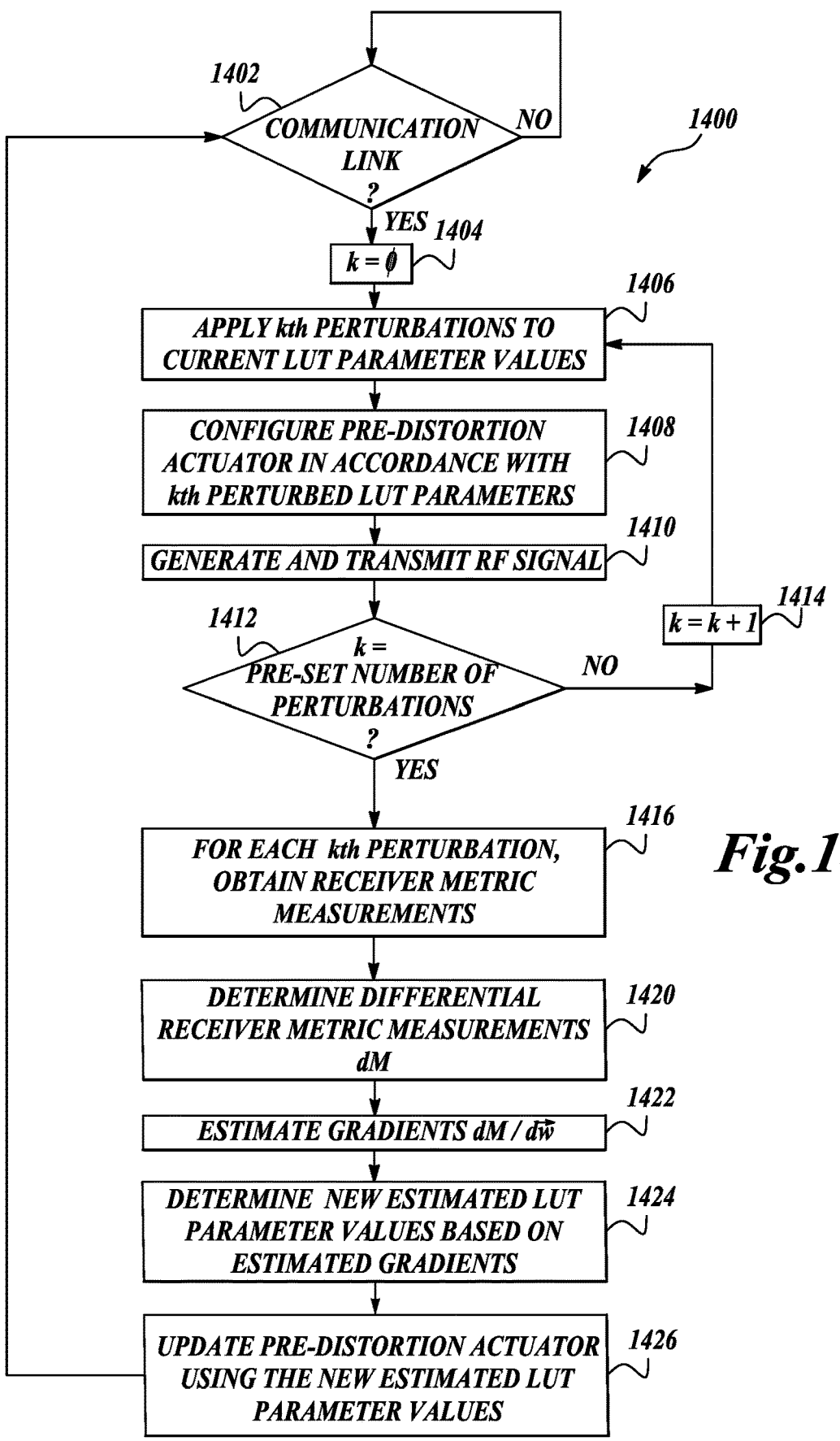
FIG. 14 illustrates a flow diagram of a process for adapting the pre-distortion actuator using the direct learning technique associated with FIG. 13 in accordance with various aspects of the present disclosure.

FIG. 13 illustrates a block diagram showing example modules configured to implement a direct learning technique using a plurality of receiver quality metric measurements in accordance with various aspects of the present disclosure. FIG. 14 illustrates a flow diagram of a process 1400 for adapting the pre-distortion actuator 402 using such direct learning technique in accordance with various aspects of the present disclosure. The direct learning technique implemented in connection with FIGS. 13 and 14 can include an alternative technique to adapting the pre-distortion actuator 402 using the combined direct and indirect learning technique.

As shown in FIG. 13, in some embodiments, adaptation engine 408 can include hardware, firmware, circuitry, software, and/or combinations thereof to facilitate various aspects of the direct learning technique described herein. Adaptation engine 408 can include, without limitation, a perturbation module 1302, a measurement module 1304, a gradient estimation module 1306, and a LUT parameter estimation module 1308. Modules 1302-1308 may also be referred to as logic, instructions, algorithms, and/or the like. LUT parameter estimation module 1308 can also represent a module that estimates other parameters for use in pre-distortion compensation.

Perturbation module 1302 is configured to apply a perturbation to each of the current LUT parameter values, and then to repeat to obtain a set of perturbed LUT parameter values for each perturbation of a plurality of perturbations. The perturbations can include small changes made to the LUT parameter values to study the corresponding compensation effectiveness in the RF signals received at the receiver side.

Measurement module 1304 is configured to facilitate obtaining receiver quality metric measurements from the receiver side (e.g., the receiver included in the receiver system 430) and to process such measurements appropriate for use with the perturbed sets of LUT parameter values. Processing can include, without limitation, averaging the measurements to reduce the impact of particularly noisy signals, missing measurements for a particular perturbed set of LUT parameter values, and/or the like.

Gradient estimation module 1306 is configured to calculate gradient estimates based on the differences in receiver quality metric measurements and differences in the perturbed sets of LUT parameter values. Based on the gradient estimates, the LUT parameter estimation module 1308 is configured to determine the best new estimated value of each of the LUT parameters, which can be used to update the pre-distortion actuator 402.

In some embodiments, one or more of modules 1302-1308 (or a portion thereof) can include one or more instructions embodied within a tangible or non-transitory machine (e.g., computer) readable storage medium, which when executed by a machine causes the machine to perform the operations described herein. Modules 1302-1308 (or a portion thereof) may be stored local or remote from adaptation engine 408. One or more processors included in adaptation engine 408 can be configured to execute modules 1302-1308 (or a portion thereof). In alternative embodiments, one or more of modules 1302-1308 (or a portion thereof) may be implemented as firmware or hardware such as, but not limited to, an ASIC, PAL, FPGA, and/or the like included in the adaptation engine 408. In other embodiments, one or more of modules 1302-1308 (or a portion thereof) may be implemented as software while other of the modules 1302-1308 (or a portion thereof) may be implemented as firmware and/or hardware.

Referring to FIG. 14, process 1400 relates to the simultaneous perturbation stochastic approximation (SPSA) technique which has been tailored for potentially noisy over-the-air signal quality metric measurements in satellite communications systems. Process 1400 may be performed by adaptation engine 408 continuously and iteratively to facilitate adaptive DPD compensation.

At a block 1402, adaptation engine 408 is configured to check whether a communication link currently exists between transmitter and receiver systems 410 and 430 since this adaptation scheme depends upon receiver quality metric measurements. If there is no communication link established (no branch of block 1402), then process 1400 waits for a communication link to be established. If a communication link exists (yes branch of block 1402), then process 1400 proceeds to block 1404.

At a block 1404, the perturbation module 1302 is configured to establish a perturbation counter k, initially set to k=0 or some other initial counter value, to facilitate generating a pre-set number of sets of the perturbed LUT parameter values. Next, at a block 1406, perturbation module 1302 is configured to apply the kth perturbation to each current LUT parameter values to generate transmitter compensation parameters $\vec{w}$ for the kth perturbation. In some embodiments, the kth perturbation can include a relatively small value added to each of the current LUT parameter element values, in which the kth perturbation value can be a random value within a pre-set range and/or in accordance with perturbation value distribution constraints among the plurality of perturbation values (e.g., pre-set standard deviation). The perturbation value applied to respective LUT parameter values can be different from each other in accordance with the random nature of each perturbation value.

Primary channel variability in satellite links such as path loss, tropospheric scintillation, and thermal fluctuations, all tend to vary slowly enough that measurements taken in quick succession (e.g., within 100 ms) typically have only small differences due to the underlying channel variation. The small differences that do exist are further averaged away through multiple measurements as long as the perturbations are randomized. Furthermore, this measurement-based technique is tolerant to other simultaneously running control loops causing other changes uncorrelated with the random perturbations (e.g., automatic gain control or closed-loop beam steering).

While each parameter element can be perturbed separately or sequentially, this approach would require many measurements to be taken to form the full multi-dimensional estimate gradient. Instead, all of the LUT parameter elements can be simultaneously perturbed to estimate the full gradient, with only 1/N number of measurements required at a minimum, where N is the number of parameters in $\vec{w}$. If N is a large number (e.g., thousands or even millions of LUT parameter elements), the time savings from fewer number of measurements can be enough to enable real-time (or near real-time) adaptive DPD compensation.

With the kth perturbed set of LUT parameter values determined, perturbation module 1302 is configured to facilitate configuring the pre-distortion actuator 402 with such values, at a block 1408. An input sample x(n) can now be generated by the pre-distortion actuator 402 and propagated through the rest of the transmitter chain to transmit a RF signal to the receiver system 430, at a block 1410.

Next, at a block 1412, perturbation module 1302 is configured to check whether k equals a pre-set number of perturbations and measurements to average before making an estimate of the gradient. If the pre-set number of perturbations and measurements has not been reached (no branch of block 1412), then process 1400 proceeds to block 1414, where the counter k is incremented by one, and then returns to block 1406 to apply the newest kth perturbations to the current LUT parameter values. This loop continues until k sets of perturbed LUT parameter values have been calculated.

Next, at a block 1416, measurement module 1304 is configured to obtain receiver metric measurements and match to the k sets of perturbed LUT parameter values. Each time the DPD lookup tables are perturbed, a new measurement is taken on the receiver end of the communication link and fed back to the adaptation engine 408. The simplest way to match a measurement with a perturbed set is for the receiver system 430 to continuously feedback measurements as they become available to the transmitter system 410 and if the transmitter system 410 waits longer than the round-trip delay time before using the new measurements, there is surety in the perturbed set-measurement pairing. However, such waiting inefficiently wastes measurements and limits the rate of perturbations, and by extension, overall adaptation rate.

Instead, the different perturbation sets in the plurality of perturbation sets (also collectively referred to as a batch of perturbations) can be applied in quick succession after timestamping the moments at which each is applied to pre-distortion actuator 402. The receiver sends associated measurements (at an equal or higher rate), and timestamps the moment the measurements are taken. The full batch of measurements can be sent back together or in sequence.

After adjusting timestamps by accounting for propagation delay (assuming satellite and ground station location, or slant range is known), the perturbations and measurements are matched, the gradient for the batch can be estimated, and an update step can be taken. Lost, missing, corrupt, and/or suspect measurements can be ignored and not included in the calculation without adversely affecting determination of new estimated LUT parameter values.

Next, at a block 1420, gradient estimation module 1306 is configured to determine finite differences in the metric measurements associated with the perturbed LUT parameter sets. The differential parameter perturbations $\vec{w}$ and the differential metric measurements M are used to generate gradient estimates $dM/d\vec{w}$ by gradient estimation module 1306, at a block 1422.

Figure 15:
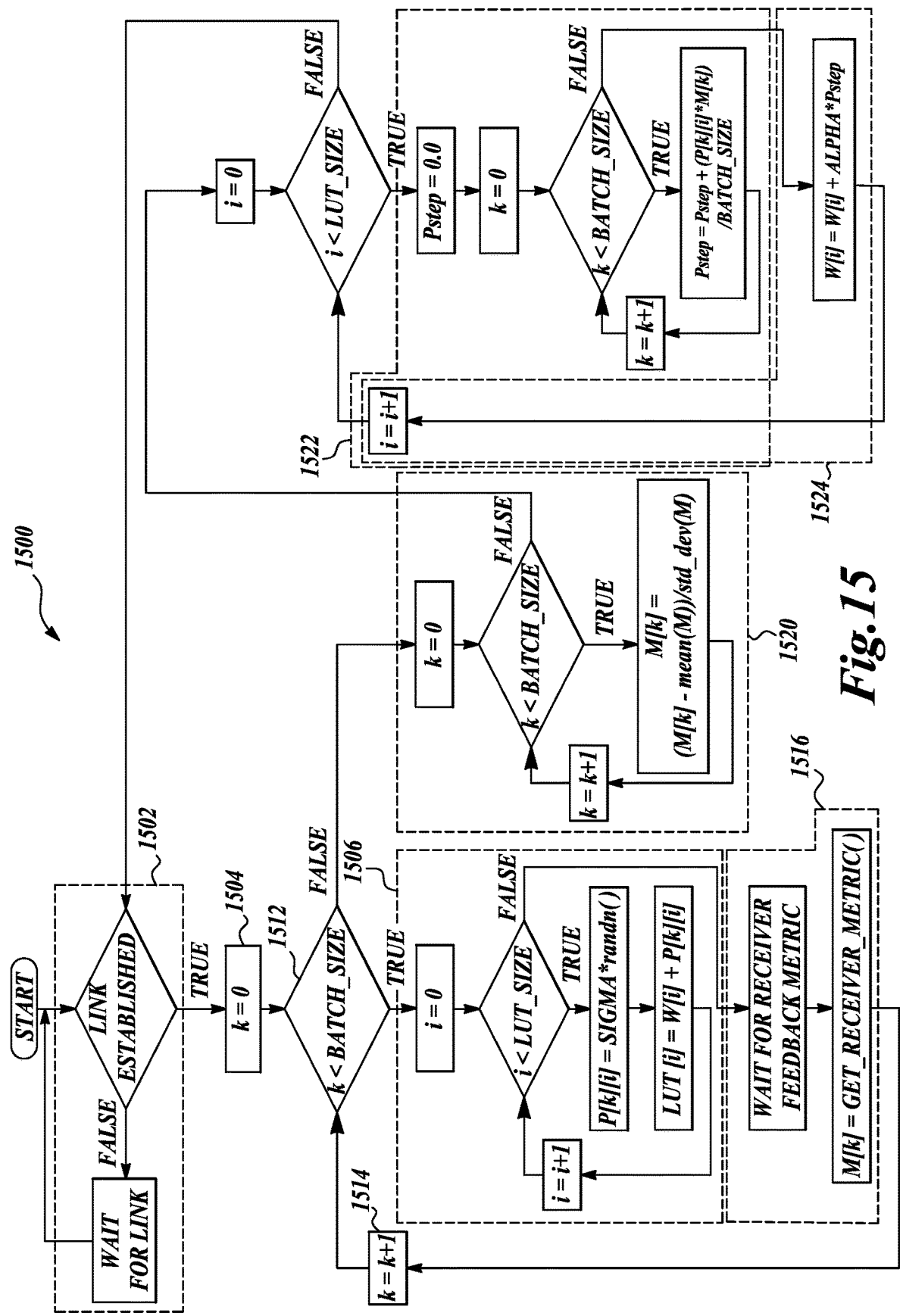
FIG. 15 illustrates a flow diagram showing a process associated with a simultaneous perturbation stochastic approximation (SPSA) technique in accordance with various aspects of the present disclosure.

Gradient estimates $dM/d\vec{w}$ may be formed by taking the difference in metric measurements divided by the difference in parameter perturbations. However, the dimension of $\vec{w}$ can be large (e.g., thousands to millions of parameter elements for DPD compensation, corresponding to the total number of LUT parameters for real and imaginary components). If each parameter in $\vec{w}$ is perturbed separately, thousands to millions of perturbations would be needed to compute a single gradient $dM/d\vec{w}$. Such calculation scheme may be too slow for real-time adaptation. Instead, the gradient estimate $dM/d\vec{w}$ can be estimated directly from a small number of simultaneous perturbations of all dimensions of $\vec{w}$. The transformation of these simultaneous perturbations to a gradient estimate can be performed using an evolutionary strategy referred to as simultaneous perturbation stochastic approximation (SPSA), details of which are shown in FIG. 15.

In some embodiments, a plurality of differential metric measurements may be averaged so as to improve accuracy of the gradient estimates at block 1422, even if any individual measurement is noisy. Averaging is effective as long as the difference of successive noise values divided by the difference in parameter perturbations averages to zero (a condition which can be ensured by randomizing the perturbations). While this averaging may be performed with multiple measurements from each perturbations in each dimension, this may be far too slow. Instead, the SPSA technique performs a summing operation that uses the same small set of perturbations vectors to form an average in each dimension simultaneously.

Next, at a block 1424, LUT parameter estimation module 1308 is configured to use the gradients $dM/d\vec{w}$ from block 1422 to iteratively optimize or determine the best or preferred new estimated LUT parameter values from among the parameter perturbations. Once parameter value optimization is complete, LUT parameter estimation module 1308 is configured to facilitate updating pre-distortion actuator 402 based on the optimized new estimated LUT parameter values from block 1424, at a block 1426. The optimization may also include an improvement without an actual literal optimization of the parameter value(s).

Then process 1400 returns to block 1402 to continue perturbation of LUT parameter values to find the next estimated LUT parameter values.

FIG. 15 illustrates a flow diagram showing a process 1500 associated with the SPSA technique in accordance with various aspects of the present disclosure. FIG. 15 shows additional details of one or more blocks of process 1400. In some embodiments, blocks 1402, 1404, 1406, 1412, 1414, 1416, 1420, 1422, and 1424 of FIG. 14 are described in additional detail in respective corresponding portions 1502, 1504, 1506, 1512, 1514, 1516, 1520, 1522, and 1524 of FIG. 15.

In FIG. 15, the process starts with block 1502 in which a link is established between a transmitter and a receiver at which point the flow proceeds to block 1504 which initializes a value k to zero. The BATCH_SIZE hyper-parameter in block 1512 represents the (small) number of multi-dimensional perturbations and associated measurements to combine into a gradient estimate. When k is less than the BATCH_SIZE 1512, the flow proceeds to a group of blocks 1506 which initializes the value i at zero and when i is less than the LUT_SIZE (which is the total number of LUT parameter elements, such as a multiplication of the total number of LUTs, number of parameter elements for a complex-value component, and number of complex-value components per sample (e.g., 2)), sets P[k][i] equal to SIGMA*randn( ). SIGMA is the standard deviation of the random multi-dimensional perturbations (typically independent and normally-distributed in each dimension). P[k][i] represents the kth perturbation in the ith dimension (each dimension being an individual lookup-table parameter). In the group of blocks 1506, LUT[i] represents the current lookup table parameters being tested (including perturbation) and is set to W[i]+P[k][i]. W[i] represents the current (new) best estimate values of the lookup table parameters. W[i] is the value being optimized in process 1500. When i is not less than the LUT_SIZE, the process proceeds to the group of blocks 1516 which causes the system to wait for the receiver feedback metric and then sets M[k] equal to get receiver metric( ). M[k] are the measured metric values fed back by the receiver for the kth perturbation in the batch. Block 1514 represents setting k to k+1 and returning to block 1512. When k is not less than the BATCH_SIZE, the flow proceeds to the group of blocks 1520.

In the group of blocks 1520, k is initiated to zero and when k is less than the BATCH_SIZE, M[k] is set equal to (M[k]−mean(M))/std_dev(M)) and k is then incremented. When k is no longer less than the BATCH_SIZE, the flow proceeds to set i equal to zero and while i is less than the LUT_SIZE, the operations in the group of blocks 1522 and the group of blocks 1524 are performed as shown in FIG. 15. Note that there is some overlap between blocks 1522 and 1524. First, in the group of blocks 1522, Pstep is set to zero and k is set to zero. Pstep represents the gradient $dM/\vec{w}$. When k is less than the BATCH_SIZE, Pstep is set equal to Pstep+(P[k][i]*M[k])/BATCH_SIZE. The value k is then incremented. This process iterates until k is equal to or greater than the BATCH_SIZE, at which point the operations in the group of blocks 1524 is performed. Here, W[k] is set equal to W[i]+ALPHA*Pstep. ALPHA is a scale factor determining the step size to take on the parameters in the estimated gradient direction to improve the receiver metric.

In some embodiments, one or more parameters of process 1500 can be pre-set, initialized, or defined to start process 1500. Examples of such parameters include BATCH_SIZE, LUT_SIZE, SIGMA, ALPHA, and the initial W[i] values. Process 1500 is configured to continuously iterate or repeat to continuously identify the best new estimated LUT parameter values over time.

In this manner, a system can include a digital pre-distortion (DPD) compensator (e.g., pre-distortion actuator 402) configured to apply a linearization correction to input samples to generate output samples. An antenna assembly includes one or more antennas and one or more power amplifiers, the antenna assembly configured to transmit the output samples, in which the linearization correction compensates for nonlinearity associated with the antenna assembly. An adaptation engine can be configured to use a plurality of received signal metric measurements associated with the output samples received by a receiver over-the-air, in which the plurality of received signal metric measurements is generated by the receiver. The adaptation engine can be configured to generate a plurality of sets of perturbed parameters of the DPD compensator, the plurality of sets of perturbed parameters including randomized perturbations of the parameters of the DPD compensator. Each set of perturbed parameters of the plurality of sets of perturbed parameters can be associated with a respective perturbation of a plurality of perturbations. The DPD compensator is successively configured in accordance with respective set of the plurality of sets of perturbed parameters. The receiver determines a set of received signal metric measurements for each output sample received by the receiver over-the-air and associated with a respective set of the plurality of sets of perturbed parameters. The adaptation engine determines updated parameters of the DPD compensator based on the plurality of sets of perturbed parameters and the sets of the received signal metric measurements associated with the plurality of sets of perturbed parameters.

In some embodiments, due to continual perturbation of the LUT parameter values associated with process 1400, additional noise may be introduced into the system, which can create a performance "limit" on achievable metric values. This limit is mitigated with a decreased value of the pre-set standard deviation associated with the independent normally-distributed perturbation values (among a given set of LUT parameter values and between different sets of LUT parameter values). For this reason, block 1406 of FIG. 14 can include reducing the pre-set standard deviation over time as the direct learning technique converges.

Accordingly, the direct learning technique is based on stochastic perturbation of the lookup-table parameters and wireless feedback of receive quality signal metrics generated by modem or SoC 436 of receiver system 430. While the direct learning technique may be slower to adapt the pre-distortion actuator 402 compared to the combined direct and indirect learning technique, such stochastic optimization is simpler to implement, can concurrently improve one or more signal quality metric, and can readily incorporate other transmitter compensation parameters into the optimization.

In some embodiments, the LUT parameter values determined by stochastic optimization can also provide one or more other transmitter compensations. For example, without limitation, compensation relating to one or more of the following transmitter parameters can be provided using stochastic optimization: PA bias levels; gain, phase, and/or delay parameters of each phased array element; analog and digital compensations for local oscillator (LO) feedthrough and IQ imbalance; data converter mismatch trims; automatic gain control levels; beam pointing phi/theta angles; and/or many others. Each transmitter parameter can be appended to the vector of LUT parameters and optimized in parallel using the same process 1400. Many thousands to millions of parameters can be perturbed and optimized simultaneously without slowing the adaptation rate. When incorporating parameters with a variety of types and scales, the perturbation values can be chosen to achieve approximately equal sensitivity of the optimization metric to each variable type's perturbation.

The learning techniques and adaptation schemes described herein allow one receiver to receive outputs from transmitters of a plurality of independent nodes (e.g., a plurality of user terminals, plurality of gateways, and/or plurality of satellites) for purposes of determining a DPD compensation or correction factor for each of such independent node's transmitter. For example, in the case where the receiver is included in a satellite (e.g., satellite 502 in FIG. 5), such receiver can simultaneously receive uplink signals from a plurality of Earth-based equipment (e.g., user terminal 510, user terminal 512, gateway 520, etc.) and take measurements of the respective received uplink signals. The satellite, which also includes a transmitter, can transmit relevant measurement samples and/or receive signal metrics from respective Earth-based equipment for use in local adaptation and pre-distortion.

It is understood that the learning techniques and adaptation schemes described herein are applicable to single PA and multiple PA communications systems. This allows inexpensive and/or off-the-shelf PAs, such as solid state PAs (SSPAs), to be used instead of expensive and/or high power consuming PAs, such as traveling wave tube amplifiers (TWTA). Moreover, the learning techniques and adaptation schemes described herein are applicable to any system using one or more PAs in a wireless transmission system such as, but not limited to, optical, acoustic, radar, multiple-input and multiple-output (MIMO), satellite, phased array systems, and/or the like.

The learning techniques and adaptation schemes described herein significantly simplify the behavior complexities of a large number of PAs, such as included in a phased array, by use of a lookup table (or other implementation of the nonlinear compensation function) that is readily adaptable without being a drain on normal operations system resources. Inherent characteristics of the large number of PAs (e.g., nonlinearity), the environmental conditions in which the PAs are operating, as well as variations in operating conditions between the PAs are taken into account. Other undesirable behaviors and/or characteristics of components included in the system such as, but not limited to, noise introduced by the receiver, Doppler effect, signal interference during propagation over-the-air, and/or the like are also compensated for via the learning techniques and adaptation schemes described herein.

DPD compensation uses over-the-air feedback to continuously model and adapt to the nonlinearity of the PAs, and then digitally pre-compensates for undesirable PA behavior on an entire phased array basis (as opposed to on a per individual PA basis) so that the overall system is linear. This allows communication links by the overall system to meet wireless emission and/or high data-rate signal fidelity requirements (such as government wireless signal requirements). Thus, use of low-cost and low-power PAs is possible. Accordingly, the learning techniques and adaptation schemes described herein increase DPD robustness and also significantly reduces the calibration and silicon cost of implementation. DPD compensation as described herein enables transmitter systems to achieve reduced power consumption, cooling, weight reduction, and/or cost savings.

DPD compensation is enabled and adaptive using over-the-air feedback (as opposed to locally generated feedback). Distortion in adjacent channels are corrected even though the remote receiver only measures the main or primary channel(s), and by extension, the feedback generated by the receiver is based on the main/primary channel(s). The feedback receiver sampling the transmitted output signal is bandlimited and detects only a subset of the bandwidth (detects less than the full or entire bandwidth) over which the pre-distortion actuator 402 applies linearization. The feedback receiver need not sample at 3× or more of the channel bandwidth at a minimum. Both the combined direct and indirect learning technique and the SPSA technique avoid such sampling requirement.

Figure 16:
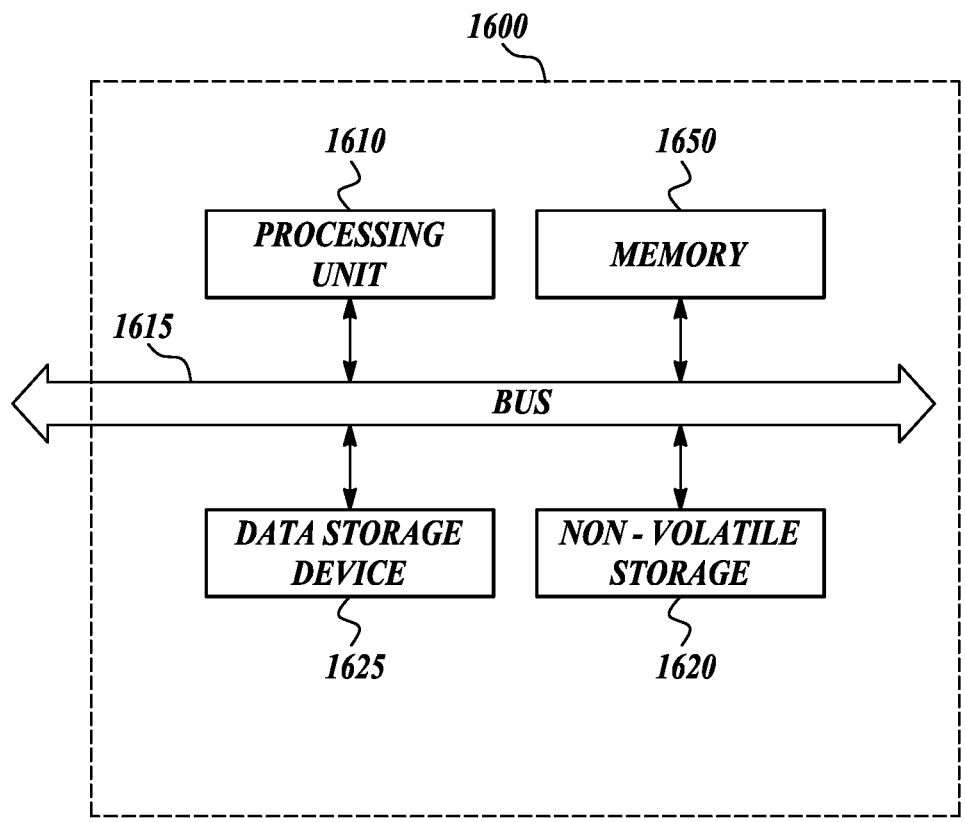
FIG. 16 illustrates a block diagram showing an example device that can be implemented in the system in accordance with various aspects of the present disclosure.

FIG. 16 illustrates a block diagram showing an example platform or device that can be implemented in the system 400 in accordance with various aspects of the present disclosure. Platform 1600 can include at least a portion of any of adaptation engine 408, pre-distortion actuator 402, modem or SoC 412, and/or modem or SoC 436. Platform 1600 as illustrated includes bus or other internal communication means 1615 for communicating information, and processor 1610 coupled to bus 1615 for processing information. The platform further can include random access memory (RAM) or other volatile storage device 1650 (alternatively referred to herein as main memory), coupled to bus 1615 for storing information and instructions to be executed by processor 1610. Main memory 1650 also may be used for storing temporary variables or other intermediate information during execution of instructions by processor 1610. Platform 1600 also can include read only memory (ROM), static storage, or non-volatile storage device 1620 coupled to bus 1615 for storing static information and instructions for processor 1610, and data storage device 1625 such as a magnetic disk, optical disk and its corresponding disk drive, or a portable storage device (e.g., a universal serial bus (USB) flash drive, a Secure Digital (SD) card). Data storage device 1625 is coupled to bus 1615 for storing information and instructions.

Figure 17:
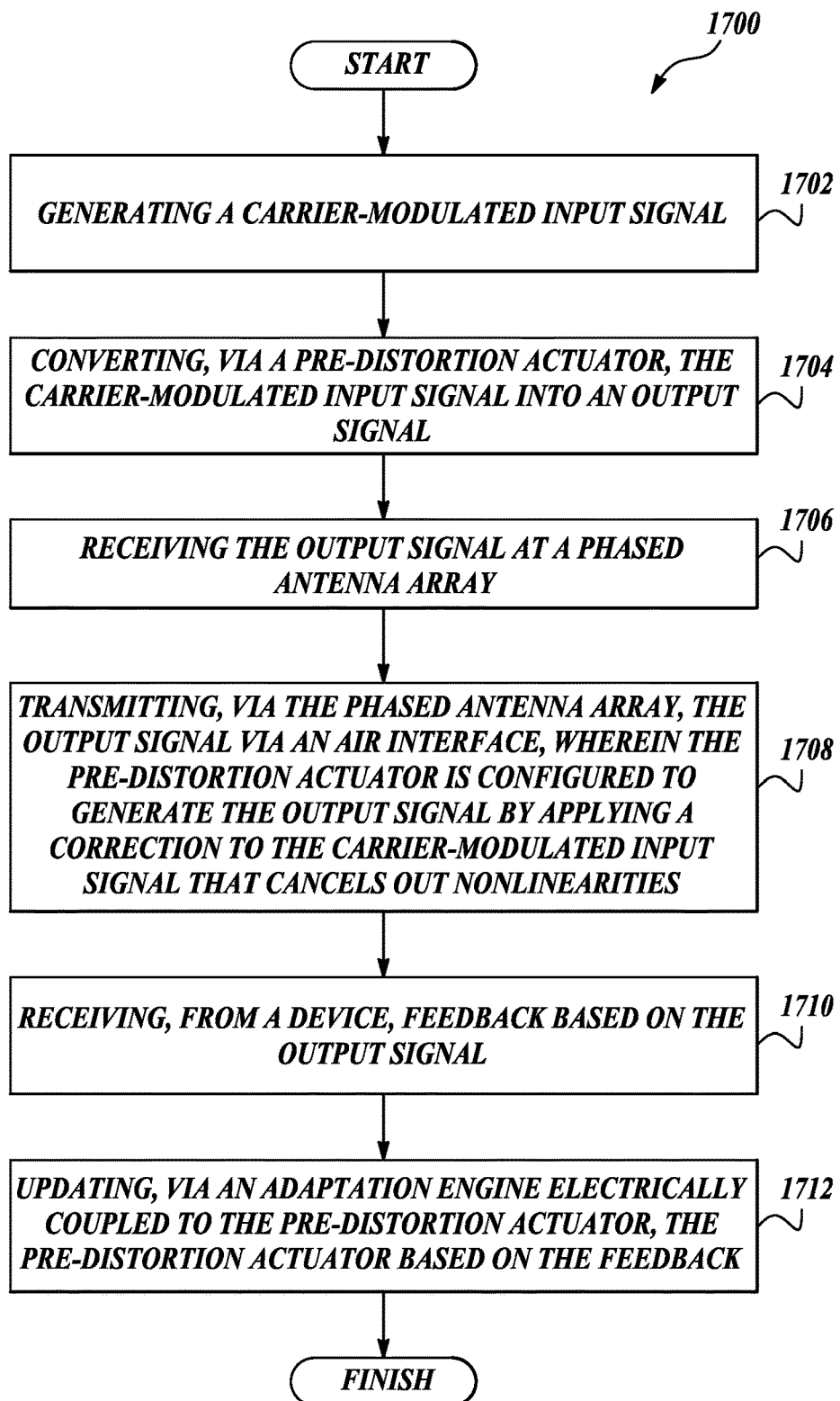
FIG. 17 illustrates a block diagram showing an example pre-distortion compensation method implemented by the disclosed system.

FIG. 17 illustrates an example method 1700 embodiment. The method may be performed by a system in a number of different configurations as disclosed herein. The example method includes one or more steps performed in any order. The method can include generating a carrier-modulated input signal (1702). A module can represent the hardware and/or software component that generates the carrier-modulated input signal. The method can include converting, via a pre-distortion actuator, the carrier-modulated input signal into an output signal (1704), receiving the output signal at a phased antenna array (1706) and transmitting, via the phased antenna array, the output signal via an air interface, wherein the pre-distortion actuator is configured to generate the output signal by applying a correction to the carrier-modulated input signal that cancels out nonlinearities (1708). The nonlinearities can be associated with one or more of the antennas, the power amplifiers, and/or other component in the system. The phased antenna array can include a plurality of power amplifiers and a plurality of antenna elements, each antenna element of the plurality of antenna elements electrically coupled to a respective power amplifier of the plurality of power amplifiers. The pre-distortion actuator can include a behavioral model or a generalized memory functions (GMF) model. The pre-distortion actuator can also include a plurality of lookup table values that includes parameters of the behavioral model or the GMF model.

In one aspect, the method can further include receiving, from a device, feedback based on the output signal (1710) and updating, via an adaptation engine electrically coupled to the pre-distortion actuator, the pre-distortion actuator based on the feedback (1712).

The feedback can include one or more samples of the output signal, or one or more received signal quality metric measurements calculated based on the output signal. The feedback can also include one or more samples of the output signal. The method can further include applying, via the adaptation engine, a combined direct learning and/or indirect learning technique and the feedback to improve a predicted pre-distortion actuator.

The feedback can also include one or more received signal quality metric measurements calculated based on the output signal. In this regard, the method further can include applying, via the adaptation engine, a stochastic optimization technique and the feedback to update the pre-distortion actuator.

In another aspect, the method can further include receiving, from a device, feedback based on the output signal and dynamically adapting, via an adaptation engine electrically coupled to the pre-distortion actuator, a plurality lookup table parameter element values of the pre-distortion actuator based on the feedback.

The nonlinearities referenced above can include one or more of nonlinearities associated with the phased antenna array, nonlinearities associated with power amplifiers of a plurality of power amplifiers, nonlinearities associated with coupling between antenna elements of a plurality of antenna elements, or nonlinearities associated with variations in gain between the antenna elements of the plurality of antenna elements.

The correction referenced above can be applied by the pre-distortion actuator to the carrier-modulated input signal to compensate for one or more of nonlinearities associated with the phased antenna array, nonlinearities associated with power amplifiers of the plurality of power amplifiers, nonlinearities associated with coupling between antenna elements of the plurality of antenna elements, nonlinearities associated with variations in gain between the antenna elements of the plurality of antenna elements, signal distortions associated with the receiver (the device that receives the transmitted output signals), or signal degradation associated with the receiver.

A system practicing the method can include one or more nodes or components. For example, each step of the method may be practiced just by a gateway, or a satellite, or other component disclosed herein. The method can be also practiced by a system including a satellite communications system, wherein the modulator, the pre-distortion actuator, and the phased antenna array are included in one or more of a satellite, a gateway, a repeater, a user terminal, or a communication node of the satellite communications system. The system can include a transmitter, a receiver or a combination of a transmitter and a receiver.

Figure 18:
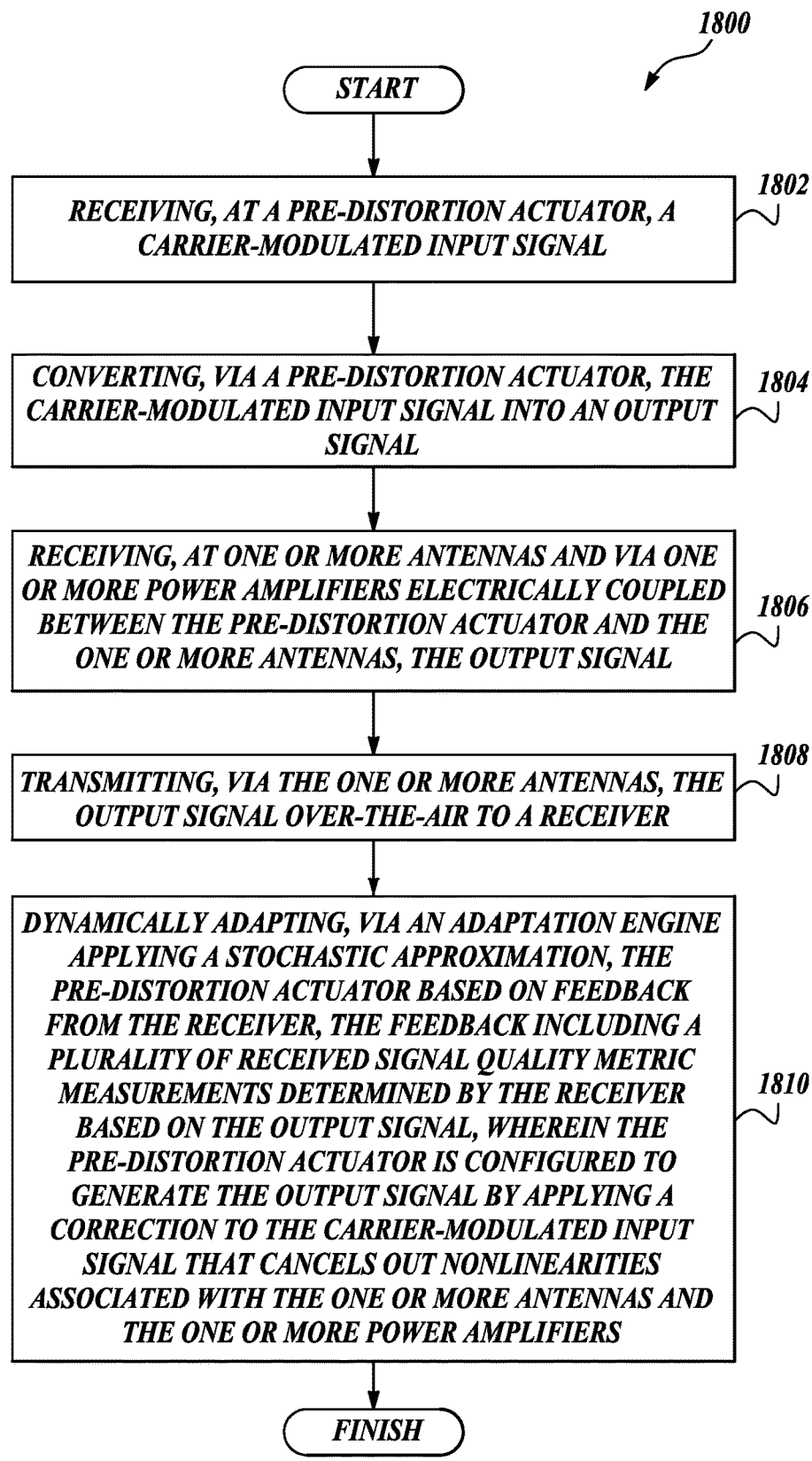
FIG. 18 illustrates a block diagram showing an example pre-distortion compensation method implemented by the disclosed system and related to stochastic optimization.

FIG. 18 illustrates another example method 1800. A method can include one or more steps including receiving, at a pre-distortion actuator, a carrier-modulated input signal (1802), converting, via the pre-distortion actuator, the carrier-modulated input signal into an output signal (1804), receiving, at one or more antennas and via one or more power amplifiers electrically coupled between the pre-distortion actuator and the one or more antennas, the output signal (1806), transmitting, via the one or more antennas, the output signal over-the-air to a receiver (1808) and dynamically adapting, via an adaptation engine applying, for example, a stochastic approximation, the pre-distortion actuator based on feedback from the receiver, the feedback including a plurality of received signal quality metric measurements determined by the receiver based on the output signal, wherein the pre-distortion actuator is configured to generate the output signal by applying a correction to the carrier-modulated input signal that cancels out nonlinearities associated with the one or more antennas and the one or more power amplifiers (1810). In one aspect, the adaptation engine can be configured to update parameters of a model implemented in the pre-distortion actuator using a simultaneous perturbation stochastic approximation (SPSA).

The adaptation engine can be configured to apply a plurality of sets of perturbations to parameters of a model implemented in the pre-distortion actuator. The one or more antennas transmits a signal for each set of the plurality of sets of the randomized perturbations. The signal can be corrected by the pre-distortion actuator. The receiver can determine at least one signal quality metric measurement based on the output signal received over-the-air for each set of the plurality of sets of the randomized perturbations.

In one aspect, the adaptation engine can be configured to determine differential receiver metric measurements based on the signal quality metric measurements corresponding to the plurality of sets of the randomized perturbations.

In another aspect, the adaptation engine can be configured to determine a plurality of gradients, each gradient of the plurality of gradients including differences in the signal quality metric measurements corresponding to the plurality of sets of the randomized perturbations divided by differences in the parameters that have been perturbed associated with the plurality of sets of randomized perturbations.

In yet another aspect, the adaptation engine can be configured to identify optimized or preferred values of the parameters, from among the values of the parameters to which the plurality of sets of the randomized perturbations have been applied, based on the gradients. The pre-distortion actuator can be configured with the optimized values of the parameters to apply the correction. In one sense, optimizing values can mean not just perfectly optimizing values but can include improving the values.

The pre-distortion actuator can include a behavioral model or a generalized memory functions (GMF) model. A received signal quality metric measurement of the plurality of received signal quality metric measurements can include one or more of error vector magnitude (EVM), bit error rate (BER), pilot SNR, packet error rate (PER), receive-signal-strength indicators (RSSI), channel quality indicators (CQI), correlation coefficient against a known sequence, channel estimates, mutual information, or power measurement in a band of adjacent carriers.

In another aspect, the carrier-modulated input signal can include complex-valued I/Q input samples and the output signal can include complex-valued I/Q output samples. The pre-distortion actuator can include circuitry including first, second, and third signal processing pathways. In one aspect, first complex-valued I/Q samples can include the complex-valued I/Q input samples multiplied with first lookup table values associated with the complex-valued I/Q input samples are generated in the first signal processing pathway. In another aspect, second complex-valued I/Q samples including complex-valued I/Q previous input samples multiplied with second lookup table values associated with the complex-valued I/Q input samples are generated in the second signal processing pathway. In yet another aspect, third complex-valued I/Q samples including the complex-valued I/Q input samples multiplied with third lookup table values associated with the complex-valued I/Q previous input samples are generated in the third signal processing pathway The complex-valued I/Q previous input samples can include complex-valued I/Q input samples at a previous time point relative to the complex-valued I/Q input samples. A sum of the first, second, and third complex-valued I/Q samples can include the complex-valued I/Q output samples.

The carrier-modulated input signal can include complex-valued I/Q input samples and the output signal can include complex-valued I/Q output samples. The pre-distortion actuator an include circuitry configured to generate the complex-valued I/Q output samples including the complex-valued I/Q input samples multiplied with lookup table values associated with the complex-valued I/Q input samples.

The correction applied by the pre-distortion actuator to the carrier-modulated input signal can include a correction that compensates for one or more of nonlinearities associated with the one or more antennas, nonlinearities associated with the one or more power amplifiers, nonlinearities associated with coupling between the one or more antennas, nonlinearities associated with variations in gain between the one or more antennas, signal distortions associated with the receiver, and/or signal degradation associated with the receiver.

The system can include a satellite communications system. The pre-distortion actuator, the one or more antennas, the one or more power amplifiers, and the adaptation engine can be included in one or more of a satellite, a gateway, a repeater, a user terminal, or a communication node of the satellite communications system.

The receiver that samples the output signal over-the-air is bandlimited and detects less than a bandwidth over which the pre-distortion actuator applies the correction.

The pre-distortion actuator, the one or more antennas, the one or more power amplifiers, and the adaptation engine can be included in a first transmitter. The system can further include a second transmitter including a second pre-distortion actuator and a second adaptation engine, and configured to transmit a second output signal corrected by the second pre-distortion actuator. The receiver can be configured to receive the second output signal over-the-air simultaneous with the output signal, and generate a second feedback based on the second output signal over-the-air. The second adaptation engine can dynamically adapt the second pre-distortion actuator based on the second feedback.

Figure 19:
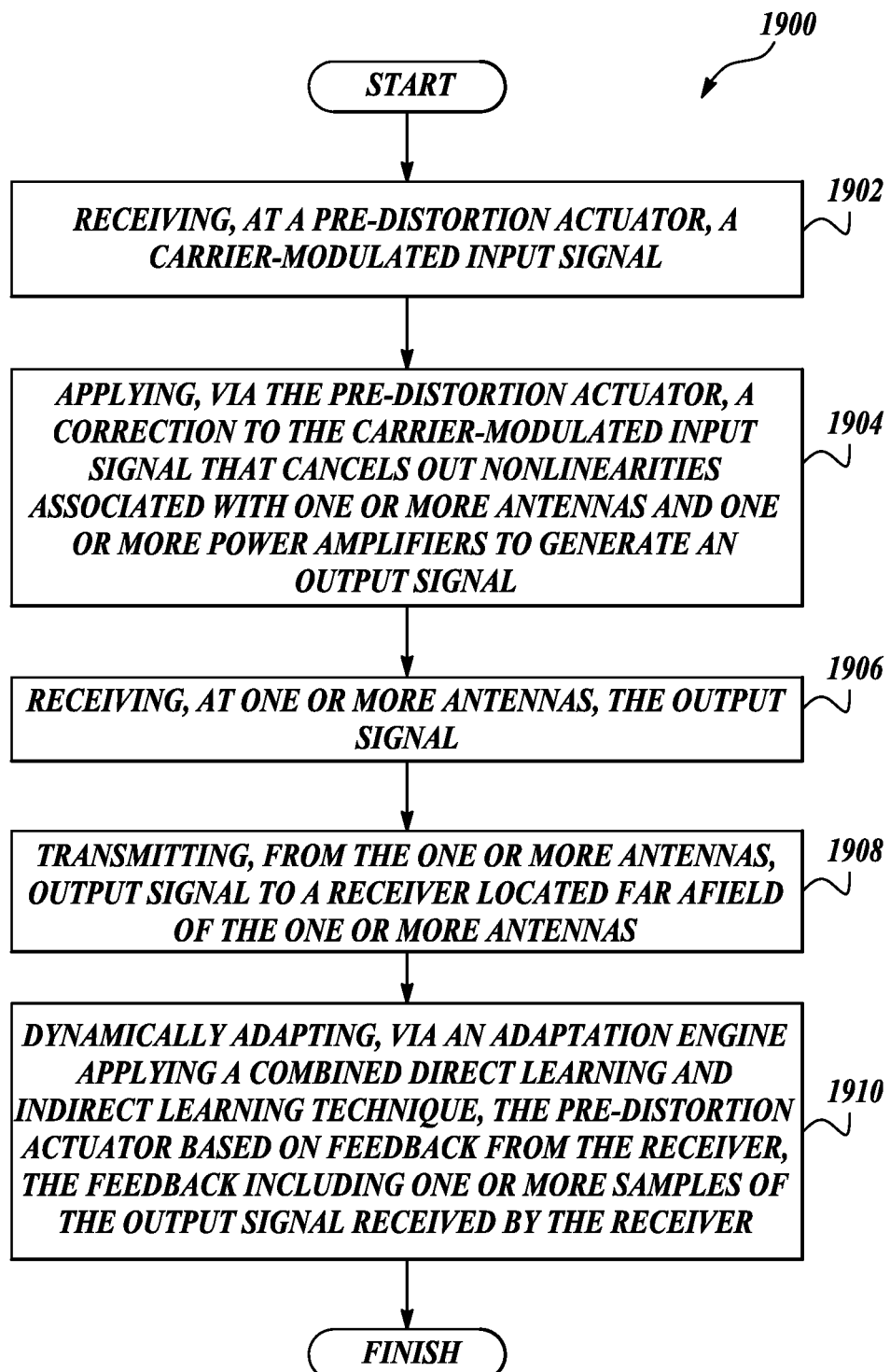
FIG. 19 illustrates a block diagram showing an example pre-distortion compensation method implemented by the disclosed system and related to using direct and indirect learning techniques.

FIG. 19 illustrates another method embodiment related to the use of direct and indirect learning. A method 1900 includes one or more of the following steps in any order: receiving, at a pre-distortion actuator, a carrier-modulated input signal (1902), applying, via the pre-distortion actuator, a correction to the carrier-modulated input signal that cancels out nonlinearities associated with one or more antennas and one or more power amplifiers to generate an output signal (1904), receiving, at the one or more antennas, the output signal (1906), transmitting, from the one or more antennas, the output signal to a receiver located far-afield of the one or more antennas (1908) and dynamically adapting, via an adaptation engine applying a combined direct learning and indirect learning technique, the pre-distortion actuator based on feedback from the receiver, the feedback including one or more samples of the output signal received by the receiver (1910).

The adaptation engine can be configured to optimize parameters of a forward model configured to model behavior of the one or more antennas and the one or more power amplifiers. Optimization in this sense does not mean absolute perfect optimization of the parameters but can be an attempt to improve the parameters of the models to achieve a better outcome. The parameters of the forward model can be optimized or improved if a predicted output signal from the forward model is the same as the feedback. After optimization or an improvement to the parameters, the model can be characterized as an optimized forward model.

The adaptation engine can be configured to optimize parameters of a backward model configured to model behavior of the one or more antennas and/or the one or more power amplifiers using the predicted output signal corresponding to the optimized forward model as an input to the backward model. The output of the engine in this regard can be characterized as optimized parameters. The parameters of the backward model can be optimized if a predicted input signal from the backward model is the same as the carrier-modulated input signal. In another aspect, the adaptation engine can be configured to update parameters of the pre-distortion actuator with the optimized parameters of the backward model.

The adaptation engine can include a forward model that models behavior of the one or more antennas and/or the one or more power amplifiers. The forward model can receive as an input the carrier-modulated input signal and outputs a predicted output signal. In one aspect, the adaptation engine is configured to determine whether there is a difference between the predicted output signal and the feedback to yield a determination. Then, if the determination is affirmative, the adaptation engine further can include a forward model parameters estimation module configured to determine estimated forward model parameters based on the carrier-modulated input signal and the feedback.

The adaptation engine can also be configured to update the forward model with the estimated forward model parameters configured to reduce the difference. The output of the engine in this regard can be characterized as an updated forward model. The updated forward model can receive as the input the carrier-modulated input signal and outputs an updated predicted output signal.

If the determination mentioned above is negative, the adaptation engine further can include a backward model that models behavior of the one or more antennas and/or the one or more power amplifiers. The backward model can receive as an input the predicted output signal and outputs a predicted input signal.

The adaptation engine can be configured to determine whether there is a difference between the carrier-modulated input signal and the predicted input signal to output or yield a determination. If the determination is affirmative, the adaptation engine further can include a backward model parameters estimation module configured to determine estimated backward model parameters based on the carrier-modulated input signal and the predicted output signal.

In one aspect, the adaptation engine can be configured to update the backward model with the estimated backward model parameters configured to reduce the difference. The updated backward model can receive as the input the predicted output signal and outputs an updated predicted input signal. If the determination is negative, the pre-distortion actuator can be updated to the backward model.

In one aspect, the carrier-modulated input can include complex-valued I/Q input samples and the output signal can include complex-valued I/Q output samples, wherein the pre-distortion actuator includes circuitry having first, second, and third signal processing pathways. First complex-valued I/Q samples including the complex-valued I/Q input samples multiplied with first lookup table values associated with the complex-valued I/Q input samples can be generated in the first signal processing pathway. Second complex-valued I/Q samples including complex-valued I/Q previous input samples multiplied with second lookup table values associated with the complex-valued I/Q input samples can be generated in the second signal processing pathway. In another aspect, third complex-valued I/Q samples including the complex-valued I/Q input samples multiplied with third lookup table values associated with the complex-valued I/Q previous input samples can be generated in the third signal processing pathway.

The complex-valued I/Q previous input samples can include complex-valued I/Q input samples at a previous time point relative to the complex-valued I/Q input samples. A sum of the first, second, and third complex-valued I/Q samples can include the complex-valued I/Q output samples.

In another aspect, the carrier-modulated input signal can include complex-valued I/Q input samples and the output signal can include complex-valued I/Q output samples. The pre-distortion actuator can include circuitry configured to generate the complex-valued I/Q output samples including the complex-valued I/Q input samples multiplied with lookup table values associated with the complex-valued I/Q input samples.

With respect to the method described above related to the direct and indirect learning technique, the correction applied by the pre-distortion actuator to the carrier-modulated input signal can include a correction that compensates for one or more of nonlinearities associated with the one or more antennas, nonlinearities associated with the one or more power amplifiers, nonlinearities associated with coupling between the one or more antennas, nonlinearities associated with variations in gain between the one or more antennas, signal distortions associated with the receiver, or signal degradation associated with the receiver.

The processes explained above are described in terms of computer software and hardware, and in some examples as a method. The techniques described may constitute machine-executable instructions embodied within a tangible or non-transitory machine (e.g., computer) readable storage medium, that when executed by a machine will cause the machine to perform the operations described. Additionally, the processes may be embodied within hardware, such as an application specific integrated circuit (ASIC) or otherwise.

A tangible machine-readable storage medium includes any mechanism that provides (e.g., stores) information in a non-transitory form accessible by a machine (e.g., a computer, network device, personal digital assistant, manufacturing tool, any device with a set of one or more processors, etc.). For example, a machine-readable storage medium includes recordable/non-recordable media (e.g., read only memory (ROM), random access memory (RAM), magnetic disk storage media, optical storage media, flash memory devices, etc.).

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims.

We claim:

1. A system comprising:
    a modulator configured to generate a carrier-modulated input signal;
    a pre-distortion actuator configured to:
        receive the carrier-modulated input signal and convert the carrier-modulated input signal into an output signal, the pre-distortion actuator comprising a behavioral model that models a transmit chain of the system including at least one amplifier and at least one antenna; and predict an input-output relationship of the transmit chain of the system between an input to the transmit chain to an output of the transmit chain; and a phased antenna array configured to receive the output signal and transmit the output signal, wherein the phased antenna array comprises a plurality of power amplifiers and a plurality of antenna elements, each antenna element of the plurality of antenna elements electrically coupled to a respective power amplifier of the plurality of power amplifiers, and wherein the pre-distortion actuator is configured to generate the output signal by applying, according to the behavioral model, a correction to the carrier-modulated input signal that cancels out nonlinearities and wherein the behavioral model is updated based on feedback received from a receiver from a previous output signal transmitted from the system to the receiver.

2. The system of claim 1, wherein the pre-distortion actuator comprises a plurality of lookup table values that comprises parameters of the behavioral model.

3. The system of claim 1, further comprising:
an adaptation engine electrically coupled to the pre-distortion actuator, wherein the receiver is configured to receive the output signal and to generate the feedback based on the output signal, wherein the adaptation engine is configured to dynamically adapt a plurality of lookup table parameter element values of the pre-distortion actuator based on the feedback.

4. The system of claim 1, further comprising the receiver located remote from the phased antenna array and configured to receive the output signal, and wherein the correction applied by the pre-distortion actuator to the carrier-modulated input signal compensates for one or more of nonlinearities associated with the phased antenna array, nonlinearities associated with power amplifiers of the plurality of power amplifiers, nonlinearities associated with coupling between antenna elements of the plurality of antenna elements, nonlinearities associated with variations in gain between the antenna elements of the plurality of antenna elements, signal distortions associated with the receiver, or signal degradation associated with the receiver.

5. The system of claim 1, wherein the system comprises a satellite communications system, and wherein the modulator, the pre-distortion actuator, and the phased antenna array are included in one or more of a satellite, a gateway, a repeater, a user terminal, or a communication node of the satellite communications system.

6. A system comprising:
a communication node comprising:
a pre-distortion actuator configured to:
receive a carrier-modulated input signal and convert the carrier-modulated input signal into an output signal, the pre-distortion actuator comprising a behavioral model that models a transmit chain of the system including at least one amplifier and at least one antenna; and
predict an input-output relationship of the transmit chain of the system between an input to the transmit chain to an output of the transmit chain; and
a phased antenna array configured to receive the output signal and transmit the output signal over an air interface, wherein the phased antenna array comprises a plurality of power amplifiers and a plurality of antenna elements, each antenna element of the plurality of antenna elements electrically coupled to a respective power amplifier of the plurality of power amplifiers, wherein the pre-distortion actuator is configured to apply, according to the behavioral model, a digital pre-distortion (DPD) compensation to the carrier-modulated input signal to correct for nonlinearities and wherein the behavioral model is updated based on feedback received from a receiver from a previous output signal transmitted from the system to the receiver.

7. The system of claim 6, wherein the communication node comprises a satellite, a gateway, a repeater, or a user terminal.

8. The system of claim 6, wherein the communication node further comprises an adaptation engine electrically coupled to the pre-distortion actuator, wherein the receiver is configured to generate the feedback based on the output signal received over the air interface, and wherein the adaptation engine is configured to dynamically adapt the pre-distortion actuator based on the feedback to maintain accurate DPD compensation over time.

9. The system of claim 8, wherein the communication node further comprises a first receiver configured to receive the feedback from a second communication node, and to receive signals associated with first normal communication links with one or more communication nodes of a plurality of communication nodes, and wherein the second communication node further comprises a first transmitter configured to transmit the feedback to the first receiver and to transmit signals associated with second normal communication links with one or more communication nodes of the plurality of communication nodes.

10. The system of claim 8, wherein the pre-distortion actuator comprises a behavioral model, and wherein the adaptation engine is configured to determine updates to a plurality of lookup table values that define parameters of the behavioral model.

11. The system of claim 6, wherein the carrier-modulated input signal comprises complex-valued I/Q input samples and the output signal comprises complex-valued I/Q output samples, and wherein the pre-distortion actuator comprises circuitry configured to generate the complex-valued I/Q output samples comprising the complex-valued I/Q input samples multiplied with lookup table values associated with the complex-valued I/Q input samples.

12. A wireless communication system comprising:
a pre-distortion actuator configured to:
receive a carrier-modulated signal and convert the carrier-modulated signal into an output signal, the pre-distortion actuator comprising a behavioral model that models a transmit chain of the wireless communication system including at least amplifier and at least one antenna; and
predict an input-output relationship of the transmit chain of the wireless communication system between an input of the transmit chain and an output of the transmit chain;
one or more antennas configured to receive the output signal from the pre-distortion actuator and transmit the output signal by an over-the-air (OTA) interface; and
one or more power amplifiers electrically coupled between the pre-distortion actuator and the one or more antennas, wherein the pre-distortion actuator is configured to generate the output signal by applying a correction to the carrier-modulated signal that cancels out nonlinearities associated with the one or more antennas and the one or more power amplifiers, and wherein the behavioral model of the pre-distortion actuator is configured based on feedback from a receiver.

13. The wireless communication system of claim 12, wherein the receiver is configured to receive the output signal via the OTA interface and to generate the feedback based on the output signal.

14. The wireless communication system of claim 13, wherein the receiver samples the output signal, is bandlimited and detects less than an entire bandwidth over which the pre-distortion actuator applies the correction, and wherein the correction comprises linearization.

15. The wireless communication system of claim 13, wherein the pre-distortion actuator, one or more antennas, and the one or more power amplifiers are included in a first transmitter, the wireless communication system further comprising a second transmitter including a second pre-distortion actuator and configured to transmit a second output signal corrected by the second pre-distortion actuator, wherein the receiver is configured to receive the second output signal simultaneous with the output signal, and generate a second feedback based on the second output signal, and wherein a second behavioral model of the second pre-distortion actuator is configured based on the second feedback.

16. A method comprising:
generating, via a modulator, a carrier-modulated input signal;
converting, via a pre-distortion actuator, the carrier-modulated input signal into an output signal, wherein the pre-distortion actuator comprises a behavioral model that models a transmit chain of a system including at least one mixer, at least one amplifier and at least one antenna;
predicting an input-output relationship of the transmit chain between an input to the transmit chain and an output of the transmit chain; and
transmitting, via a phased antenna array, the output signal via an over-the-air (OTA) interface, wherein the pre-distortion actuator is configured to generate the output signal by applying a correction to the carrier-modulated input signal that cancels out nonlinearities and wherein the behavioral model is updated based on feedback received from a receiver from a previous output signal transmitted to the receiver.

17. The method of claim 16, wherein the pre-distortion actuator comprises a plurality of lookup table values that comprises parameters of the behavioral model.

18. The method of claim 16, further comprising:
receiving, from a device, the feedback based on the output signal; and
updating, via an adaptation engine electrically coupled to the pre-distortion actuator, the behavioral model of the pre-distortion actuator based on the feedback.

19. The method of claim 16, wherein the feedback comprises one or more samples of the output signal, or one or more received signal quality metric measurements calculated based on the output signal.

20. The method of claim 16, further comprising:
receiving, from a device, feedback based on the output signal; and
dynamically adapting, via an adaptation engine electrically coupled to the pre-distortion actuator, a plurality lookup table parameter element values of the pre-distortion actuator based on the feedback.

21. The method of claim 16, wherein the correction applied by the pre-distortion actuator to the carrier-modulated input signal compensates for one or more of nonlinearities associated with the phased antenna array, nonlinearities associated with power amplifiers of a plurality of power amplifiers, nonlinearities associated with coupling between antenna elements of a plurality of antenna elements, nonlinearities associated with variations in gain between the antenna elements of the plurality of antenna elements, signal distortions associated with a receiver of the output signal transmitted over the OTA interface, or signal degradation associated with the receiver.

* * * * *